(12) United States Patent
Wakana et al.

(10) Patent No.: US 6,259,244 B1
(45) Date of Patent: Jul. 10, 2001

(54) ELECTROOPTIC VOLTAGE WAVEFORM MEASURING METHOD EMPLOYING LIGHT SAMPLING TECHNIQUE USING POCKELS EFFECT

(75) Inventors: Shin-ichi Wakana; Akinori Miyamoto; Soichi Hama; Kazuyuki Ozaki; Toshiaki Nagai, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/487,897

(22) Filed: Jan. 19, 2000

Related U.S. Application Data

(62) Division of application No. 08/844,995, filed on Apr. 23, 1997, now Pat. No. 6,057,677.

(30) Foreign Application Priority Data

Apr. 24, 1996 (JP) ................................................. 8-102196
Oct. 3, 1996 (JP) ................................................. 8-263397

(51) Int. Cl.[7] ................................................. G01R 31/308
(52) U.S. Cl. ................................................. 324/96; 324/753
(58) Field of Search ................................. 324/96, 244.1, 324/753, 117 R, 752, 750, 158.1; 356/368; 250/216, 227.14, 227.17, 225, 306, 307, 310, 311; 359/315, 318, 322, 245, 263

(56) References Cited

U.S. PATENT DOCUMENTS

| | | | |
|---|---|---|---|
| 4,982,151 | * | 1/1991 | Takahashi et al. ...................... 324/96 |
| 5,642,040 | * | 6/1997 | Takahashi et al. ...................... 324/96 |
| 5,677,635 | * | 10/1997 | Fujii et al. ............................. 324/96 |
| 5,767,688 | * | 6/1998 | Takahashi et al. ...................... 324/96 |

OTHER PUBLICATIONS

Janis A. Valdmanis et al., "Subpicosecond Electrooptic Sampling: Prilciples and Applications", IEEE Journal of Quantum Electronics, vol. QE–22, No. 1, pp. 69–78, Jan. 1986.

\* cited by examiner

*Primary Examiner*—Jay Patidar
(74) *Attorney, Agent, or Firm*—Armstrong, Westerman, Hattori, McLeland & Naughton, LLP

(57) ABSTRACT

An electrooptic voltage waveform measuring apparatus, which includes an electrooptic element having an electrooptic effect; a first electrode mounted on the electrooptic element and electrically coupled to an object to be measured; and a first light source irradiating a light on the electrooptic element. The electrooptic voltage waveform measuring apparatus further includes a polarization analyzer for analyzing a polarization state of the light passed through the electrooptic element and detecting a voltage waveform of the object; a second electrode mounted on the electrooptic element and separated from the first electrode; and an amplifier having an input terminal coupled to the second electrode and outputting a low-frequency component of the voltage waveform of the object. The electrooptic voltage waveform measuring apparatus further includes a voltage waveform combining processor obtaining a measured voltage waveform of the object by combining a high-frequency component of the voltage waveform of the object obtained from an output of the polarization analyzer and the low-frequency component of the voltage waveform of the object output from the amplifier.

7 Claims, 38 Drawing Sheets

ELECTROOPTIC VOLTAGE WAVEFORM MEASURING METHOD EMPLOYING LIGHT SAMPLING TECHNIQUE USING POCKELS EFFECT

This application is a division of prior application Ser. No. 08/844,995 filed Apr. 23, 1997 U.S. Pat. No. 6,057,677.

BACKGROUND OF THE INVENTION

1. Field of the Invention

The present invention generally relates to voltage waveform measuring methods and apparatuses, and more particularly to an electrooptic voltage waveform measuring method and an electrooptic voltage waveform measuring apparatus which are suited for automatically measuring a wiring voltage waveform within a semiconductor large scale integrated circuit (LSI) device using electrooptic effect.

2. Description of the Related Art

When designing and producing semiconductor devices such as semiconductor LSI devices, it is essential that the voltage waveforms applied to the wirings within the semiconductor devices are accurately determined. The width of the wiring layer is becoming narrower with the improved integration density of the semiconductor devices, and it is becoming more and more difficult to cope with the conventional method of measuring the voltage waveform by contacting a probe on a fine wiring layer by use of an optical microscope.

Hence, proposals have been made to use a surface form measuring apparatus which can detect fine structures, in place of the optical microscope, and to measure the voltage waveform by contacting a fine probe of a voltage waveform detection apparatus to the wiring layer. An atomic force microscope (AFM) and a scanning tunnel-electron microscope (STM) are examples of the surface form measuring apparatus which can detect the fine structures.

When using a combination of the above described surface form measuring apparatus and the voltage waveform detection apparatus to measure the voltage waveform applied to the fine wiring layer, it is regarded more promising to use the AFM as the surface form measuring apparatus because the AFM can measure the form even if an object surface to be measured is an insulator.

On the other hand, it has become difficult to carry out an accurate measurement by an electrical measuring technique, and proposals have been made to enable measurement of a high-speed signal in a fine measuring region using the electrooptic effect of electrooptic crystals. For example, such a technique is proposed in Valdmanis et al., "Subpicosecond Electrooptic Sampling: Principles and Applications", IEEE Journal of Quantum Electronics, Vol.QE-22, No. 1, January 1986, pp.69–78.

FIG. 1 is a diagram for explaining an example of a conventional voltage signal measuring apparatus using the electrooptic effect. In FIG. 1, a transparent substrate 5 is provided to apply a reference voltage to one main face of an electrooptic crystal 4, and a probe 7 is mounted on another face of the electrooptic crystal 4 via a reflecting electrode 6. The probe 7 makes contact with a wiring layer 17 which is provided on a substrate 16 such as a Si substrate, so as to measure a signal 18 which is applied to the wiring layer 17 and is to be measured.

A laser beam from a laser light source 1 is irradiated on the electrooptic crystal 4 via a phase plate 2 and a beam splitter 3. Reflected light from the reflecting electrode 6 is detected by photodetector 13 via a polarization beam splitter 11 and by a photodetector 14 via the polarization beam splitter 11 and a mirror 12. A differential output X is obtained from a differential amplifier 15 by inputting outputs of the photodetectors 13 and 14.

The differential output X is dependent on the signal 18 which is applied to the wiring layer 17, and the signal 18 can be described by V=a(X−b), where V denotes a voltage of the signal 18, a denotes a coefficient determining an amplitude of the signal 18, and b denotes a coefficient determining a 0 V position.

In this case, the refractive index of the electrooptic crystal 4 changes due to the Pockels effect depending on the signal 18 applied to the wiring layer 17. When the refractive index of the electrooptic crystal 4 changes, a polarization state of the laser light passing through the electrooptic crystal 4 changes, thereby causing a change in the ratio of a component reflected by the polarization beam splitter 11 and detected by the photodetector 13 with respect to a component transmitted through the polarization beam splitter 11 and detected by the photodetector 14.

In the above described voltage waveform measuring apparatus using the electrooptic crystal 4, it is necessary to obtain the coefficient b which determines the 0 V position, that is, the voltage origin, in order to measure the absolute level of the voltage waveform. In order to obtain this coefficient b, a correction pad having a known voltage is provided, and the probe 7 is made to contact the correction pad so as to obtain a correspondence between the voltage V of the signal 18 and the differential output X which is detected.

According to the conventional method of obtaining the coefficient b using the correction pad, the electrooptic effect (Pockels effect) is small. For this reason, the degree of modulation of the laser light in the polarization state is 0.1%, for example, and is extremely small. As a result, the voltage waveform measurement is greatly affected by a small change in the optical axis, a change in a characteristic of an optical element (such as, an electrooptic crystal) in response to a temperature change, and changes or disturbances in a signal processing system which processes the differential output X, and it becomes necessary to re-measure the coefficients a and b for accuracy.

However, if the probe 7 is controlled to contact the correction pad every time the re-measurement is made, it not only takes time to move the probe 7, but the optical axis shifts when the probe 7 is moved from the correction pad to a measuring point on the wiring layer 17, and it may become impossible to carry out an accurate measurement.

On the other hand, even if it were possible to accurately measure the coefficients a and b, it would still be necessary to accurately contact the probe 7 to the wiring layer 17 in order to carry out the voltage waveform measurement. However, Al or Al alloy is usually used for the wiring within the semiconductor device, and electrical contact between the probe 7 and the wiring layer 17 must be secured by breaking through a natural oxide layer formed on the surface of the wiring layer 17 by the probe 7.

In order to break through the natural oxide layer, it is necessary to apply on the probe 7 a load which is large compared to that at the time of the surface form measurement. But since the thickness of the wiring layer 17 becomes thinner as the width of the wiring layer 17 becomes narrower, it is difficult to control an optimum load on the probe 7 so as to achieve the electrical contact without damaging or breaking the wiring layer 17. Hence, even if it were possible to a skilled operator to control the optimum load on the probe 7, it would take a considerable amount of time to confirm the electrical contact between the wiring layer 17 and the probe 7.

In addition, even if the electrical contact between the wiring layer 17 and the probe 7 is confirmed, it is becoming more and more difficult to maintain satisfactory electrical contact for a predetermined time, due to displacements of the wiring layer 17 caused by vibration, thermal expansion or the like because the displacements cannot be neglected as the width of the wiring layer 17 becomes extremely small.

SUMMARY OF THE INVENTION

Accordingly, it is a general object of the present invention to provide a novel and useful electrooptic voltage waveform measuring method and apparatus, in which the problems described above are eliminated.

Another and more specific object of the present invention is to provide an electrooptic voltage waveform measuring method and apparatus which determine a voltage origin by a simple method when carrying out a voltage waveform measurement, and automatically confirm and monitor electrical contact between a wiring layer and a probe.

Still another object of the present invention is to provide an electrooptic voltage waveform measuring method for measuring a voltage applied to an object, comprising the steps of mounting a probe on one face of a voltage transducer, and determining a voltage origin by eliminating a voltage difference across the one face and another face of the voltage transducer by an electric conductivity of the voltage transducer in a state where the probe is electrically floating from the object. According to the electrooptic voltage waveform measuring method of the present invention, it is possible to accurately determine the voltage origin without the use of a correction pad, thereby making it possible to accurately measure absolute level of the voltage waveform applied to the object.

A further object of the present invention is to provide an electrooptic voltage waveform measuring method for measuring a voltage applied to an object by employing a light sampling technique using the Pockels effect of an electrooptic crystal, comprising the steps of mounting a probe on one face of the electrooptic crystal and a reference electrode for applying a reference voltage on an opposite face of the electrooptic crystal opposite to the face mounted with the probe, in a state where an A.C. voltage is applied to the reference electrode, bringing the probe close to the object, while a voltage measurement employing the light sampling technique is made in synchronism with the applied A.C. voltage, and monitoring a change in a waveform amplitude detected by the probe, and determining a point where an amplitude change stabilizes as an electrical contact point where the probe contacts the object. According to the electrooptic voltage waveform measuring method of the present invention, it is possible to automatically and positively achieve electrical contact between the probe and the object, thereby making it possible to make the voltage waveform measurement at a high speed and with a high accuracy.

Another object of the present invention is to provide an electrooptic voltage waveform measuring method for optically measuring a voltage applied to an object, comprising the steps of mounting a probe on one face of a voltage transducer, applying a pulse voltage from one end of the voltage transducer, and detecting a change in an electrical contact state between the probe and the object from a change in a waveform of a reflected voltage pulse which is generated by an impedance mismatch at contact portions of the probe and the object. According to the electrooptic voltage waveform measuring method of the present invention, it is possible to confirm the electrical contact between the probe and the object at a high speed and with a high reliability because the electrical contact is confirmed electrically.

Still another object of the present invention is to provide an electrooptic voltage waveform measuring apparatus for measuring a voltage applied to an object, comprising a voltage transducer having two faces, a probe mounted on one face of the voltage transducer, and means for determining a voltage origin by eliminating a voltage difference across the two faces of the voltage transducer by an electric conductivity of the voltage transducer in a state where the probe is electrically floating from the object. According to the electrooptic voltage waveform measuring apparatus of the present invention, it is possible to accurately determine the voltage origin without the use of a correction pad, thereby making it possible to accurately measure absolute level of the voltage waveform applied to the object.

A further object of the present invention is to provide an electrooptic voltage waveform measuring apparatus for measuring a voltage applied to an object by employing a light sampling technique using the Pockels effect of an electrooptic crystal, comprising an electrooptic crystal having a first face and a second face opposite to the first face, a probe mounted on the first face of the electrooptic crystal, a reference electrode, provided on the second face of the electrooptic crystal, receiving a reference voltage to be applied on the second face of the electrooptic crystal, means for bringing the probe close to the object in a state where an A.C. voltage is applied to the reference electrode, while making a voltage measurement employing the light sampling technique in synchronism with the applied A.C. voltage, and means for monitoring a change in a waveform amplitude detected by the probe, and determining a point where an amplitude change stabilizes as an electrical contact point where the probe contacts the object. According to the electrooptic voltage waveform measuring apparatus of the present invention, it is possible to automatically and positively achieve electrical contact between the probe and the object, thereby making it possible to make the voltage waveform measurement at a high speed and with a high accuracy.

Another object of the present invention is to provide an electrooptic voltage waveform measuring apparatus for optically measuring a voltage applied to an object, comprising a voltage transducer having a face, a probe mounted on the face of the voltage transducer, means for applying a pulse voltage to the voltage transducer, and means for detecting a change in an electrical contact state between the probe and the object from a change in a waveform of a reflected voltage pulse which is generated by an impedance mismatch at contact portions of the probe and the object. According to the electrooptic voltage waveform measuring apparatus of the present invention, it is possible to confirm the electrical contact between the probe and the object at a high speed and with a high reliability because the electrical contact is confirmed electrically.

Still another object of the present invention is to provide an electrooptic voltage waveform measuring apparatus comprising an electrooptic element having an electrooptic effect, a first electrode mounted on the electrooptic element and electrically coupled to an object to be measured, a first light source irradiating a light on the electrooptic element, a polarization analyzer analyzing a polarization state of the light passed through the electrooptic element and detecting a voltage waveform of the object, a second electrode mounted on the electrooptic element and separated from the first electrode, an amplifier having an input terminal coupled to the second electrode and outputting a low-frequency component of the voltage waveform of the object, and a voltage waveform combining processor obtaining a measured voltage waveform of the object by combining a high-frequency component of the voltage waveform of the object obtained from an output of the polarization analyzer and the low-frequency component of the voltage waveform of the object output from the amplifier. According to the electrooptic voltage waveform measuring apparatus of the present invention, it is possible to accurately measure the voltage waveform of the object including the D.C. component up to the high-frequency component.

Other objects and further features of the present invention will be apparent from the following detailed description when read in conjunction with the accompanying drawings.

DESCRIPTION OF THE PREFERRED EMBODIMENTS

Figure 2:
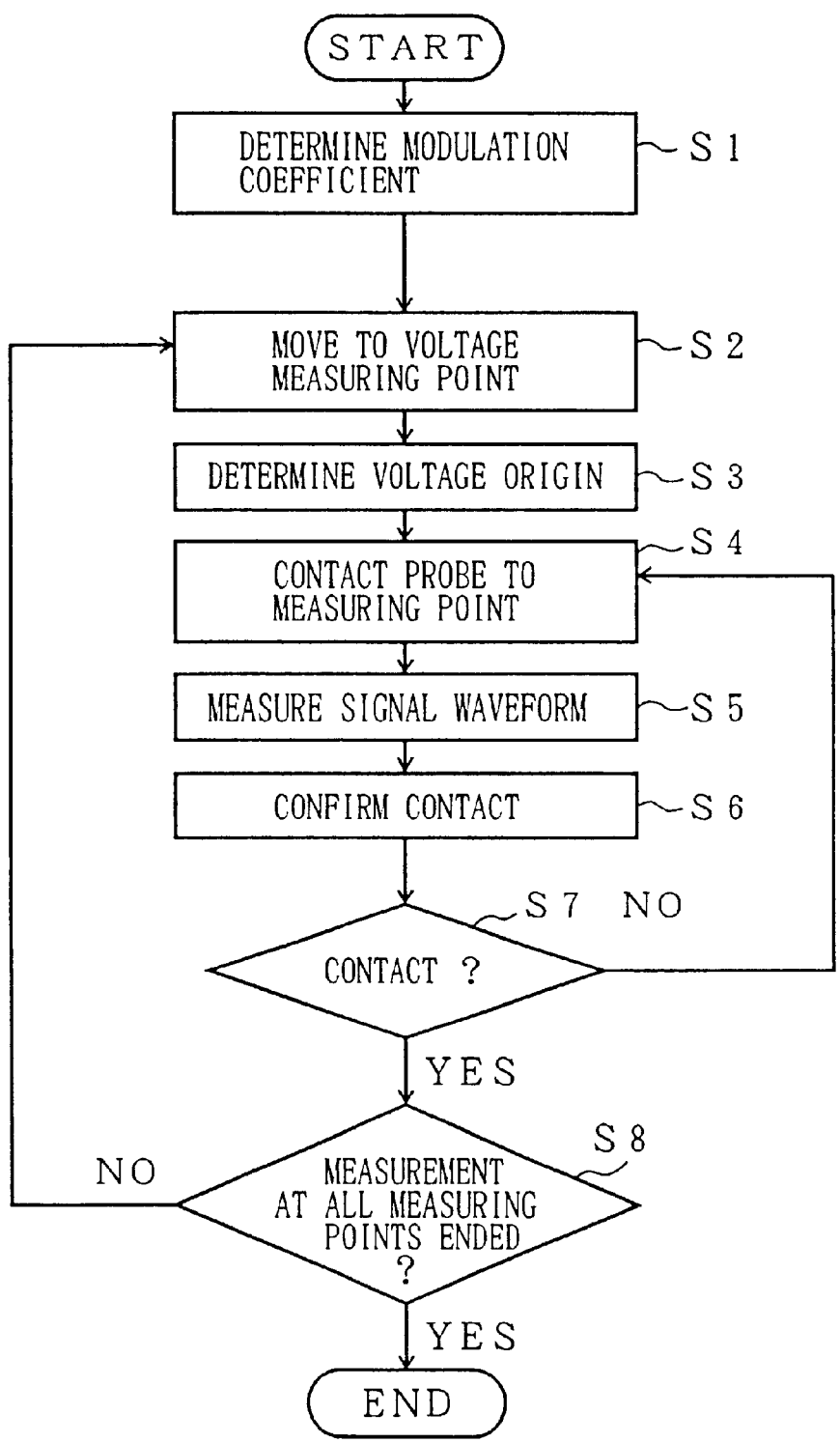
FIG. 2 is a flow chart for explaining an operating principle of a first aspect of the present invention.

FIG. 2 is a flow chart for explaining an operating principle of a first aspect of the present invention.

In FIG. 2, a step S1 determines modulation coefficients, and a step S2 moves a probe to a position confronting a voltage measuring point on a conductor layer applied with a voltage which is to be electrooptically measured. A step S3 determines a voltage origin, and a step S4 contacts the probe to the conductor layer at the voltage measuring point. A step S5 measures a voltage waveform at the voltage measuring point, and a step S6 confirms contact between the probe and the conductor layer.

A step S7 decides whether or not the probe is in contact with the conductor layer, and the process returns to the step S4 if the decision result in the step S7 is NO. On the other hand, if the decision result in the step S7 is YES, a step S8 decides whether or not measurements at all voltage measuring points on the conductor layer have ended, and the process ends if the decision result in the step S8 is YES. If the decision result in the step S8 is NO, the process returns to the step S2.

(1) In other words, according to an electrooptic voltage waveform measuring method of the present invention, the probe is mounted on one face of a voltage transducer, and the voltage origin is determined by eliminating a voltage difference across the one face and another face of the voltage transducer by the electric conductivity of the voltage transducer in a state where the probe is electrically floating.

In terms of an equivalent circuit, the voltage transducer can be regarded as a parallel RC circuit in which a capacitance C and a resistance R between one face of the voltage transducer mounted with the probe and the other face of the voltage transducer are coupled in parallel. Hence, by moving the probe to the position confronting the voltage measuring point on the conductor layer in the step S2 and electrically floating the probe in the step S3, the parallel RC circuit discharges with a time constant RC. After eliminating the voltage difference across the two faces of the voltage transducer by this discharge, a signal X corresponding to the differential output X described above is measured, thereby making it possible to accurately determine the coefficient b (i.e., the voltage origin).

(2) In the electrooptic voltage waveform measuring method described under (1) above, an electrooptic crystal having photoconductivity may be used as the voltage transducer, and the electric conductivity of the electrooptic crystal can be increased by irradiating light on the electrooptic crystal.

When the electrooptic transducer is used as the voltage transducer, it is possible to increase the electric conductivity of the electrooptic crystal and to reduce the resistance R by irradiating light in the step S2. As a result, the time constant RC decreases, and the voltage difference across the two faces of the voltage transducer can be eliminated within a short time.

(3) In the electrooptic voltage waveform measuring method described under (1) above, an electrooptic crystal having photoconductivity may be used as the voltage transducer. A periodic electrical signal is applied to an opposite face of the electrooptic crystal opposite to a face mounted with the probe, and the voltage origin is determined from an average during 1 period of the periodic electrical signal.

In other words, when the periodic electrical signal which has a short period compared to the time constant RC is applied to the opposite face of the electrooptic crystal in the step S3, the potential difference across the two faces of the crystal does not become 0 V but fluctuates with the period of the periodic electrical signal. However, by taking an average value during 1 period of the periodic electrical signal to cancel the fluctuating component, the average value corresponds to 0 V, thereby making it possible to determine the voltage origin.

(4) According to an electrooptic voltage waveform measuring method of the present invention which employs a light sampling technique using the Pockels effect of an electrooptic crystal, a probe is mounted on one face of the electrooptic crystal and a reference electrode for applying a reference voltage is provided on an opposite face of the electrooptic crystal opposite to the face mounted with the probe. In a state where an A.C. voltage is applied to the reference electrode, the probe is brought close to an object to be measured, while a voltage measurement employing the light sampling technique is made in synchronism with the applied A.C. voltage. A change in a waveform amplitude detected by the probe is monitored, and a point where the amplitude change stabilizes is determined as an electrical contact point where the probe contacts the object.

In this case, after determining the voltage origin in the step S3, the probe contacts the object in the step S4. Hence, it is possible to automatically and positively achieve electrical contact between the probe and the object, in a state where the A.C. voltage is applied to the reference electrode, by bringing the probe close to the object while the voltage measurement employing the light sampling technique is made in synchronism with the applied A.C. voltage.

(5) In the electrooptic voltage waveform measuring method described under (4) above, the probe may be pushed against the object by a predetermined amount after detection of the electrical contact point, so as to stabilize the electrical contact.

In this case, the electrical contact can be stabilized by applying on the probe an optimum load which is confirmed experimentally in advance, after detection of the electrical contact.

(6) In the electrooptic voltage waveform measuring method described under (4) or (5) above, if the signal frequency applied to the object matches the A.C. voltage signal frequency applied to the reference electrode, this matching of the frequencies can be detected because a noise level of the detected signal does not decrease due to an averaging process, and the signal frequency of the A.C. voltage applied to the reference electrode is varied.

In other words, if the signal frequency applied to the object matches the signal frequency of the A.C. voltage applied to the reference electrode, the two signals cancel each other, and the noise level of the detected signal does not decrease due to the averaging process. Hence, the matching of the frequencies can be detected from the noise level of the detected signal that does not decrease, and the electrical contact can be positively detected by varying the A.C. voltage signal frequency applied to the reference electrode.

(7) In the electrooptic voltage waveform measuring method described under (4), (5) or (6) above, the A.C. voltage waveform applied to the reference electrode may be measured at a predetermined period when measuring the voltage waveform of the object. If an amplitude value obtained when confirming the electrical contact point is smaller than a predetermined error range, the measurement of the voltage waveform of the object is interrupted.

In this case, when measuring the voltage waveform of the object in the step S5, the step S6 measures the A.C. voltage waveform applied to the reference electrode at the predetermined period. A poor contact is detected by comparing the measured A.C. voltage waveform and the amplitude value which is obtained when confirming the electrical contact point, and an erroneous measurement is prevented by automatically interrupting the measurement of the voltage waveform of the object.

(8) In the electrooptic voltage waveform measuring method described under (4), (5) or (6) above, a light sampling may be carried out in synchronism with the voltage waveform applied to the object, immediately after confirming the electrical contact point, so as to store an amplitude value of the detected voltage waveform. When measuring the voltage waveform of the object, if the amplitude value of the measured voltage waveform is smaller than the stored amplitude value by more than a predetermined error range, the measurement of the voltage waveform of the object is interrupted.

In this case, the step S6 carries out the light sampling in synchronism with the voltage waveform applied to the object, immediately after confirming the electrical contact point, so as to store the amplitude value of the detected voltage waveform. In addition, when measuring the voltage waveform of the object, the stored amplitude value is compared with the measured voltage waveform so as to detect the poor contact. Therefore, it is possible to prevent an erroneous measurement by automatically interrupting the measurement of the voltage waveform of the object.

(9) In the electrooptic voltage waveform measuring method described under (7) or (8) above, an A.C. voltage may be applied again to the reference electrode to confirm the electrical contact point after the measurement of the voltage waveform of the object is interrupted.

In other words, after the measurement of the voltage waveform of the object is interrupted, the step S6 may automatically confirm the electrical contact point again according to the method described under (4) above. As a result, even if the amplitude fluctuation occurs as described above under (8) above, it is possible to distinguish the damage or destruction of the object itself and the simple run-off of the probe. Therefore, the voltage waveform of the object can be measured at a high speed with a high accuracy, without generating an erroneous measurement.

(10) In the electrooptic voltage waveform measuring method described under (7) or (8) above, a load applied on the probe may be increased after interrupting the measurement of the voltage waveform of the object.

In this case, after interrupting the measurement of the voltage waveform of the object, it is possible to remove an abnormality in the case of a simply poor contact, by a simple operation of increasing the load on the probe in place of the step S6.

(11) According to an electrooptic voltage waveform measuring method of the present invention which optically measures a voltage applied to an object, a probe is mounted on one face of a voltage transducer, and a pulse voltage is applied from one end of the voltage transducer. A change in an electrical contact state between the probe and the object is detected from a change in a waveform of a reflected voltage pulse which is generated by an impedance mismatch at contact portions of the probe and the object.

When the electrical contact is confirmed optically as described under (4) above in the steps S4 and S6, it takes a relatively long time to confirm the electrical contact. On the other hand, it is possible to confirm the electrical contact at a high speed and with a high reliability when the electrical contact is confirmed electrically.

(12) In the electrooptic voltage waveform measuring method described under (4) or (11) above, when measuring an average of the voltage waveform of the object, a dispersion value of the measured voltage waveform may be compared with a dispersion value of a previously measured voltage waveform, so as to detect a change in the electrical contact state.

(13) In the electrooptic voltage waveform measuring method described under (4) or (11) above, when measuring an average of the voltage waveform of the object, a voltage histogram of the measured voltage waveform may be compared with a voltage histogram of a previously measured voltage waveform, so as to detect a change in the electrical contact state.

(14) In the electrooptic voltage waveform measuring method described under (4) or (11) above, when measuring an average of the voltage waveform of the object, the measured waveform may be compared with a previously measured voltage waveform, so as to detect a change in the electrical contact state.

(15) In the electrooptic voltage waveform measuring method described under (14) above, when measuring an average of the voltage waveform applied to the object, a differential operation may be carried out with respect to the measured voltage waveform and a previously measured voltage waveform, to obtain an average value of a difference signal waveform, so as to detect a change in the electrical contact state.

(16) In the electrooptic voltage waveform measuring method described under (14) above, when measuring an average of the voltage waveform applied to the object, a differential operation may be carried out with respect to the measured voltage waveform and a previously measured voltage waveform, to obtain an amplitude value of a difference signal waveform, so as to detect a change in the electrical contact state.

By using the dispersion value of the measured voltage waveform, the voltage histogram of the measured voltage waveform, the average value of the difference signal waveform between the measured voltage waveform and the previously measured voltage waveform or, the amplitude value of the difference signal waveform, it is possible to confirm that the electrical contact state is maintained, at a high speed and with a high accuracy.

(17) In the electrooptic voltage waveform measuring method described under any of (1) and (11) through (16) above, an electrooptic crystal having the Pockels effect may be used as the voltage transducer.

In this case, it is possible to accurately detect the voltage waveform of the object using the electrooptic effect, that is, the Pockels effect, of the electrooptic crystal.

(18) In the electrooptic voltage waveform measuring method described under any of (11) through (16) above, a semiconductor optical switch may be used as the voltage transducer.

In this case, it is possible to electrically detect the voltage waveform of the object using the semiconductor optical switch such as a photoconductive element.

Figure 1:
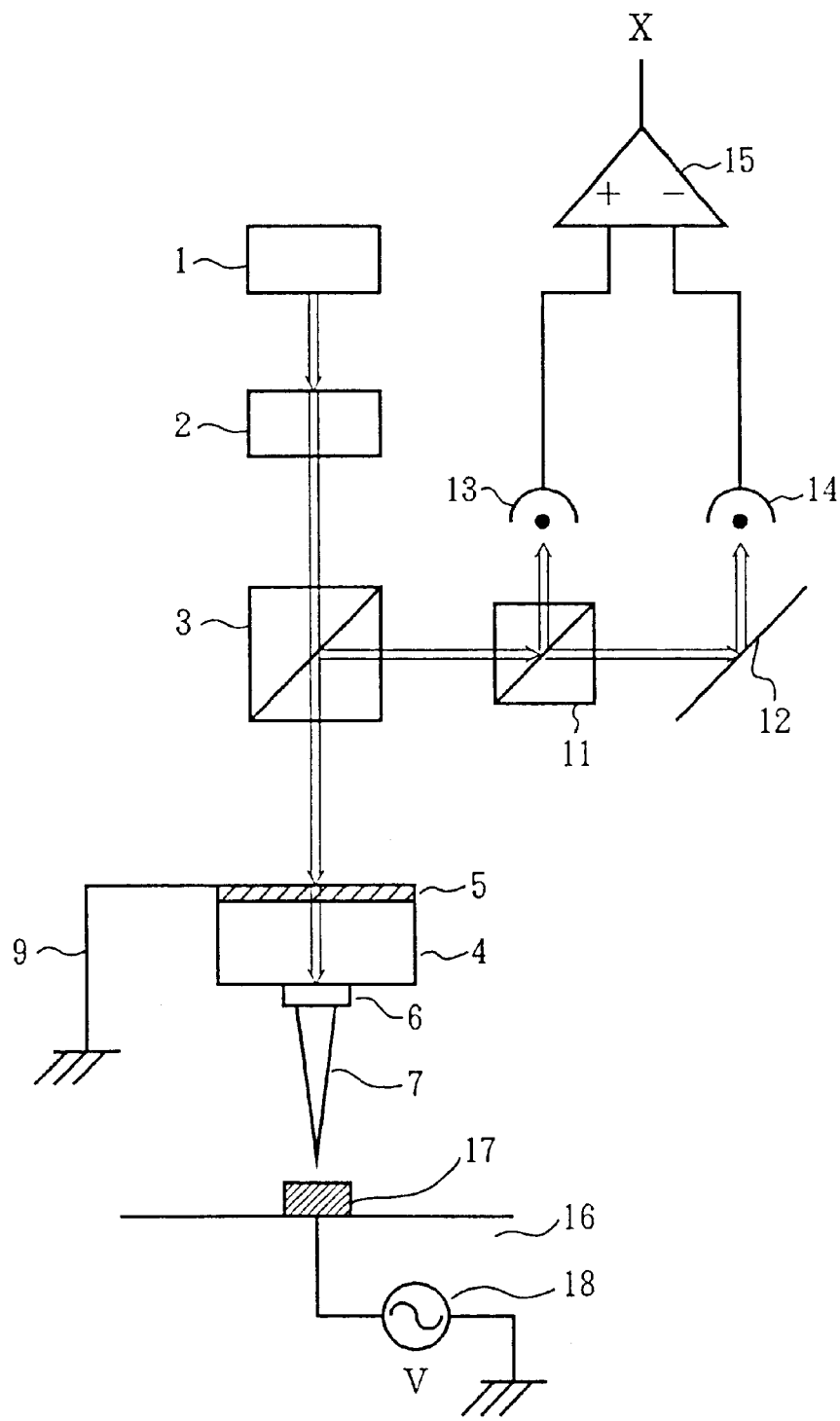
FIG. 1 is a diagram for explaining an example of a conventional voltage signal measuring apparatus using the electrooptic effect.
Figure 3:
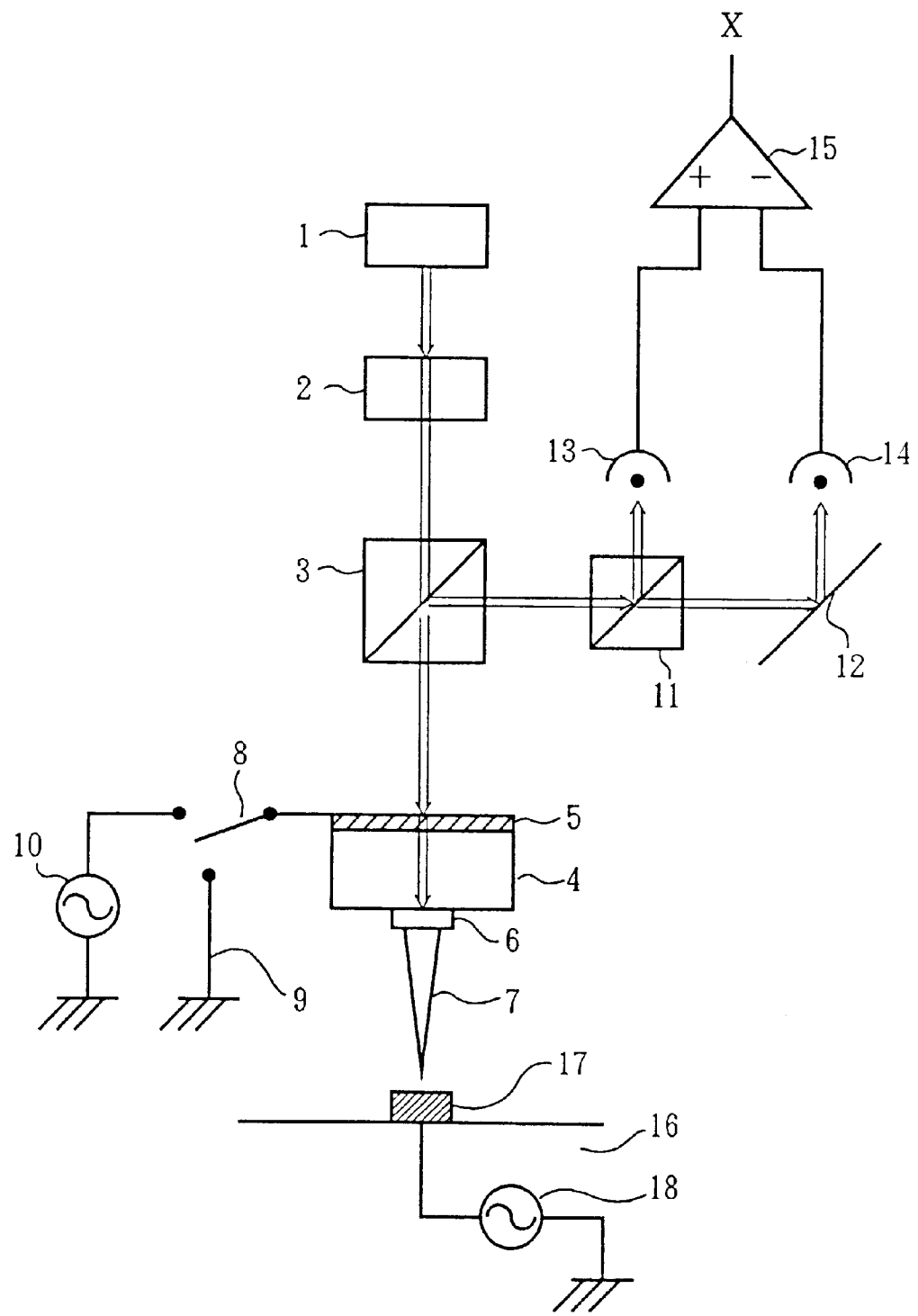
FIG. 3 is a diagram showing the general construction of a first embodiment of a voltage waveform measuring apparatus according to the present invention.

Next, a description will be given of a first embodiment of a voltage waveform measuring apparatus according to the present invention, by referring to FIG. 3. FIG. 3 shows the general construction of the first embodiment of the voltage waveform measuring apparatus. In FIG. 3, those parts which are basically the same as those corresponding parts in FIG. 1 are designated by the same reference numerals, and a description thereof will be omitted. This first embodiment of the voltage waveform measuring apparatus employs a first embodiment of a voltage waveform measuring method according to the present invention.

The first embodiment of the voltage waveform measuring apparatus and second through fifth embodiments of the voltage waveform measuring apparatus which will be described later, employ the first aspect of the present invention described above.

As shown in FIG. 3, a transparent electrode 5 for applying a reference voltage is provided on a main face of an electrooptic crystal 4. A probe 7 is mounted on the other face of the electrooptic crystal 4 via a reflecting electrode 6. The probe 7 is makes contact with a wiring layer 17 which is provided on a substrate 16 such as a Si substrate, so as to measure a signal 18 which is applied to the wiring layer 17 and is to be measured. This wiring layer 17 is an object to be measured, that is, the object which is applied with the signal 18 which is to be measured.

Actually, the electrooptic crystal 4 is supported by a parallel leaf spring via a hollow pipe which is mounted on the transparent electrode and guides a laser beam, so that the probe 7 is held perpendicular to the wiring layer 17.

The laser beam from a laser light source 1 is irradiated on the electrooptic crystal 4 via a phase plate 2 and a beam splitter 3. Reflected light from the reflecting electrode 6 is detected by photodetector 13 via a polarization beam splitter 11 and by a photodetector 14 via the polarization beam splitter 11 and a mirror 12. A differential output X is obtained from a differential amplifier 15 by inputting outputs of the photodetectors 13 and 14.

In FIG. 3, a switch 8 selectively connects the transparent electrode 5 to a ground line 9 or a low-frequency oscillator 10 by taking first or second positions, and does not connect to either the ground line 9 or the low-frequency oscillator 10 by taking a third position. It is possible to determine the voltage origin by controlling the switch 8 in an open state (third position). On the other hand, it is possible to measure the voltage waveform of the signal 18 applied to the wiring layer 17 by controlling the switch 8 to the first position so as to connect to the ground line 9. Further, it is possible to confirm an electrical contact between the probe 7 and the wiring layer 17 by controlling the switch 8 to the third position so as to connect to the low-frequency oscillator 10.

The differential output X is dependent on the signal 18 which is applied to the wiring layer 17, and the signal 18 can be described by $V=a(X-b)$, where V denotes a voltage of the signal 18, a denotes a coefficient determining an amplitude of the signal 18, and b denotes a coefficient determining a 0 V position.

The present invention is of course not limited to the application to the optical system described above for detecting the voltage, and the present invention is similarly applicable to optical systems having other constructions for detecting the voltage.

Figure 4:
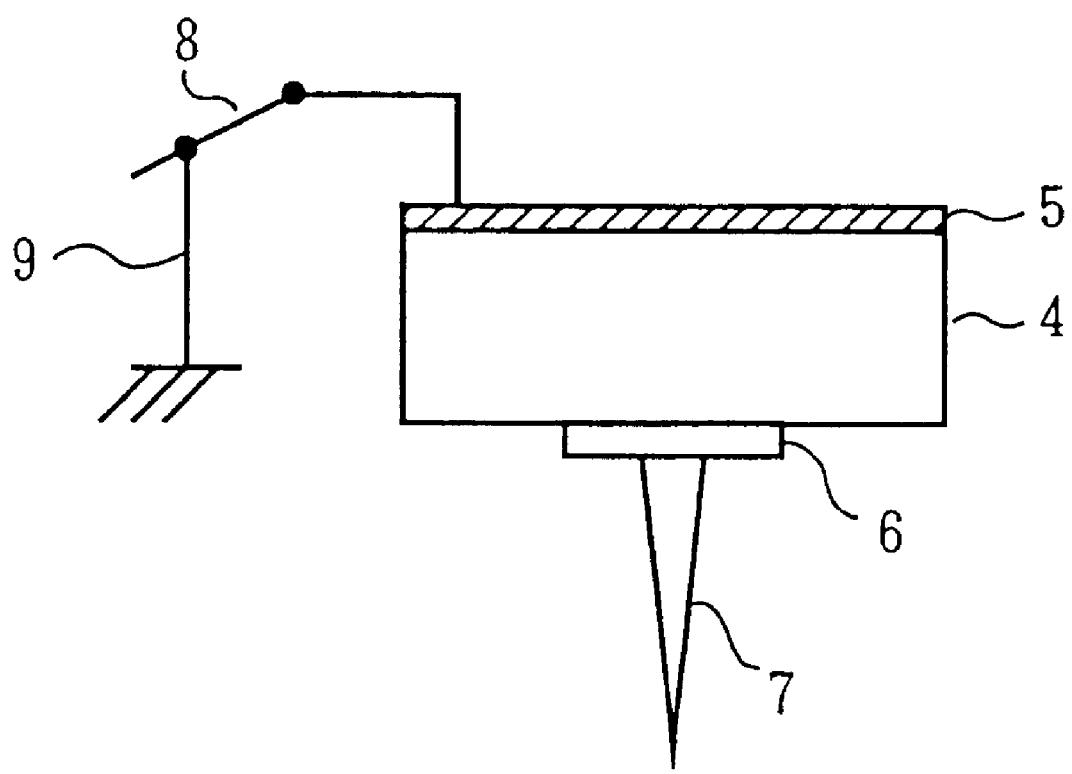
FIG. 4 is a diagram for explaining a method of determining a voltage origin in the first embodiment of the voltage waveform measuring apparatus.

Next, a description will be given of a method of determining the voltage origin in the first embodiment of the voltage waveform measuring apparatus according to the present invention, by referring to FIG. 4. In FIG. 4, those parts which are basically the same as those corresponding parts in FIG. 3 are designated by the same reference numerals, and a description thereof will be omitted.

If the resistance between two faces of the electrooptic crystal 4, that is, between the transparent electrode 5 and the reflecting electrode 6, is denoted by R, and the capacitance between the two faces of the electrooptic crystal 4 is denoted by C, the probe 7 shown in FIG. 4 is maintained for a sufficiently long time compared to a time constant $t=RC$ in an electrically floating state before contacting the probe 7 to the wiring layer 17 (not shown in FIG. 4).

In this state, a potential difference may exist between the two faces of the electrooptic crystal 4 due to charge-up or the like during the measurement. However, an equivalent circuit of the electrooptic crystal 4 can be regarded as a parallel circuit which is made up of the resistance R and the capacitance C connected in parallel. For this reason, even if an initial potential of the probe 7 in the state where the transparent electrode 5 is connected to the ground line 9 is $V_0$, the charge of the capacitance C is discharged by the resistance R by electrically floating the probe 7, and the potential of the probe 7 becomes $V_0/e$ after the time $t=RC$, where e denotes a bottom of a natural logarithm.

For example, if the resistance R between the two faces of the electrooptic crystal 4 is 10 MΩ and the capacitance C between the two faces of the electrooptic crystal 4 is 1 nF, the time constant t=RC is 0.01 second. Accordingly, by carrying out the measurement after electrically floating the probe 7 for a time of approximately 1 second which is sufficiently long compared to the time constant t, it is possible to obtain the coefficient b of the differential output X with respect to the voltage V=0, that is, the voltage origin.

Thereafter, the probe 7 is electrically contacted to the wiring layer 17. By measuring the voltage waveform of the signal 18 applied to the wiring layer 17, it is possible to accurately measure an absolute value of the voltage of the signal 18.

Figure 5:
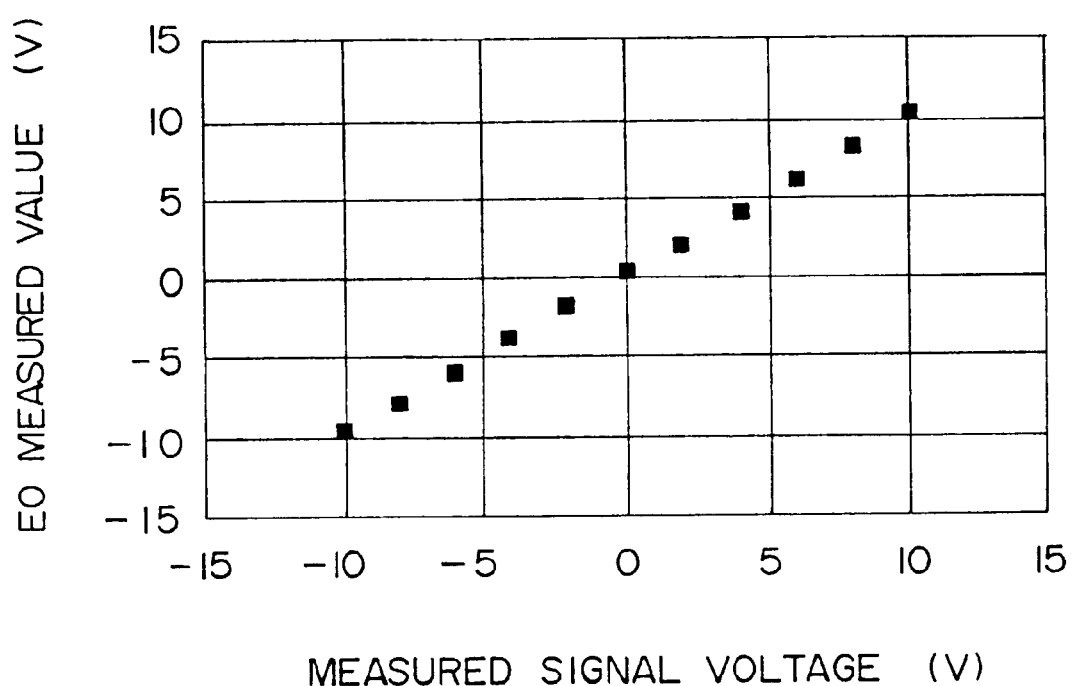
FIG. 5 is a diagram showing a measured result obtained in the first embodiment of the voltage waveform measuring apparatus.

FIG. 5 is a diagram showing a measured result obtained in the first embodiment of the voltage waveform measuring apparatus. An electrooptic (EO) measured value shown in FIG. 5, that is, the measured result, matches a measured signal voltage which is measured in advance by other means. Hence, it was confirmed that a measurement which is highly accurate is possible by the first embodiment of the voltage waveform measuring apparatus.

Even if a D.C. electrical signal is applied to the transparent electrode 5, no problem is introduced because the potential difference between the two faces of the electrooptic crystal 4 becomes 0 V after the time which is greater than or equal to the time constant RC by electrically floating the probe 7.

Figure 6:
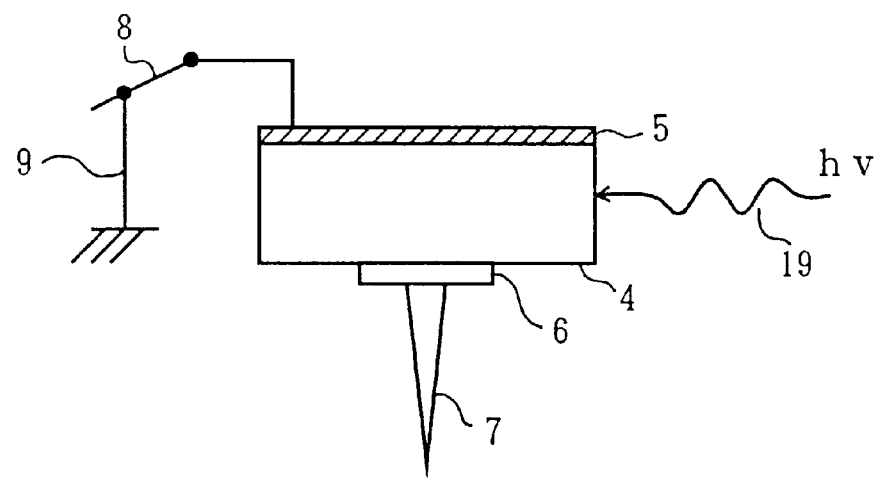
FIG. 6 is a diagram for explaining the method of determining the voltage origin in a second embodiment of the voltage waveform measuring apparatus according to the present invention.

Next, a description will be given of the method of determining the voltage origin in a second embodiment of the voltage waveform measuring apparatus according to the present invention, by referring to FIG. 6. In FIG. 6, those parts which are basically the same as those corresponding parts in FIG. 3 are designated by the same reference numerals, and a description thereof will be omitted. In this embodiment, a crystal such as ZnTe and having photoconductivity is used as the electrooptic crystal 4. This second embodiment of the voltage waveform measuring apparatus employs a second embodiment of the voltage waveform measuring method according to the present invention.

In FIG. 6, in a state before the probe 7 contacts the wiring layer 17, a light 19 is irradiated on the electrooptic crystal (ZnTe) 4. The resistance R of the electrooptic crystal 4 greatly decreases due to photo carriers generated by the irradiation of the light 19 on the electrooptic crystal 4, and the time constant RC at the time of the discharge also decreases considerably. As a result, it is possible to greatly reduce the time required to determine the voltage origin.

Figure 7:
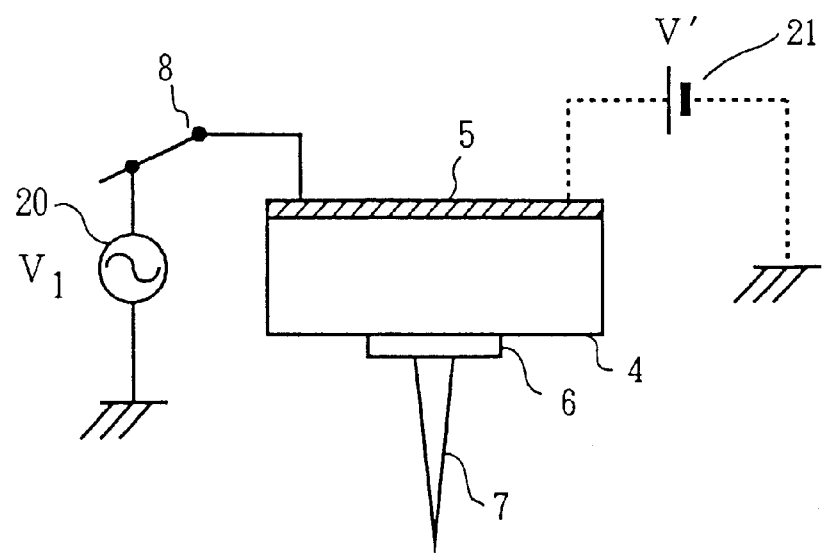
FIG. 7 is a diagram for explaining the method of determining the voltage origin in a third embodiment of the voltage waveform measuring apparatus according to the present invention.
Figure 8:
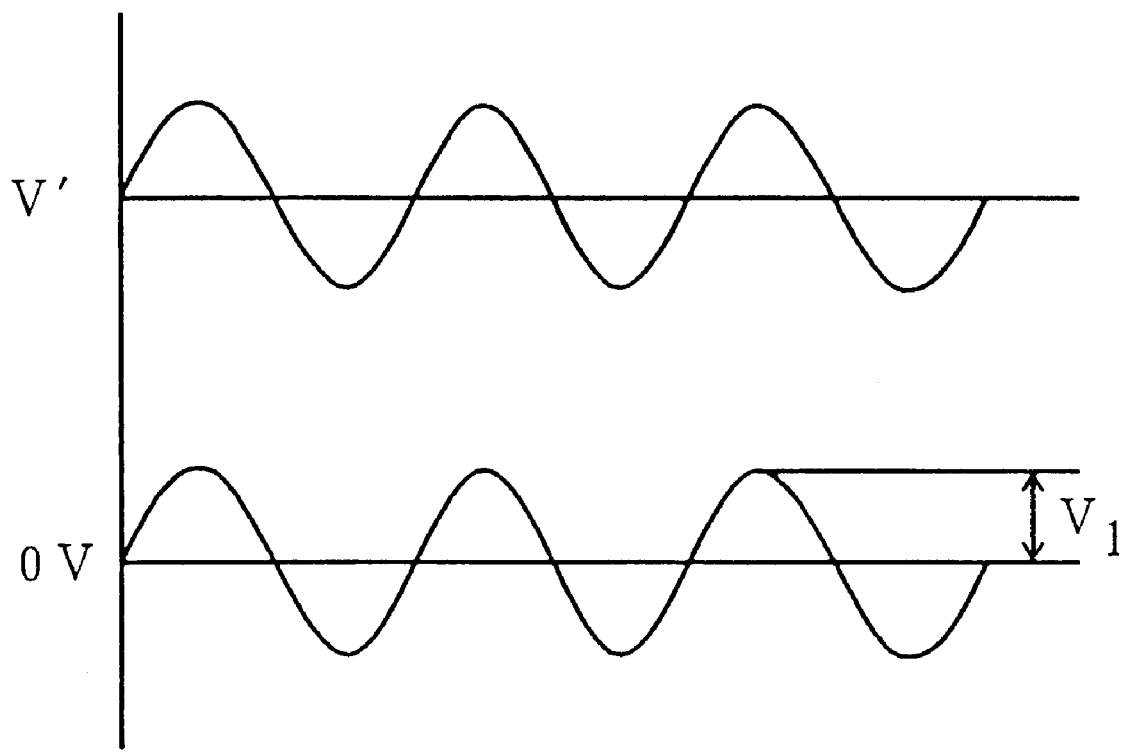
FIG. 8 is a time chart for explaining the relationship of a voltage applied to a transparent electrode and a voltage origin in the third embodiment of the voltage waveform measuring apparatus.

Next, a description will be given of a third embodiment of the voltage waveform measuring apparatus according to the present invention, by referring to FIGS. 7 and 8. FIG. 7 is a diagram for explaining the method of determining the voltage origin in the third embodiment of the voltage waveform measuring apparatus according to the present invention. In FIG. 7, those parts which are basically the same as those corresponding parts in FIG. 3 are designated by the same reference numerals, and a description thereof will be omitted. In addition, FIG. 8 is a time chart for explaining the relationship of a voltage applied to a transparent electrode and a voltage origin in the third embodiment of the voltage waveform measuring apparatus. This third embodiment of the voltage waveform measuring apparatus employs a third embodiment of the voltage waveform measuring method according to the present invention.

In this embodiment, a signal having a period shorter than the time constant RC, that is, a high-frequency signal $V_1$ which is obtained from a high-frequency signal source 20 and has no D.C. offset, is applied to the transparent electrode 5. In this case, the potential difference between the two faces of the electrooptic crystal 4 is not 0 V and varies at the period of the high-frequency signal $V_1$, however, a D.C. component thereof is 0 V. Hence, by taking an average of the measured differential output X during 1 period of the high-frequency signal $V_1$ and cancelling the fluctuation component, an average value becomes 0 V, and the coefficient b of the voltage origin is obtained.

As indicated by a dotted line in FIG. 7, when the voltage waveform of the object is measured in a state where a D.C. voltage V' from a voltage source 21 is applied to the transparent electrode 5, the voltage origin corresponds to the potential V' of the object. This relationship of the potential V' and the high-frequency signal $V_1$ is shown in FIG. 8.

Therefore, according to the first through third embodiments described above, there is no need to use a special correction pad, and the voltage origin can be determined in a state where the probe 7 is stationary at the measuring point. For this reason, it is possible to reduce the time required to determine the voltage origin, and the reliability is improved because the determination of the voltage origin and the measurement of the object, that is, the signal 18 applied to the wiring layer 17, are carried out successively.

After determining the voltage origin as described above, the voltage waveform of the object is measured. When measuring the voltage waveform of the object, it is essential to confirm the electrical contact between the probe and the object, and a description will now be given of a fourth embodiment of the voltage waveform measuring apparatus according to the present invention, by referring to FIGS. 9 through 14. In this embodiment, the electrical contact between the probe and the object is automatically confirmed optically. This fourth embodiment of the voltage waveform measuring apparatus employs a fourth embodiment of the voltage waveform measuring method according to the present invention.

Figure 9:
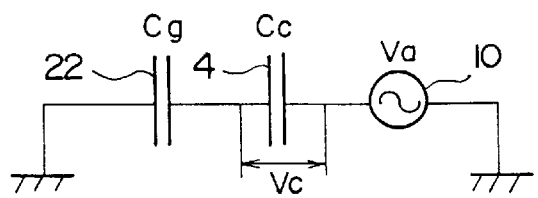
FIG. 9 is a circuit diagram showing an equivalent circuit of a fourth embodiment of the voltage waveform measuring apparatus for a case where a probe is brought close to a wiring layer in a state where a low-frequency signal is applied to a transparent electrode of an electrooptic crystal.

FIG. 9 is a circuit diagram showing an equivalent circuit of this fourth embodiment of the voltage waveform measuring apparatus for a case where the probe 7 is brought close to the wiring layer 17 in a state where a low-frequency signal $V_a$ from the low-frequency oscillator 10 is applied to the transparent electrode 5. In this case where no electrical contact exists between the probe 7 and the wiring layer 17, a capacitive coupling is formed between the probe 7 and the wiring layer 17 by a probe-wiring layer capacitor 22 having a capacitance $C_g$.

In other words, since the wiring layer 17 of the semiconductor device is made of Al or Al alloy, a natural oxide layer is formed on the surface of the wiring layer 17. Hence, when the probe 7 is physically contacted to the wiring layer 17 after measuring the surface form by the AFM, the probe 7 is not necessarily electrically connected to the wiring layer 17, and the probe 7 and the wiring layer 17 are coupled by the capacitance $C_g$ to for a capacitive coupling.

Accordingly, the low-frequency signal V from the low-frequency oscillator 10 is subjected to a voltage division by the capacitance $C_g$ and a capacitance $C_c$ of the electrooptic crystal 4. Hence, when a laser beam is irradiated on the electrooptic crystal 4 in synchronism with the oscillation frequency of the low-frequency oscillator 10 and optically sampled to make the voltage waveform measurement, it is possible to measure the voltage $V_c$ which is applied to the electrooptic crystal 4.

This voltage $V_c$ is described by $V_c = V_a \cdot C_g/(C_c + C_g)$, and the capacitance $C_g$ is inversely proportional to the separation between the probe 7 and the wiring layer 17. Hence, the voltage $V_c$ gradually approaches the voltage $V_a$ as the probe 7 approaches the wiring layer 17, and the voltage waveform becomes larger.

Figure 10:
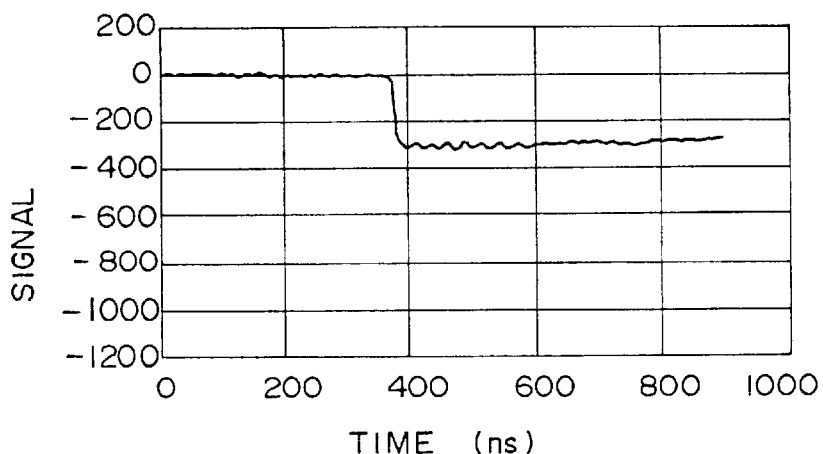
FIG. 10 shows a voltage waveform of a step signal which is applied to the transparent electrode of the electrooptic crystal and is measured before the probe contacts the wiring layer.

FIG. 10 shows a voltage waveform of a step signal which is applied to the ZnTe electrooptic crystal 4 from the low-frequency oscillator 10 via the transparent electrode 5 and is measured before the probe 7 contacts the wiring layer 17. Since this voltage waveform is measured in a state where the capacitance $C_g$ is small, the voltage $V_c$ is considerably smaller than the voltage $V_a$ and the amplitude of the measured voltage waveform is small.

Figure 11:
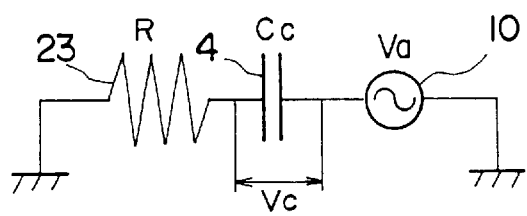
FIG. 11 is a circuit diagram showing an equivalent circuit of the fourth embodiment of the voltage waveform measuring apparatus for a case where the probe makes sufficient electrical contact with the wiring layer.

FIG. 11 is a circuit diagram showing an equivalent circuit of this fourth embodiment of the voltage waveform measuring apparatus for a case where the probe 7 makes sufficient electrical contact with the wiring layer 17. In this case, a contact resistance 23 of the probe 7 is connected in series to the capacitance $C_g$, however, a resistance R of this contact resistance 23 is sufficiently small compared to the impedance of the capacitance $C_g$. As a result, the voltage $V_c$ becomes approximately equal to the voltage $V_a$, and approximately all of the voltage $V_a$ is applied to the electrooptic crystal 4.

Accordingly, the amplitude of the measured voltage waveform becomes large and stabilizes. Even if a further load is applied on the probe 7, the amplitude of the measured voltage waveform will not change. For this reason, it is possible to detect the electrical contact between the probe 7 and the wiring layer 17 by detecting the change in the amplitude of the measured voltage waveform.

Figure 12:
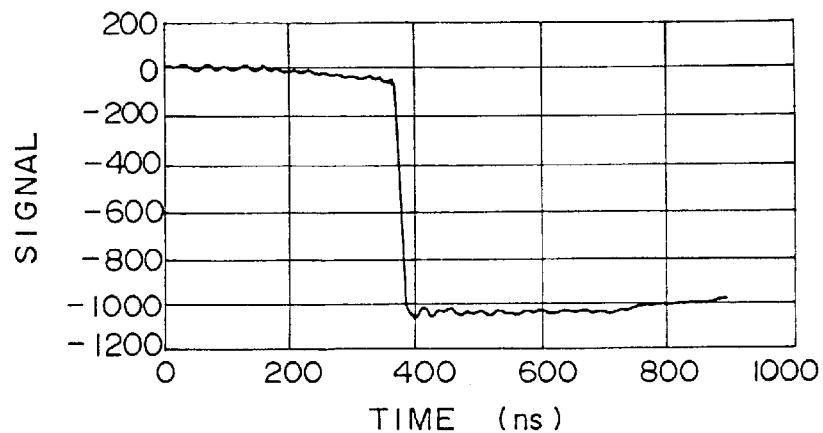
FIG. 12 shows a voltage waveform of a step signal which is applied to the transparent electrode of the electrooptic crystal and is measured after the probe makes sufficient contact with the wiring layer.

FIG. 12 shows a voltage waveform of a step signal which is applied to the ZnTe electrooptic crystal 4 from the low-frequency oscillator 10 via the transparent electrode 5 and is measured after the probe 7 makes sufficient contact with the wiring layer 17. As may be seen by comparing FIG. 12 and FIG. 10, the amplitude of the measured voltage waveform after the electrical contact is achieved between the probe 7 and the wiring layer 17 is approximately three times or more the amplitude of the measured voltage waveform before the electrical contact is achieved.

Figure 13:
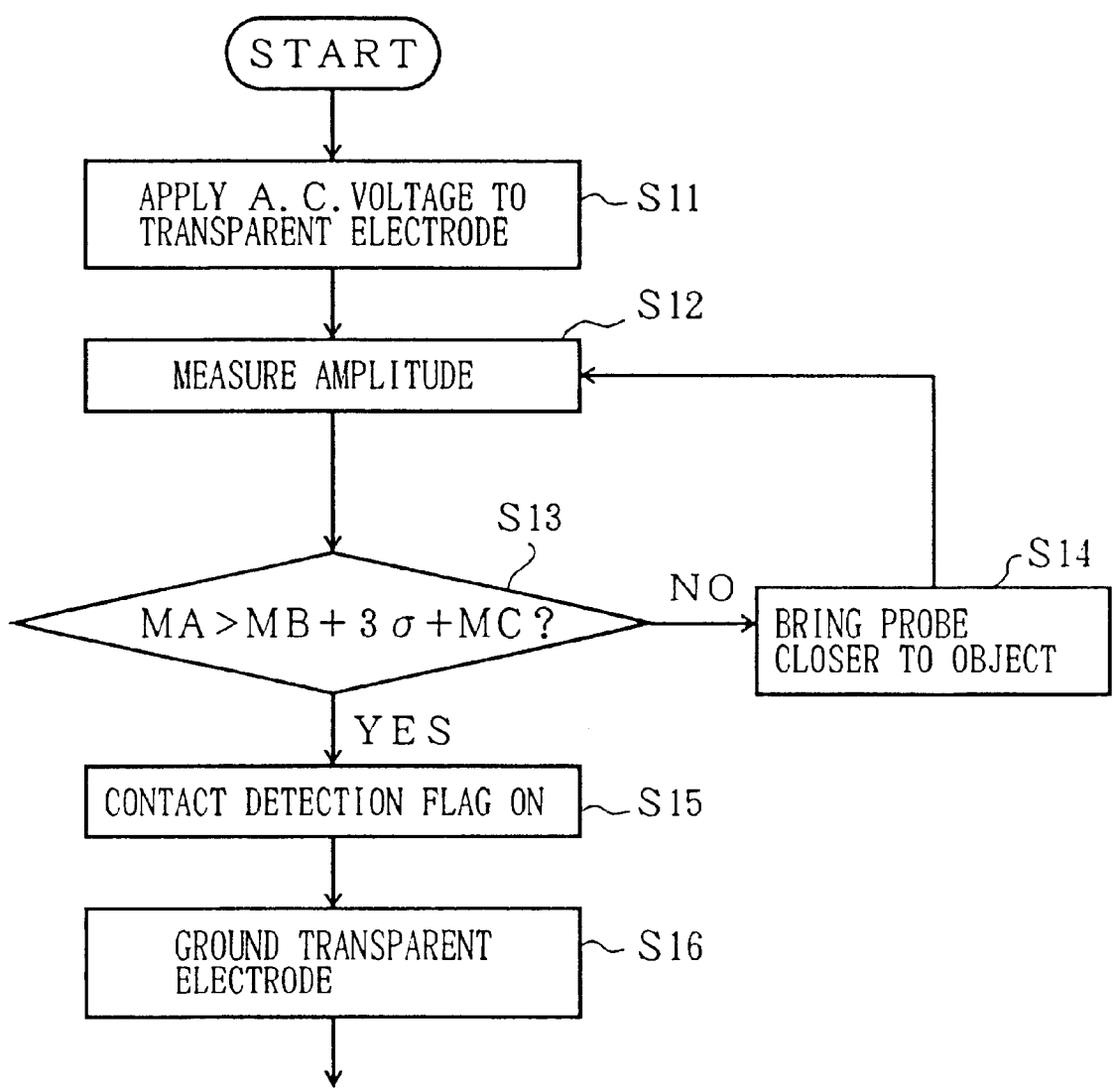
FIG. 13 is a flow chart for explaining a process of detecting electrical contact between the probe and the wiring layer.

FIG. 13 is a flow chart for explaining a process of detecting electrical contact between the probe 7 and the wiring layer 17. In FIG. 13, a step S11 controls and connects the switch 8 to the second position so as to connect the transparent electrode 5 shown in FIG. 3 to the low-frequency oscillator 10, thereby applying the A.C. voltage from the low-frequency oscillator 10 to the transparent electrode 5. A step S12 measures the voltage waveform of the A.C. voltage of the wiring layer 17 using the light sampling technique by contacting the probe 7 to the wiring layer 17 and increasing the load applied on the probe 7.

A step S13 decides whether or not a measured amplitude value MA of the voltage waveform is greater than or equal to a sum of an amplitude MB immediately before the probe 7 makes electrical contact with the wiring layer 17, three times a standard deviation σ of the inconsistency (noise) of the measured amplitude value and a margin MC which is set in advance based on experience. If MA≦MB+3σ+MC and the decision result in the step S13 is NO, it is judged that the electrical contact between the probe 7 and the wiring layer 17 is not yet achieved, and a step S14 brings the probe 7 closer to the wiring layer 17. The process returns to the step S12 after the step S14.

On the other hand, if the decision result in the step S13 is YES, it is judged that the electrical contact is achieved between the probe 7 and the wiring layer 17, and a step S15 turns a contact detection flag ON. In addition, a step S16 controls and connects the switch 8 to the first position so as to connect the transparent electrode 5 which becomes a reference electrode to the ground line 9, thereby starting measurement of the signal 18 which is applied to the wiring layer 17.

In this case, the step S13 decides whether or not the relationship MA>MB+3σ+MC is satisfied. However, it is possible instead to compare the measured amplitude value of the voltage waveform and the amplitude value measured immediately before, and to detect the achievement of the electrical contact between the probe 7 and the wiring layer 17 depending on whether or not the two compared amplitude values stabilize.

In order to stably maintain the electrical contact between the probe 7 and the wiring layer 17, it is necessary to further apply a preset load on the probe 7 after the achievement of the electrical contact is detected and before the measurement of the voltage waveform of the wiring layer 17 is measured. However, the load which is further applied on the probe 7 in order to positively maintain the electrical contact between the probe 7 and the wiring layer 17 is dependent upon a vibration quantity of the object, that is, the wiring layer 17, and a vibration quantity of the environment. For this reason, it is necessary to experimentally determine in advance an optimum load which is to be further applied to the probe 7.

After the electrical contact is achieved between the probe 7 and the wiring layer 17, the measurement of the voltage waveform of the wiring layer 17 is started as described above. However, while the voltage waveform is measured, it is preferable to monitor the electrical contact between the probe 7 and the wiring layer 17 so as to confirm whether or not the electrical contact is maintained during the measurement. By monitoring the electrical contact, it is possible to prevent a measurement error from being generated when the electrical contact is lost due to vibration or the like.

In this embodiment, it is possible to monitor the electrical contact between the probe 7 and the wiring layer 17 according to either one of first and second monitoring methods described below.

According to the first monitoring method, the transparent electrode 5 is connected to the ground line 9 after the electrical contact is archived between the probe 7 and the wiring layer 17, and the voltage waveform of the wiring layer 17 is monitored by irradiating a laser beam on the transparent substrate 5 and the electrooptic crystal 4 in synchronism with the voltage waveform applied to the wiring layer 17.

The measured amplitude of the voltage waveform of the wiring layer 17 obtained at this point in time is stored as a reference amplitude. Thereafter, the measured amplitude of the voltage waveform is compared with the stored reference amplitude, and a possibility of an abnormality in the electrical contact is detected when the measured amplitude is lower than the stored reference amplitude by a value greater than a set margin which is determined in advance by taking into consideration statistical inconsistencies in the measured amplitudes. If the possibility of the abnormality in the electrical contact is detected, the measurement of the voltage waveform of the wiring layer 17 is interrupted, and the process of detecting the electrical contact point, that is, the process of detecting the achievement of the electrical contact between the probe 7 and the wiring layer 17 is carried out. By carrying out the process of detecting the achievement of the electrical contact, it is possible to detect whether or not the voltage waveform applied to the wiring layer 17 is abnormal; that is, whether the wiring layer 17 is abnormal or the electrical contact between the probe 7 and the wiring layer 17 is not maintained.

Figure 14:
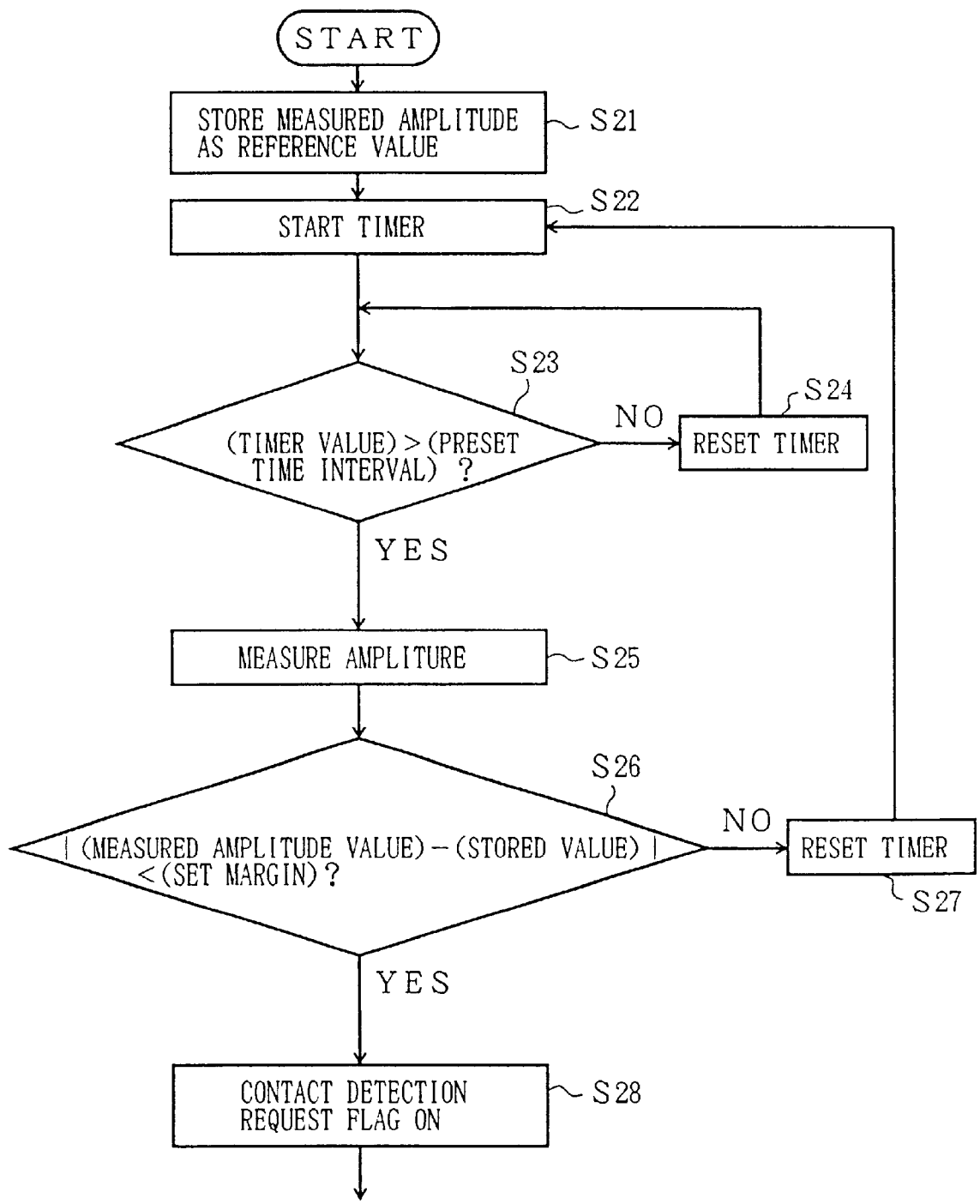
FIG. 14 is a flow chart for explaining a process of monitoring the electrical contact between the probe and the wiring layer.

FIG. 14 is a flow chart for explaining a process of monitoring the electrical contact between the probe 7 and the wiring layer 17 according to the second monitoring method.

In FIG. 14, a step S21 measures the amplitude of the voltage waveform of the low-frequency signal which is obtained when the electrical contact is achieved between the probe 7 and the wiring layer 17, and stores the measured amplitude as a reference amplitude. A step S22 starts a timer, and simultaneously starts measurement of the voltage waveform of the wiring layer 17. A step S23 decides whether or not a time timed by the timer is greater than a preset time interval. If the decision result in the step S23 is NO, a step S24 resets the timer, and the process returns to the step S23.

On the other hand, if the decision result in the step S23 is YES, a step S25 interrupts the measurement of the voltage waveform, applies the low-frequency A.C. signal from the low-frequency oscillator 10 to the transparent electrode 5, and then measures the amplitude of the voltage waveform of the wiring layer 17. A step S26 decides whether or not a difference between the measured amplitude and the stored amplitude is less than a set margin which is determined in advance by taking into consideration the statistical inconsistencies of the measured amplitudes. If the decision result in the step S26 is No, a step S27 resets the timer, and the process returns to the step S22. But if the decision result in the step S26 is YES, a step S28 judges that an abnormality in the electrical contact between the probe 7 and the wiring layer 17 occurred, interrupts the measurement of the voltage waveform of the wiring layer 17, and turns contact detection request flag ON. After the step S28, the process of detecting the electrical contact shown in FIG. 13 is carried out again.

It is of course possible to employ a combination of the first and second monitoring methods described above. In addition, when it is judged that there is a possibility of the electrical contact between the probe 7 and the wiring layer 17 being abnormal, it is possible to increase the load on the probe 7 in place of carrying out the process of detecting the electrical contact, so as to restore the electrical contact.

Therefore, according to the fourth embodiment of the voltage waveform measuring apparatus, it is possible to achieve the electrical contact between the probe and the object to be measured with a high reproducibility, and the electrical contact can stably be maintained. Furthermore, it is possible to simply monitor whether or not the electrical contact between the probe and the object is maintained, thereby enabling a highly reliable voltage waveform measurement.

Next, a description will be given of a fifth embodiment of the voltage waveform measuring apparatus according to the present invention, by referring to FIGS. 15 through 22. In this embodiment, the electrical contact between the probe and the object is confirmed electrically, and the monitoring of the electrical contact is carried out electrically. This fifth embodiment of the voltage waveform measuring apparatus employs a fifth embodiment of the voltage waveform measuring method according to the present invention.

In the fourth embodiment described above employing the electrooptic effect, a high impedance and a high frequency band are obtainable. However, if the process of confirming the electrical contact between the probe and the object is carried out frequently during the voltage waveform measurement, the throughput of the voltage waveform measuring apparatus deteriorates. Hence, this fifth embodiment electrically confirms and electrically monitors the electrical contact between the probe and the object, so as to reduce the time required to measure the voltage waveform as compared to the fourth embodiment.

Figure 15:
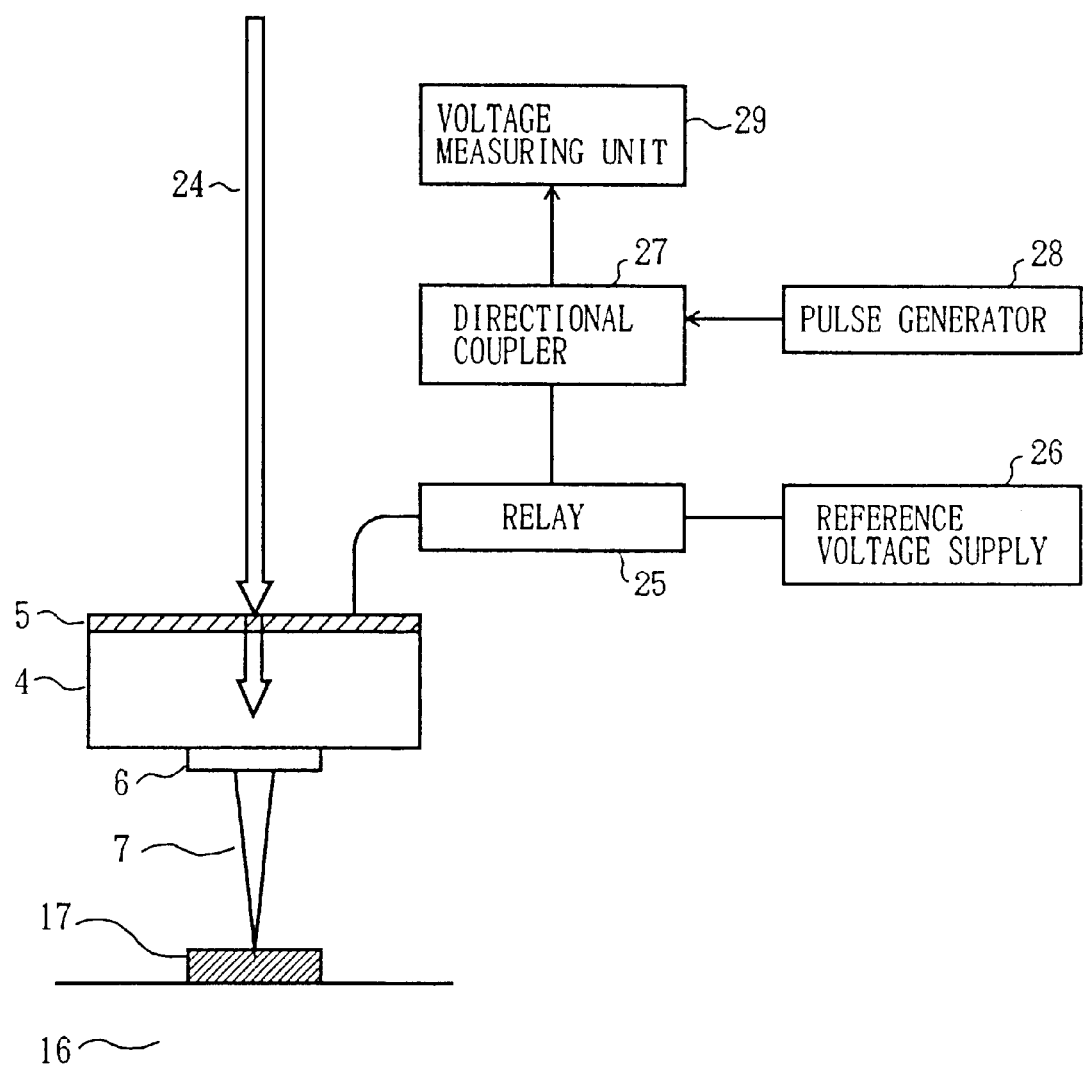
FIG. 15 is a diagram showing the general construction of a fifth embodiment of the voltage waveform measuring apparatus according to the present invention.

FIG. 15 is a diagram showing the general construction of a fifth embodiment of the voltage waveform measuring apparatus according to the present invention. In FIG. 15, those parts which are the same as those corresponding parts in FIG. 3 are designated by the same reference numerals, and a description thereof will be omitted.

In this embodiment, the method of measuring the voltage waveform of the signal 18 applied to the wiring layer 17 is the same as that employed in the fourth embodiment described above. In other words, the voltage of the wiring layer 17 applied to the electrooptic crystal 4 via the probe 4 is measured optically by irradiating a laser beam 24 on the transparent electrode 5 and the electrooptic crystal 4.

In FIG. 15, a relay 25, a directional coupler 27, a pulse generator 28 and a voltage measuring unit 29 form a means for detecting the achievement of the electrical contact between the probe 7 and the wiring layer 17 and for monitoring the electrical contact while the voltage waveform of the wiring layer 17 is measured. The relay 25 is made up of a high-frequency relay, and the pulse generator 28 applies a pulse voltage to the electrooptic crystal 4 via the directional coupler 27 and the relay 25. This pulse voltage has a sharp rising edge such that the rise time is approximately 100 ps, for example. The voltage measuring unit 29 detects a reflected voltage pulse that is generated due to impedance mismatch at the contact portions of the probe 7 and the wiring layer 17. When carrying out the normal operation of measuring the voltage waveform of the wiring layer 27, a reference voltage is applied to the transparent electrode 5 from a reference voltage source 26 via the relay 25.

Figure 16:
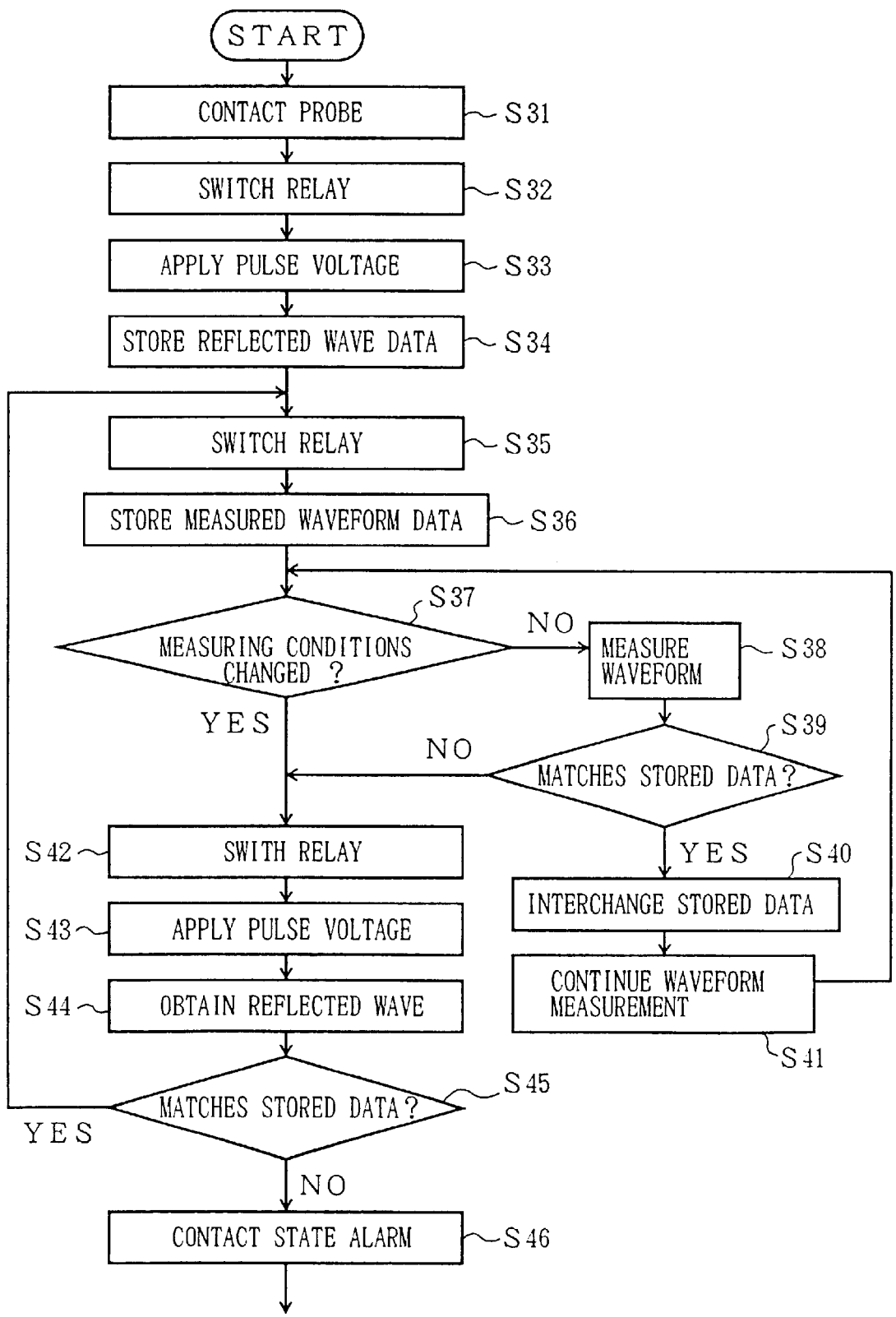
FIG. 16 is a flow chart for explaining a process of detecting and monitoring the electrical contact between the probe and the wiring layer in the fifth embodiment of the voltage waveform measuring apparatus.

FIG. 16 is a flow chart for explaining a process of detecting and monitoring the electrical contact between the probe 7 and the wiring layer 17 in the fifth embodiment of the voltage waveform measuring apparatus.

In FIG. 16, a step S31 contacts the probe 7 to the wiring layer 17, and a step S32 switches the relay 25 so that the relay 25 connects to the directional coupler 27. A step S33 applies the pulse voltage fro the pulse generator 28 to the transparent electrode 5. A step S34 measures the reflected voltage pulse that is generated due to the impedance mismatch at the contact portions of the probe 7 and the wiring layer 17 by the voltage measuring unit 29, via the relay 25 and the directional coupler 27. In addition, the step S34 stores the reflected voltage pulse after the achievement of the electrical contact between the probe 7 and the wiring layer 17 is detected.

The achievement of this electrical contact, that is, a change in the state of electrical contact between the probe 7 and the wiring layer 17, can be detected from a change in the waveform of the measured reflecting voltage pulse, a change in an arrival time of the reflected voltage pulse or, by comparing the waveform of the reflected voltage pulse at a predetermined time with a predetermined voltage value.

A description will be given of a method of detecting the electrical contact between the probe 7 and the wiring layer 17 in this embodiment, by referring to FIGS. 17 and 18.

Figure 17:
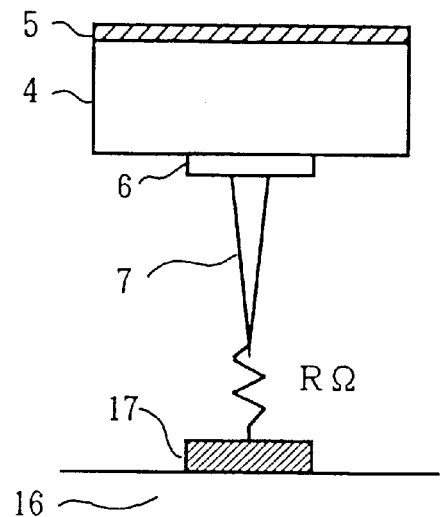
FIG. 17 is a diagram for explaining a method of detecting the electrical contact between the probe and the wiring layer in the fifth embodiment of the voltage waveform measuring apparatus.

FIG. 17 is a diagram for explaining the method of detecting the electrical contact between the probe 7 and the wiring layer 17. Since the voltage transducer, that is, the electrooptic crystal 4, can be regarded as a discrete element having a high resistance and a low capacitance, the impedance between the probe 7 and the wiring layer 17 is regarded as a resistance R having a value of approximately 10 MΩ to 1 GΩ and not as the capacitance $C_g$ when there is no electrical contact between the probe 7 and the wiring layer 17, and is regarded as a resistance R having a value of approximately 1 Ω.

Figure 18:
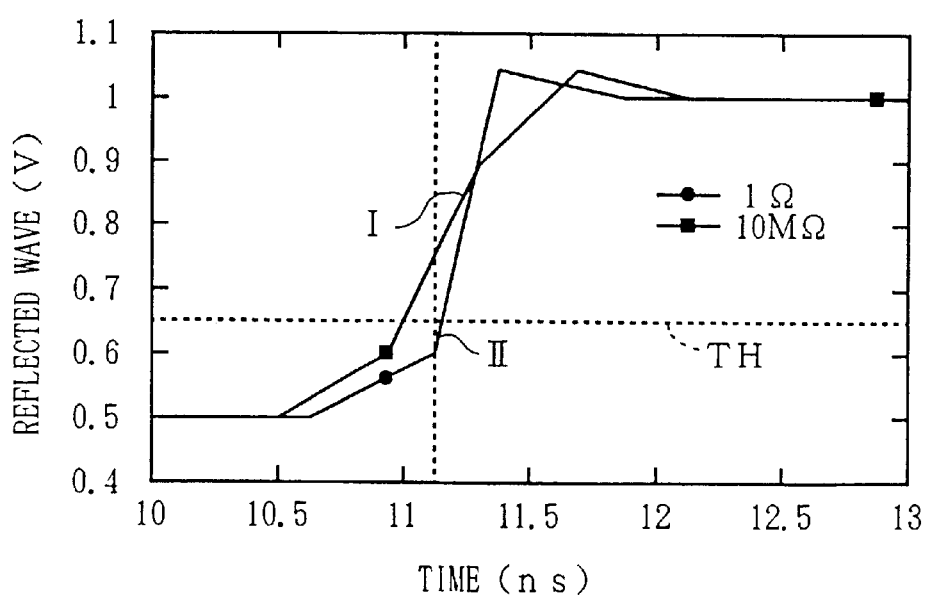
FIG. 18 is a diagram showing simulation results of a reflected voltage pulse measured by a voltage measuring unit.

FIG. 18 is a diagram showing simulation results of the reflected voltage pulse measured by the voltage measuring unit 29 when the pulse voltage from the pulse generator 28 is applied to the transparent electrode 5 via the directional coupler 27 and the relay 25. In FIG. 18, a characteristic I indicates the reflected voltage pulse for the case where the resistance R shown in FIG. 17 is 10 MΩ and large, and a characteristic II indicates the reflected voltage pulse for the case where the resistance R is 1 Ω and small. As may be seen from FIG. 18, the slope of the rising edge of the reflected voltage pulse is gradual in the characteristic I but is sharp in the characteristic II.

Accordingly, by measuring the waveform of the reflected voltage pulse at an appropriate timing and comparing the measured waveform with a predetermined threshold value TH indicated by a broken line in FIG. 18, it is possible to judge whether or not the value of the contact resistance is suited for measuring the voltage waveform of the wiring layer 17.

As other methods of detecting the electrical contact between the probe 7 and the wiring layer 17, it is possible to make the detection based on a change in the waveform of the reflected voltage pulse, based on a change in the slope of the rising edge of the reflected voltage pulse or, based on a change in an arrival time of the reflected voltage pulse.

Returning now to the description of FIG. 16, the step S34 stores the reflected voltage pulse after the achievement of the electrical contact between the probe 7 and the wiring layer 17 is detected as described above. Then, a step S35 switches the relay 25 to connect the relay 25 to the reference voltage source 26, and a step S36 irradiates the laser beam 24 onto the transparent electrode 5 and the electrooptic crystal 4 so as to start optically measuring the signal 18 applied to the wiring layer 17. The step S36 also stores the voltage waveform of the measured signal 18.

A step S37 decides whether or not measurement conditions under which the voltage waveform is measured changed while obtaining the average or the like of the voltage waveform. If the decision result in the step S37 is NO, a step S38 measures the voltage waveform of the signal 18 applied to the wiring layer 17, and a step S39 decides whether or not the measured voltage waveform matches the voltage waveform stored in the step S36. If the decision result in the step S39 is YES, it is judged that a satisfactory electrical contact is achieved between the probe 7 and the wiring layer 17. Hence, a step S40 replaces the stored voltage waveform by the most recent measured voltage waveform. In addition, a step S41 continues the voltage waveform measurement, and the process returns to the step S37.

On the other hand, if the decision result in the step S39 is NO, a satisfactory electrical contact may not be obtained between the probe 7 and the wiring layer 17 or, there is a possibility that the wiring layer was damaged or broken during the measurement process. Hence, if the decision result in the step S39 is NO, it is necessary to interrupt the measurement process and to again detect the achievement of the electrical contact between the probe 7 and the wiring layer 17. In addition, if the decision result in the step S37 is YES, it is also necessary to interrupt the measurement process and to again detect the achievement of the electrical contact between the probe 7 and the wiring layer 17.

In other words, if the decision result in the step S37 is YES or the decision result in the step S39 is NO, a step S42 switches the relay 25 to connect to the directional coupler 27. A step S43 applies the pulse voltage from the pulse generator 28 to the transparent electrode 5 via the directional coupler 27 and the relay 25. A step S49 measures the reflected voltage pulse that is generated due to the impedance mismatch at the contact portions of the probe 7 and the wiring layer 17 by the voltage measuring unit 29, via the relay 25 and the directional coupler 27. A step S45 decides whether or not the measured reflected voltage pulse matches the reflected voltage pulse stored in the step S36. If the decision result in the step S45 is YES, it is judged that the electrical contact between the probe 7 and the wiring layer 17 is maintained, and the process returns to the step S35 so as to again switch the relay 25 to the reference voltage source 26 and start the above described measurement again. On the other hand, if the decision result in the step S45 is NO, a step S46 judges that an abnormality has occurred in the electrical contact between the probe 7 and the wiring layer 17. Hence, the step S46 interrupts the voltage waveform measuring process, generates an alarm to indicate the abnormal state of the electrical contact, and restarts the process of contacting the probe 7 to the wiring layer 17.

Next, a description will be given of a method of comparing the waveforms when carrying out the voltage waveform measurement described above, by referring to FIGS. 19A through 22.

Figure 19A:
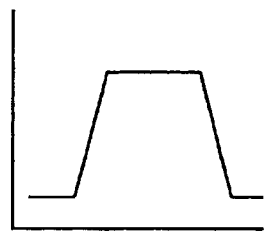
FIGS. 19A and 19B respectively are diagrams for explaining a change in the measured voltage waveform of the wiring layer.
Figure 19B:
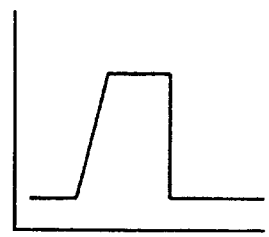

FIGS. 19A and 19B respectively are diagrams for explaining a change in the measured voltage waveform of the wiring layer 17. It is possible to monitor the electrical contact between the probe 7 and the wiring layer 17 by comparing the voltage waveforms shown in FIGS. 19A and 19B or by comparing reflected waveforms thereof.

Figure 20A:
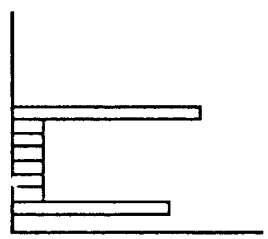
FIGS. 20A and 20B respectively are diagrams for explaining a change in a voltage histogram of the measured voltage waveform of the wiring layer.
Figure 20B:
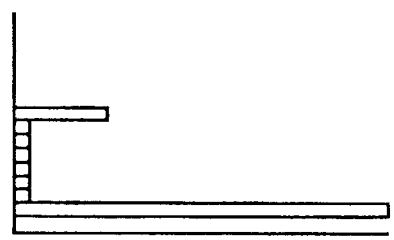

FIGS. 20A and 20B respectively are diagrams for explaining a change in a voltage histogram of the measured voltage waveform of the wiring layer 17. It is possible to monitor the electrical contact between the probe 7 and the wiring layer 17 by comparing the voltage histograms shown in FIGS. 20A and 20B.

Figure 21A:
FIGS. 21A and 21B respectively are diagrams for explaining a change in a dispersion value of the measured voltage waveform of the wiring layer.
Figure 21B:

FIGS. 21A and 21B respectively are diagrams for explaining a change in a dispersion value of the measured voltage waveform of the wiring layer 17. It is possible to monitor the electrical contact between the probe 7 and the wiring layer 17 by comparing the dispersion values shown in FIGS. 21A and 21B. This method using the dispersion value is simpler than the other methods.

Figure 22:
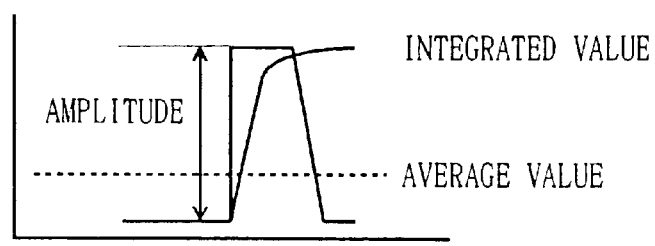
FIG. 22 is a diagram showing a difference waveform which is obtained by carrying out a differential operation with respect to the measured voltage waveform of the wiring layer and the voltage waveform measured immediately before, an average value of the difference waveform, and an integrated value of the difference waveform.

FIG. 22 is a diagram showing a difference waveform which is obtained by carrying out a differential operation with respect to the measured voltage waveform of the wiring layer 17 and the voltage waveform measured immediately before, an average value of the difference waveform, and an integrated value of the difference waveform. It is possible to monitor the electrical contact between the probe 7 and the wiring layer 17 based on the amplitude value of the difference waveform, the average value of the difference waveform or the integrated value of the difference waveform. The method which uses the integrated value of the difference waveform is simpler than the other methods in that the method can be realized by using an integrator.

In this fifth embodiment, the ZnTe electrooptic crystal 4 is used as the voltage transducer for optically measuring the voltage waveform of the object. However, it is possible to use a semiconductor optical switch which is photoconductive, such as a photoconductive element, as the voltage transducer. In this case, it is possible to measure the voltage waveform of the object by electrically detecting a signal which is generated due to the conductivity that increases when a laser beam is irradiated on the semiconductor optical switch.

In each of the embodiments described above, ZnTe is used as the electrooptic crystal 4. However, the electrooptic crystal 4 is not limited to ZnTe, but other electrooptic crystals such as BSO ($Bi_{12}SiO_{20}$) and BGO ($Bi_{12}GeO_{20}$) may be used as the electrooptic crystal 4. In addition, any optically transparent conductor, such as ITO, may be used as the transparent electrode 5.

According to the voltage waveform measuring method using the electrooptic effect, in principle it is possible to measure the D.C. voltage level if the voltage applied to the electrooptic element and the detected value in the polarization state are known. However, the actual electrooptic effect of the electrooptic element is extremely small and is easily affected by drifts of various elements, thereby making it difficult to obtain a high voltage measuring accuracy. For example, the drifts of the various elements include a drift of a double refraction of the electrooptic element due to a temperature change, a drift of a light quantity, a drift of an optical axis and the like.

A measurement error caused by such drifts occur gradually with time. For this reason, it is possible to obtain a certain voltage measuring accuracy with respect to the A.C. signal component by eliminating a low-frequency component corresponding to the drifts by some means. In other words, when using a continuous light instead of carrying out an electrooptic sampling in which a light pulse is irradiated on the electrooptic element and sampled, the low-frequency component can be eliminated by passing an output of a polarization analyzer through a highpass filter or, carrying out an operation to eliminate the low-frequency component after an analog-to-digital conversion. Various signal processing methods are possible when carrying out the electrooptic sampling, and the drift component may be eliminated by the following methods.

According to a simplest signal processing method, the electrooptic sampling is carried out using a light pulse having a slightly different period with respect to a periodic waveform to be measured. In this case, a pulse output of the polarization analyzer is passed through a lowpass filter having a sufficiently low frequency band compared to a repetition frequency of the pulse light, so as to obtain a voltage waveform having a repetition frequency equal to a difference between the frequency of the waveform to be measured and the repetition frequency of the light pulse. According to this signal processing method, in order to eliminate the drift component, an output voltage waveform of the lowpass filter is passed through a highpass filter so as to perfectly remove the drift or, an operation is carried out after the analog-to-digital conversion so as to eliminate the low-frequency component.

In the above described signal processing method, it is also possible to chop the light pulse and detect the light pulse by a lock-in amplifier in synchronism with the chopping. In this case, a noise of an electrical detection circuit is effectively eliminated. Further, in order to eliminate the drift component, an output voltage waveform of the lock-in amplifier is passed through a highpass filter so as to perfectly remove the drift or, an operation is carried out after the analog-to-digital conversion so as to eliminate the low-frequency component, as in the above described case.

According to another signal processing method, an analog output pulse waveform of a polarization detector corresponding to each light pulse is subjected to an analog-to-digital conversion with a timing matching the timing of each pulse, and signal processings thereafter such as an averaging process are carried out digitally. In this case, a light source which can output a light pulse at an arbitrary timing is used, and a timing with which the light pulse is irradiated at each period of the waveform to be measured can be arbitrarily set from a central processing unit (CPU) or the like when making the measurement. In addition, when making the measurement by outputting the light pulse at the arbitrary timing, a reference timing is appropriately set within 1 period of the repetition waveform to be measured, and a voltage measurement at an arbitrary timing and a voltage measurement at the reference timing are alternately made within short time intervals such that the drift can be neglected. In this case, the drift component can be eliminated by measuring a voltage difference from the voltage measured at the reference timing. This method will hereinafter be referred to as a base line sampling.

According to the measuring methods described above, it is possible to prevent the accuracy of the voltage measurement from deteriorating due to the drift, however, only the A.C. voltage component of the waveform is measured, and the D.C. voltage component of the waveform cannot be measured. But when measuring and inspecting waveforms of signals on wirings within integrated circuits, it is insufficient to measure only the A.C. signal component, and it is necessary to accurately measure also the D.C. signal component.

Next, a description will be given of an operating principle of a second aspect of the present invention. The second aspect of the present invention eliminates the drift component of the periodic voltage waveform that is measured using the electrooptic effect, so that it is possible to accurately measure also the D.C. signal component of the measured voltage waveform. In other words, the second aspect of the present invention accurately measures the voltage waveform including the low-frequency component or the D.C. component up to the high-frequency component.

[1] In the present invention, the voltage waveform measuring apparatus is provided with an electrooptic element having an electrooptic effect, a first electrode mounted on the electrooptic element and electrically coupled to an object to be measured, a first light source irradiating a light on the electrooptic element, a polarization analyzer analyzing a polarization state of the light passed through the electrooptic element and detecting a voltage waveform of the object, a second electrode mounted on the electrooptic element and separated from the first electrode, an amplifier having an input terminal coupled to the second electrode and outputting a low-frequency component of the voltage waveform of the object, and a voltage waveform combining processor obtaining a measured voltage waveform of the object by combining a high-frequency component of the voltage waveform of the object obtained from an output of the polarization analyzer and the low-frequency component of the voltage waveform of the object output from the amplifier.

By detecting the low-frequency component of the object by the amplifier and combing this low-frequency component with the high-frequency component obtained in the polarization analyzer, it is possible to accurately measure the voltage waveform of the object including the D.C. component up to the high-frequency component.

[2] In the voltage waveform measuring apparatus described above under [1], the amplifier may be made up of an operational amplifier using a field effect transistor as an input transistor.

In this case, it is possible to make an input impedance of the amplifier sufficiently high compared to a resistance between the first and second electrodes of the electrooptic element. As a result, a voltage drop of the second electrode with respect to the first electrode can be made small.

[3] In the voltage waveform measuring apparatus described above under [1], the second electrode may be a transparent electrode and mounted on a face of the electrooptic element opposite to a face mounted with the first electrode.

Because the transparent electrode forms the second electrode, it is possible to carry out a vertical modulation such that a direction in which an electric field is applied on the electrooptic element and a direction in which a measuring light travels are parallel.

[4] In the voltage waveform measuring apparatus described above under [1], the second electrode may be connected to the input terminal of the amplifier when detecting the low-frequency component by the amplifier, and the second electrode may be disconnected from the amplifier when detecting the high-frequency component by the polarization analyzer.

By disconnecting the second electrode from the amplifier, the wiring functions as an antenna and it is possible to prevent noise from entering via the second electrode.

[5] In the voltage waveform measuring apparatus described above under [1], the second electrode may be connected to the input terminal of the amplifier when detecting the low-frequency component by the amplifier, and the second electrode may be terminated when detecting the high-frequency component by the polarization analyzer.

In this case, it is possible to absorb a voltage generated at the second electrode when measuring the high-frequency component, so as to prevent distortion of the measured voltage waveform due to reflection.

[6] In the voltage waveform measuring apparatus described above under [1], a second light source may be provided to irradiate on the electrooptic element a light having a wavelength that induces photoconductivity of the electrooptic element.

In this case, it is possible to reduce the resistance of the electrooptic element when the resistance of the electrooptic element is too high and a desired voltage measuring accuracy of the amplifier cannot be obtained.

[7] In the voltage waveform measuring apparatus described above under [6], an optical filter or a mirror having a hole may be provided to reflect one and to transmit the other of the lights output from the first and second light sources which are arranged so that the lights from the first and second light sources are arranged coaxially and irradiated on the electrooptic element.

By directing the light from the second light source to travel in an optical path of the light from the first light source, it is possible to irradiate the light from the second light source on the electrooptic element even in a case where the light from the second light source cannot be irradiated on the electrooptic element from a periphery thereof. In addition, it is possible to prevent the light from hitting a circuit to be measured and affecting a circuit operation of the circuit.

[8] In the voltage waveform measuring apparatus described above under [1], it is possible to further provide a photoconductive element coupling the first and second electrodes on the electrooptic element, and a second light source irradiating a light having a wavelength that induces photoconductivity of the electrooptic element.

In this case, it is possible to more effectively reduce the resistance between the first and second electrodes compared to the case where only the photoconductivity of the electrooptic element itself is used.

[9] In the voltage waveform measuring apparatus described above under [1], a resistor element may be provided to couple the first and second electrodes on the electrooptic element.

If the resistance of the electrooptic element is too high, it is possible in this case to simply set the resistance between the first and second electrodes to a predetermined value by the resistor element provided between the first and second electrodes.

[10] In the voltage waveform measuring apparatus described above under [9], it is possible to further provide a resistance element having one end coupled to the second electrode and the other end coupled to ground. For example, a high-resistance element may be used as the resistance element.

In this case, it is possible to accurately determine an average voltage of the first electrode from the output voltage of the amplifier by use of the resistances of the resistor element and the resistance element.

[11] In the voltage waveform measuring apparatus described above under [1], a conductor element may be provided along a wiring which connects the second electrode and the amplifier. For example, a potential of this conductor element is the same as an output potential of the amplifier.

In this case, it is possible to shield the wiring connected to the second electrode and to prevent a leak current from the wiring. Furthermore, it is possible to increase a response speed of the voltage measurement of the amplifier by cancelling the effects of a capacitance associated with the wiring. Furthermore, it is possible to prevent the measurement of the D.C. component from taking an extremely long time when the resistance of the electrooptic element is extremely high.

[12] In the voltage waveform measuring apparatus described above under [1] above, a power supply voltage of the amplifier is a sum of an output voltage of the amplifier and a predetermined voltage.

In this case, it is possible to effectively increase an input resistance of the amplifier and enlarge an input voltage range of the amplifier to exceed a rated power supply voltage.

[13] In the voltage waveform measuring apparatus described above under [1] above, a correction means may be provided to measure an output of the amplifier by applying a plurality of known voltages to the first electrode, and correcting the output of the amplifier based on a relationship of the known voltages and the output of the amplifier.

In this case, even if the insulation of the second electrode is insufficient or the resistance of the electrooptic element is too high and an error is thereby introduced in the output of the amplifier, it is possible to correct the error.

[14] In the voltage waveform measuring apparatus described above under [1] above, the voltage waveform combining processor may be provided with a relative voltage measuring means for successively obtaining and averaging relative values of a voltage at a specific reference phase in the periodic voltage waveform of the object output from the polarization analyzer and voltage values at each of N phases which are obtained by dividing 1 period into N phases, and for measuring a relative voltage from the average voltage of the reference phase, a reference phase voltage determination means for determining the voltage of the reference phase from the relative voltage of the reference phase obtained by the relative voltage measuring means and the voltage of the low-frequency component output from the amplifier, and a voltage waveform determination means for determining the voltage of an arbitrary phase and obtaining the voltage waveform of the object by adding the voltage of the reference phase to a measured value of the difference between the voltage of the arbitrary phase and the voltage of the reference phase.

In this case, by carrying out a base line sampling in the relative voltage measuring means, it is possible to eliminate the effects of the drift component which has a slow change with respect to time and obtain the relative voltage of the reference phase. In addition, it is possible to determine the reference phase voltage, which is eliminated of the drift component, from the relative voltage of the reference phase and the voltage of the low-frequency component. Furthermore, it is possible to determine the voltage of the arbitrary phase based on the base line sampling of the voltage difference between the voltage of the arbitrary phase and the voltage of the reference phase.

[15] In the voltage waveform measuring apparatus described above under [14] above, it is possible to use as the reference phase a plurality of phases within 1 period, and to use an average voltage of these phases.

In this case, it is possible to reduce the possibility of the voltage measurement error from becoming large due to a timing jitter caused by a particularly sharp slope of the waveform at the selected reference phase. In addition, the measurement can be made within a short time with a high accuracy by measuring the voltage of the plurality of reference phases during 1 period.

Of course, in place of a multi-sampling described above wherein a plurality of reference phases within 1 period are sampled, it is possible to employ a single sampling wherein a reference phase is sampled within 1 period and such a sampling repeated for a plurality of periods with respect to a plurality of reference phases.

[16] In the voltage waveform measuring apparatus described above under [14] or [15] above, the reference phase may be selected to a portion where a rate change of the voltage waveform is less than or equal to a predetermined value or, a portion where the rate of change of the voltage waveform is a minimum within a referred phase range.

In this case, the voltage change of the reference phase becomes small even if a phase jitter exists, thereby increasing the accuracy of the measurement.

Figure 23:
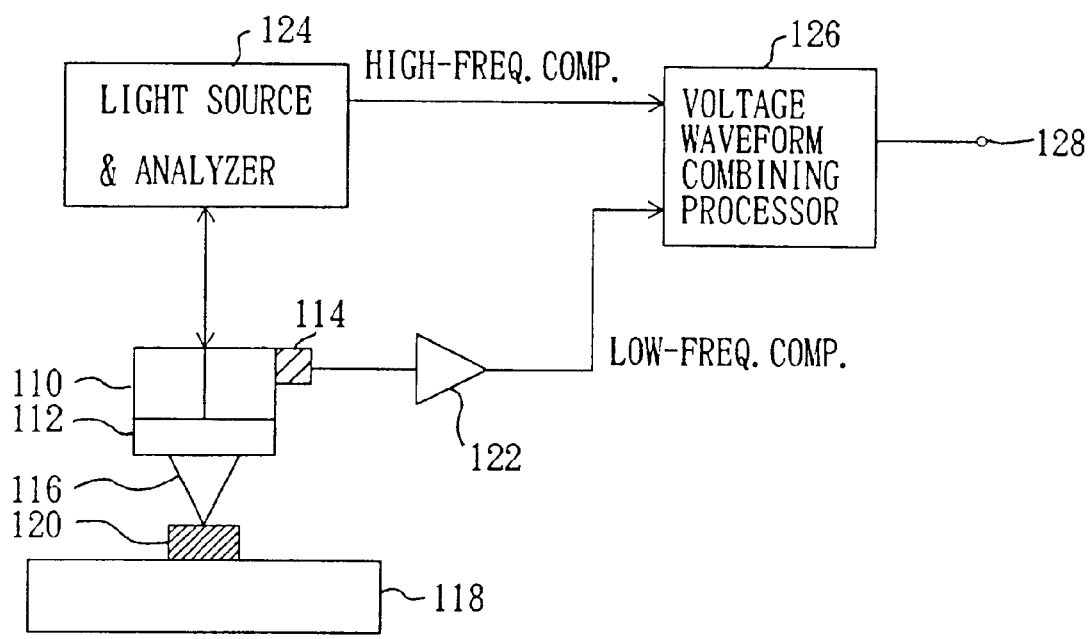
FIG. 23 is a system block diagram showing a sixth embodiment of the voltage waveform measuring apparatus according to the present invention.

Next, a description will be given of a sixth embodiment of the voltage waveform measuring apparatus according to the present invention, by referring to FIG. 23. FIG. 23 shows the sixth embodiment of the voltage waveform measuring apparatus which employs a sixth embodiment of the voltage waveform measuring method according to the present invention.

This sixth embodiment of the voltage waveform measuring apparatus and seventh through seventeenth embodiment of the voltage waveform measuring apparatus which will be described later employ the second aspect of the present invention described above.

In FIG. 23, an electrooptic element 110 is made of a crystal such as GaAs, BSO ($Bi_{12}SiO_{20}$) and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

A first electrode 112 and a second electrode 114 are mounted on the electrooptic element 110 at mutually separated positions. A probe 116 made of a conductor is connected to the first electrode 112. A tip end of this probe 116 is contacted to an internal wiring 120 of a LSI 118, so as to apply a voltage of the wiring 120 to the electrooptic element 110. The second electrode 114 is connected to an input terminal of an amplifier 122 which has a field effect transistor (FET) input using a FET as an input transistor, for example.

A light source and analyzer unit 124 includes a laser pulse light source and a polarization analyzer. The laser pulse light source emits a light pulse which irradiates the electrooptic element 110. A reflected light, that is, the light which is reflected within the electrooptic element 110, is analyzed by the polarization analyzer.

Figure 24:
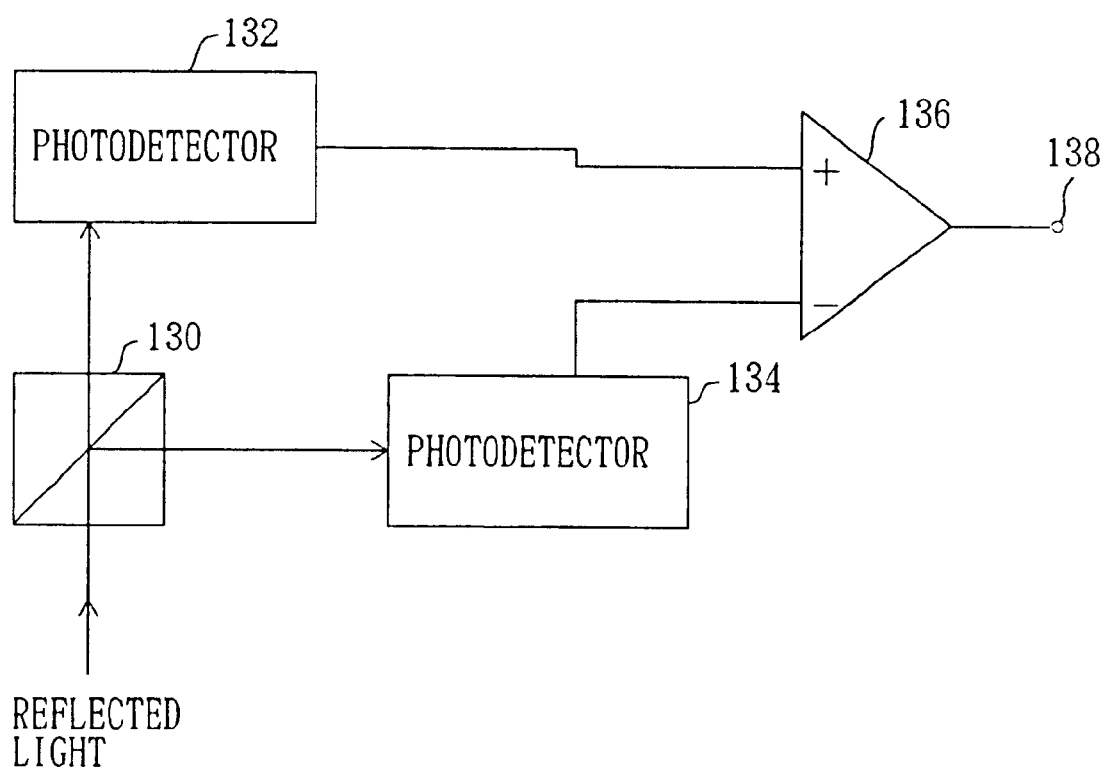
FIG. 24 is a system block diagram showing an polarization analyzer of a light source and analyzer unit.

FIG. 24 is a system block diagram showing the polarization analyzer of the light source and analyzer unit 124. As shown in FIG. 24, a beam splitter 130 splits the reflected light from the electrooptic element 110 into 2 mutually perpendicular polarization components. One polarization component is detected by a photodetector 132 and subjected to a photoelectric conversion, and the other polarization component is detected by a photodetector 134 and subjected to a photoelectric conversion. Outputs of the photodetectors 132 and 134 are supplied to a differential amplifier 136 which obtains a difference between the two outputs. A difference signal output from the differential amplifier 136 is output from an output terminal 138 as an analysis result.

A double refraction dependent on the voltage of the first electrode 112 is induced in the electrooptic element 110, thereby changing the polarization state. In this particular case, a signal having a periodic waveform, that is, a measuring waveform which is to be measured, is applied to the wiring 120 of the LSI 118, and the measurement is repeated while changing the light pulse irradiating timing with respect to the period of the signal. In addition, a high-frequency component of the measuring waveform is obtained by eliminating a drift component by appropriate known means. Such an operation may be carried out in the voltage waveform combining processor 126.

The electrooptic element 110 has a slight electrical conductivity, and a resistance between the first electrode 112 and the second electrode 114 is on the order of GΩ. An input impedance of the amplifier 122 connected to the second electrode 114 is on the order of approximately 1 TΩ to approximately 1000 TΩ, and is approximately 1000 times or more the resistance between the first and second electrodes 112 and 114 of the electrooptic element 110.

Accordingly, it is possible to obtain an average value of the voltage of the measuring waveform (measuring waveform voltage), that is, to obtain a low-frequency component or a D.C. component, by measuring an output voltage of the amplifier 122. A response speed of the amplifier 122 has a time constant described by a product of the resistance between the first and second electrodes 112 and 114 of the electrooptic element 110 and a wiring capacitance between the second electrode 114 and the amplifier 122, and is approximately 0.1 second. However, this response speed of the amplifier 122 causes no problems from the point of view of measuring the D.C. component of the measuring waveform voltage.

The high-frequency component and the D.C. component respectively output from the light source and analyzer unit 124 and the amplifier 122 are supplied to the voltage waveform combining processor 126 which carries out a process of combining the two waveforms. As a result, the measuring waveform is completely reproduced by the voltage waveform combining processor 126 and output via a terminal 128.

Figure 25:
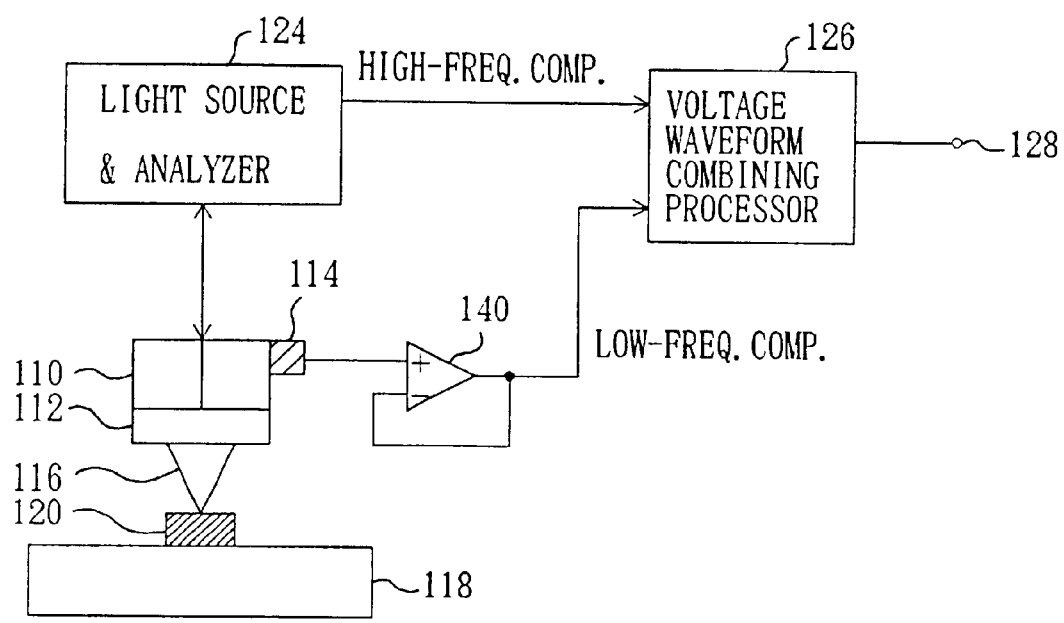
FIG. 25 is a system block diagram showing a seventh embodiment of the voltage waveform measuring apparatus according to the present invention.

FIG. 25 is a system block diagram showing a seventh embodiment of the voltage waveform measuring apparatus according to the present invention. This seventh embodiment of the voltage waveform measuring apparatus employs a seventh embodiment of the voltage waveform measuring method according to the present invention. In FIG. 25, those parts which are essentially the same as those corresponding parts in FIG. 23 are designated by the same reference numerals, and a description thereof will be omitted.

In FIG. 25, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 114 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110. The second electrode 114 is connected to a non-inverting input terminal of an operational amplifier 140 which has a FET input using a FET as an input transistor, for example. An output terminal of the operational amplifier 140 is connected to an inverting input terminal of the operational amplifier 140, so as to form a non-inverting amplifier having a gain of 1. An output signal of the operational amplifier 140 is supplied to the voltage waveform combining processor 126.

When the operational amplifier 140 is used, an input bias current of the operational amplifier 140 flows to the electrooptic element 110 and an offset voltage is generated. However, the bias current is on the order of approximately 0.1 pA or less in the case of an operational amplifier having the FET input with a low or ultra low input bias current. Accordingly, if the resistance of the electrooptic element 110 is 1 GΩ, the offset voltage becomes 0.1 mV which is extremely small and negligible. In FIG. 25, the operational amplifier 140 is used as a voltage-follower having the gain of 1, however, it is possible to increase the sensitivity by setting the gain greater than 1.

Figure 26:
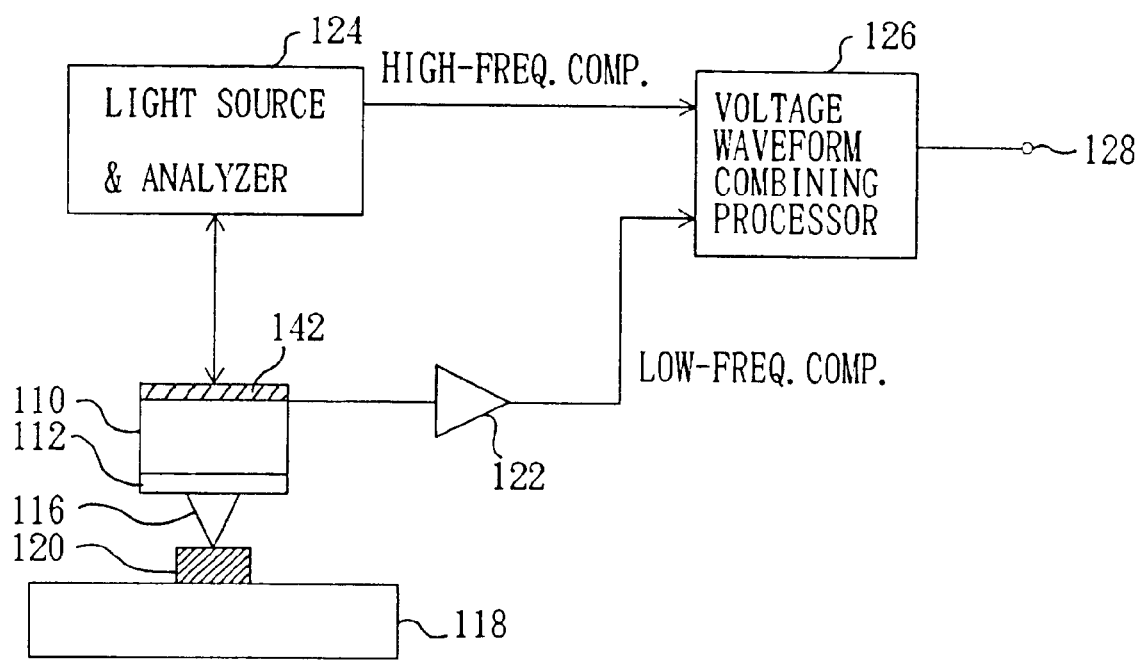
FIG. 26 is a system block diagram showing an eighth embodiment of the voltage waveform measuring apparatus according to the present invention.

FIG. 26 is a system block diagram showing an eighth embodiment of the voltage waveform measuring apparatus according to the present invention. This eighth embodiment of the voltage waveform measuring apparatus employs an eighth embodiment of the voltage waveform measuring method according to the present invention. In FIG. 26, those parts which are essentially the same as those corresponding parts in FIG. 23 are designated by the same reference numerals, and a description thereof will be omitted.

In FIG. 26, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and a second electrode 142 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110.

The second electrode 142 is made up of a transparent electrode. This second electrode 142 is provided on a face of the electrooptic element 110 irradiated by the light pulse from the laser pulse light source of the light source and analyzer unit 124, opposite to a face of the electrooptic element 110 provided with the first electrode 112. The second electrode 142 is connected to the input terminal of the amplifier 122 having a high input impedance.

Accordingly, the light pulse from the laser pulse light source reaches the electrooptic element 110 via the second electrode 142 which is transparent. A reflected light, that is, the light reflected within the electrooptic element 110, is directed towards the polarization analyzer of the light source and analyzer unit 124 via the second electrode 142. For this reason, this embodiment is suited for a case where a vertical modulation is carried out wherein, a direction in which an electric field is applied on the electrooptic element 110 and a direction in which the light pulse travels become parallel. In this vertical modulation, the polarization angle of the light pulse is modulated by the voltage.

Figure 27:
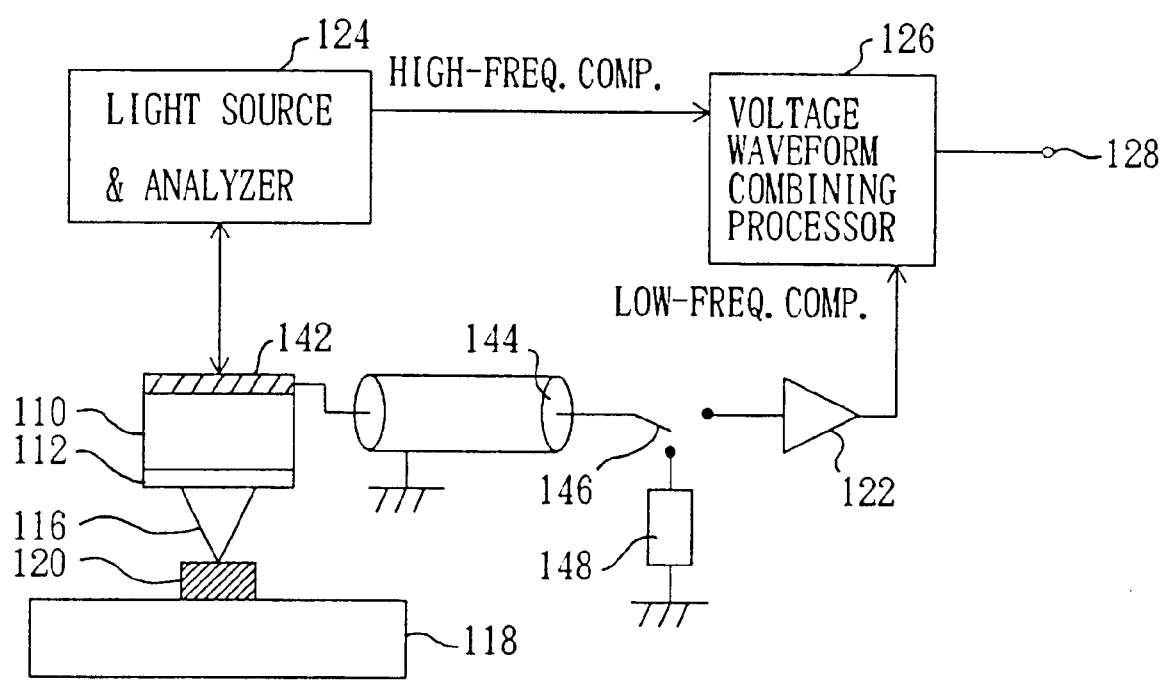
FIG. 27 is a system block diagram showing a ninth embodiment of the voltage waveform measuring apparatus according to the present invention.

FIG. 27 is a system block diagram showing a ninth embodiment of the voltage waveform measuring apparatus according to the present invention. This ninth embodiment of the voltage waveform measuring apparatus employs a ninth embodiment of the voltage waveform measuring method according to the present invention. In FIG. 27, those parts which are essentially the same as those corresponding parts in FIG. 26 are designated by the same reference numerals, and a description thereof will be omitted.

In FIG. 27, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and a second electrode 142 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110.

The second electrode 142 is made up of a transparent electrode. This second electrode 142 is provided on the face of the electrooptic element 110 irradiated by the light pulse from the laser pulse light source of the light source and analyzer unit 124, opposite to the face of the electrooptic element 110 provided with the first electrode 112.

The second electrode 142 is connected to one end of an inner conductor of a coaxial cable 144 having an outer conductor which is grounded. The other end of the inner conductor of the coaxial cable 144 is connected to a movable contact of a switch 146. A first fixed contact point of the switch 146 is grounded via a terminating element 148, and a second fixed contact point of the switch 146 is connected to the input terminal of the amplifier 122. The movable contact of the switch 146 is connected to the first fixed contact point when measuring the high-frequency component, and is connected to the second fixed contact point when measuring the low-frequency component.

In this case, by providing the switch 146 in a vicinity of the second electrode 142, it is possible to disconnect the wiring to the amplifier 122 when measuring the high-frequency component by the electrooptic effect, and to prevent noise from entering from this wiring so that the voltage of the second electrode 142 will not vary due to the noise and affect the measurement of the high-frequency component by the electrooptic effect.

In addition, by grounding the second electrode 142 which is disconnected from the amplifier 122 by the switch 146, the second electrode 142 is maintained to a zero potential. As a result, it is possible to increase the electric field intensity applied on the electrooptic element 110 and improve the sensitivity when measuring the high-frequency component by the electrooptic effect.

Furthermore, when measuring the high-frequency component by the electrooptic effect, a portion of the voltage signal on the first electrode 112 is induced at the second electrode 142 due to the capacitive coupling between the first and second electrodes 112 and 142, and this portion of the voltage signal propagates through the coaxial cable 144. However, by terminating the coaxial cable 144 by the terminating element 148 via the switch 146, it is possible to prevent a reflection of this portion of the voltage signal from returning to the second electrode 142 and affecting the measurement of the high-frequency component. If the coaxial cable 144 were not terminated by the terminating element 148, such a reflection would occur at the amplifier 122 having the high input impedance, a disconnected part of the coaxial cable 146 which is disconnected by a switch or, a grounded part of the coaxial cable 146 which is grounded.

Figure 28:
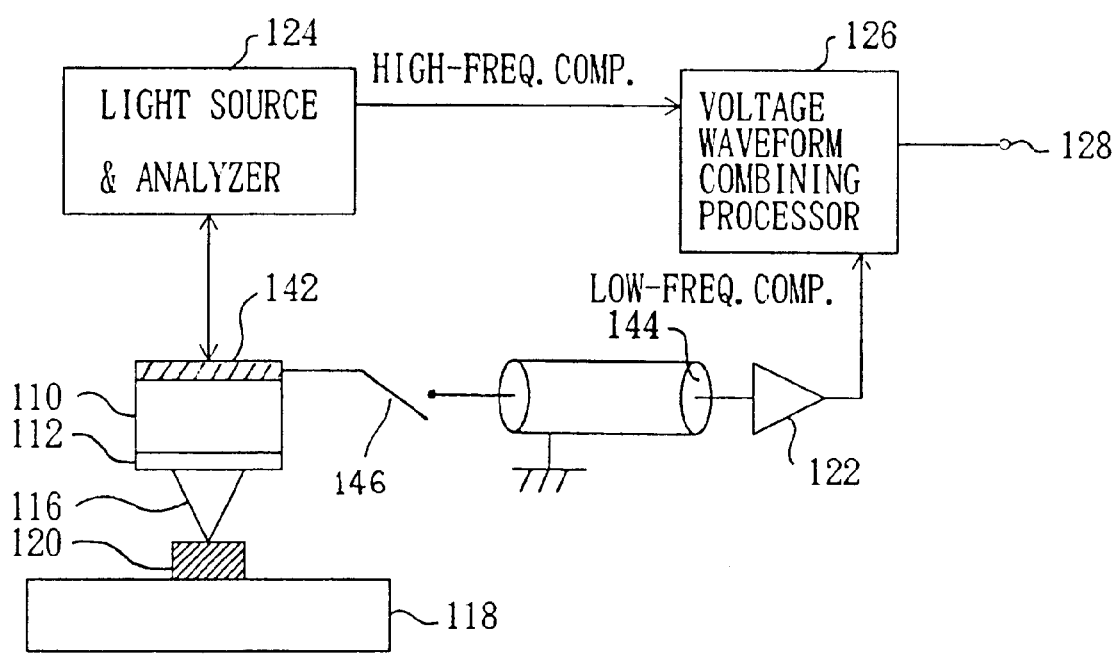
FIG. 28 is a system block diagram showing a modification of the ninth embodiment of the voltage waveform measuring apparatus according to the present invention.

FIG. 28 is a system block diagram showing a modification of the ninth embodiment of the voltage waveform measuring apparatus according to the present invention. This modification of the ninth embodiment of the voltage waveform measuring apparatus employs a modification of the ninth embodiment of the voltage waveform measuring method according to the present invention. In FIG. 28, those parts which are essentially the same as those corresponding parts in FIG. 27 are designated by the same reference numerals, and a description thereof will be omitted.

In FIG. 28, the first fixed contact point of the switch 146 is open, and the switch 146 simply disconnects the second electrode 142 from the coaxial cable 144 and the amplifier 122 when measuring the high-frequency component. In this case, it is also possible to prevent the wiring from functioning as an antenna and to prevent noise from entering the second electrode 142 by disconnecting the second electrode 142 from the coaxial cable 144 and the amplifier 122.

Figure 29:
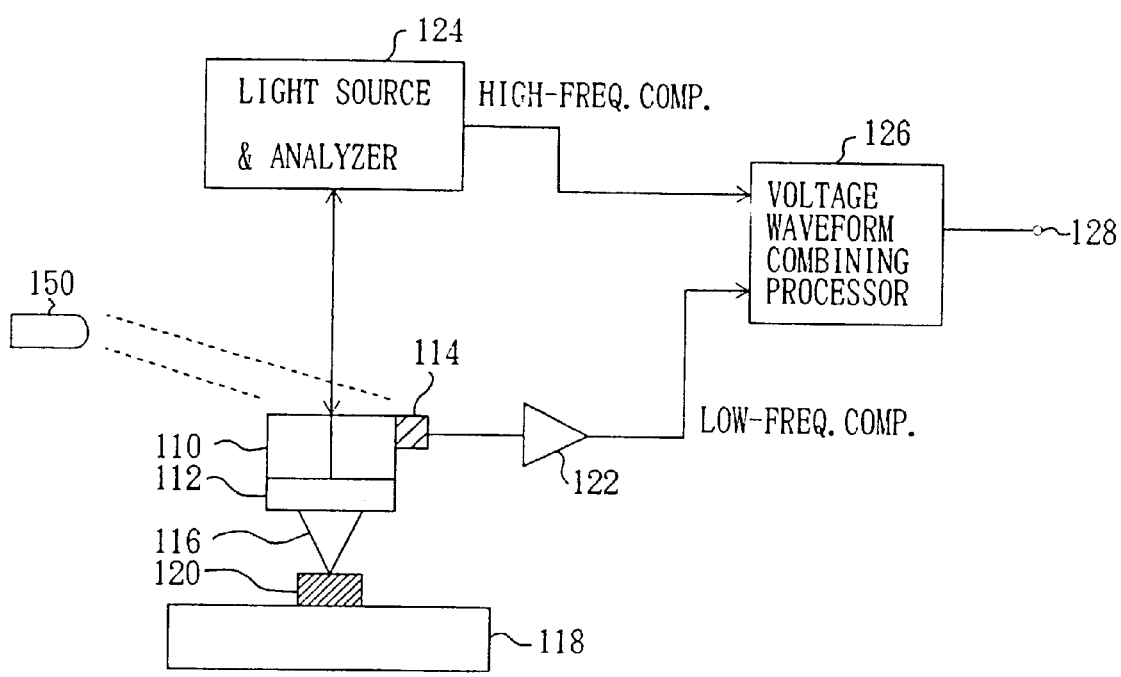
FIG. 29 is a system block diagram showing a tenth embodiment of the voltage waveform measuring apparatus according to the present invention.

FIG. 29 is a system block diagram showing a tenth embodiment of the voltage waveform measuring apparatus according to the present invention. This tenth embodiment of the voltage waveform measuring apparatus employs a tenth embodiment of the voltage waveform measuring method according to the present invention. In FIG. 29, those parts which are essentially the same as those corresponding parts in FIG. 23 are designated by the same reference numerals, and a description thereof will be omitted.

In FIG. 29, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 114 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110. The second electrode 114 is connected to the input terminal of the amplifier 122 which has a FET input using a FET as an input transistor, for example, and has a high input impedance.

A second light source 150 is provided in a vicinity of a face of the electrooptic element 110 irradiated with the light pulse from the laser pulse light source of the light source and analyzer unit 124. This second light source 150 irradiates on the electrooptic element 110 a light having a waveform which induces photoconductivity of the electrooptic element 110.

For example, the electrooptic element 110 made of GaAs, BSO, ZnTe or the like is photoconductive. For this reason, if the resistance of the electrooptic element 110 is too high and the desired voltage measuring accuracy of the amplifier 122 cannot be obtained with respect to the low-frequency component or, the response speed of the measurement of the amplifier 122 is to be increased, the second light source 150 can be turned ON to effectively reduce the resistance of the electrooptic element 110.

Figure 30:
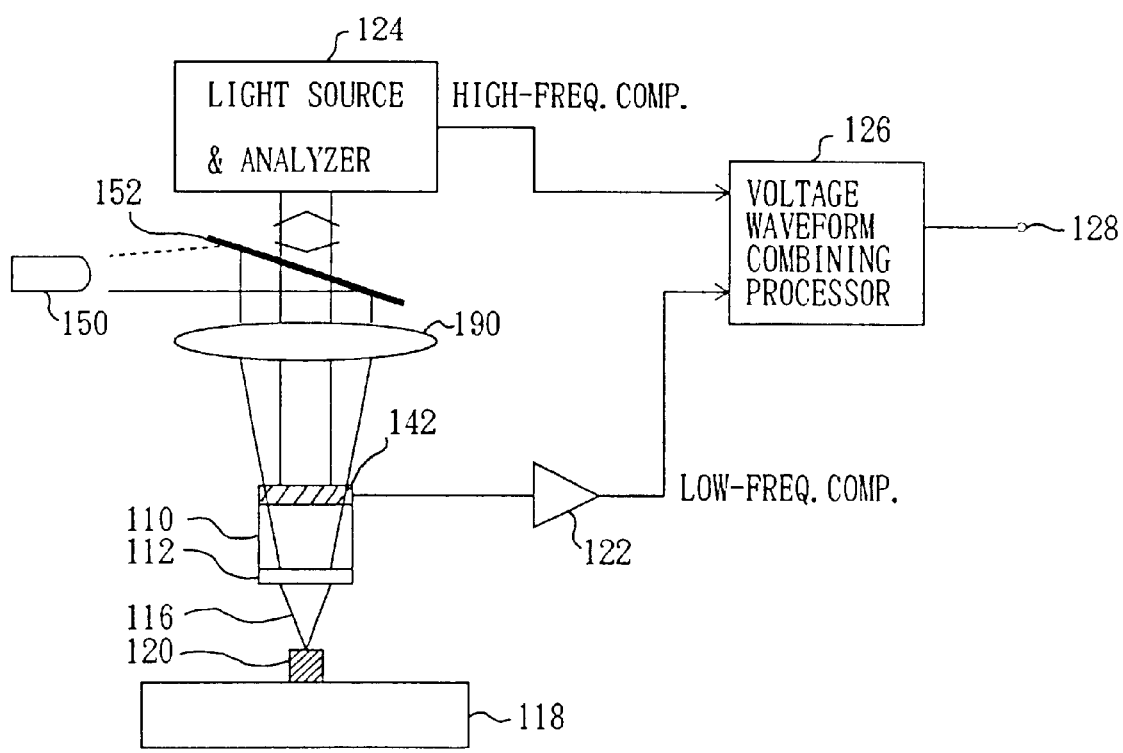
FIG. 30 is a system block diagram showing an eleventh embodiment of the voltage waveform measuring apparatus according to the present invention.

FIG. 30 is a system block diagram showing an eleventh embodiment of the voltage waveform measuring apparatus according to the present invention. This eleventh embodiment of the voltage waveform measuring apparatus employs an eleventh embodiment of the voltage waveform measuring method according to the present invention. In FIG. 30, those parts which are essentially the same as those corresponding parts in FIG. 26 are designated by the same reference numerals, and a description thereof will be omitted.

In FIG. 30, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 142 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110.

The second electrode 142 is made up of a transparent electrode. This second electrode 142 is provided on the face of the electrooptic element 110 irradiated by the light pulse from the laser pulse light source of the light source and analyzer unit 124, opposite to the face of the electrooptic element 110 provided with the first electrode 112. The second electrode 142 is connected to the amplifier 122 having a high input impedance.

A second light source 150 emits a light having a wavelength that induces photoconductivity of the electrooptic element 110 when irradiated on the electrooptic element 110. An optical filter 152 is arranged obliquely to an optical path which is provided to measure the electrooptic effect. This optical filter 152 reflects the light having the wavelength which induces photoconductivity of the electrooptic element 110, and transmits the light having the wavelength that is used to measure the electrooptic effect. Hence, the lights from the laser pulse light source of the light source and analyzer 124 and the second light source 150 are irradiated on the electrooptic element 110 via a lens 190 and the second electrode 142.

Therefore, even in a case where the electrooptic element 110 is supported by a narrow tube and the light for measuring the electrooptic effect is passed through this narrow tube, and it is not possible to irradiate light from the periphery of the electrooptic element 110, the above described arrangement of this embodiment enables the light for inducing the photoconductivity to be irradiated on the electrooptic element 110.

In addition, as a modification of this embodiment, it is possible to interchange the positions of the laser pulse light source of the light source and analyzer unit 124 and the second light source 150. In this case, an optical filter which transmits the light for inducing the photoconductivity of the electrooptic element 110 and reflects the light for measuring the electrooptic effect is used as the optical filter 150.

Figure 31:
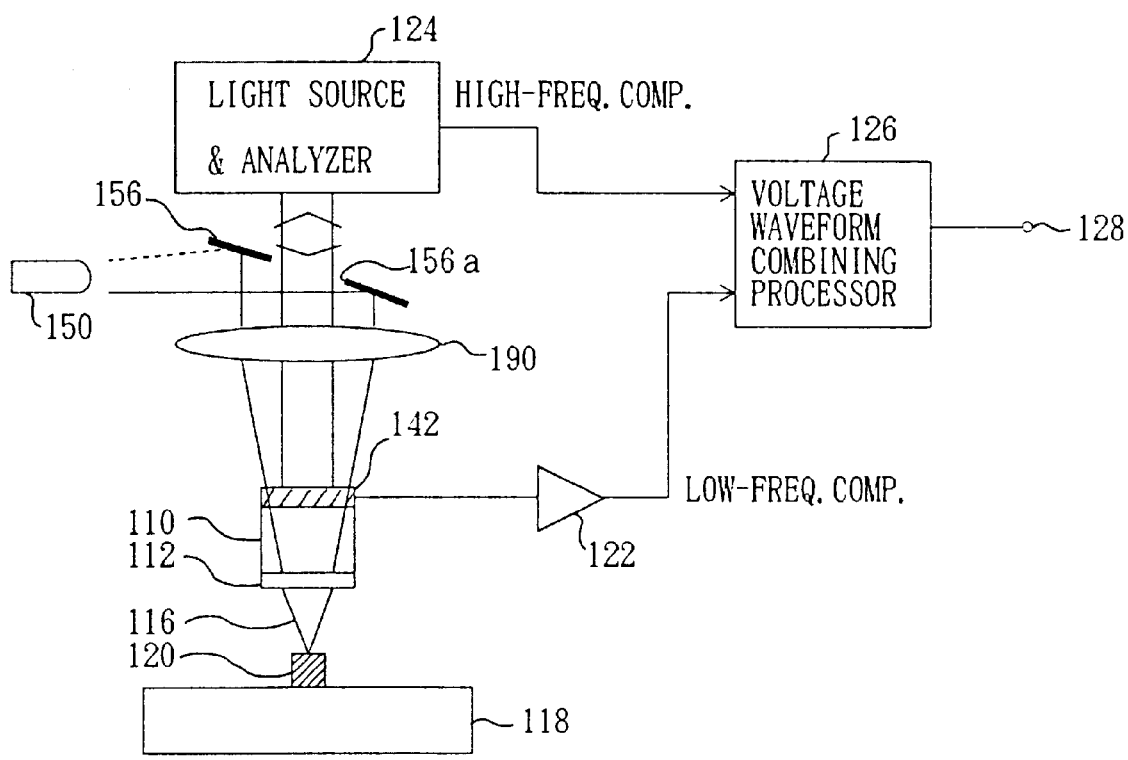
FIG. 31 is a system block diagram showing an twelfth embodiment of the voltage waveform measuring apparatus according to the present invention.

FIG. 31 is a system block diagram showing a twelfth embodiment of the voltage waveform measuring apparatus according to the present invention. This twelfth embodiment of the voltage waveform measuring apparatus employs a twelfth embodiment of the voltage waveform measuring method according to the present invention. In FIG. 31, those parts which are essentially the same as those corresponding parts in FIG. 30 are designated by the same reference numerals, and a description thereof will be omitted.

In FIG. 31, a mirror 156 having a hole 156a is used in place of the optical filter 150 shown in FIG. 30. The light for measuring the electrooptic effect passes through the hole 156a provided at a central portion of the mirror 156, and is irradiated on the electrooptic element 110 via the lens 190 and the second electrode 142. On the other hand, the light for inducing the photoconductivity of the electrooptic element 110 is reflected by the mirror 156, and is irradiated on the electrooptic element 110 via the lens 190 and the second electrode 142.

The use of the optical filter 150 may attenuate the light for measuring the electrooptic effect. However, such an attenuation will not occur by using the mirror 156 having the hole 156a for passing the light for measuring the electrooptic effect.

Figure 32:
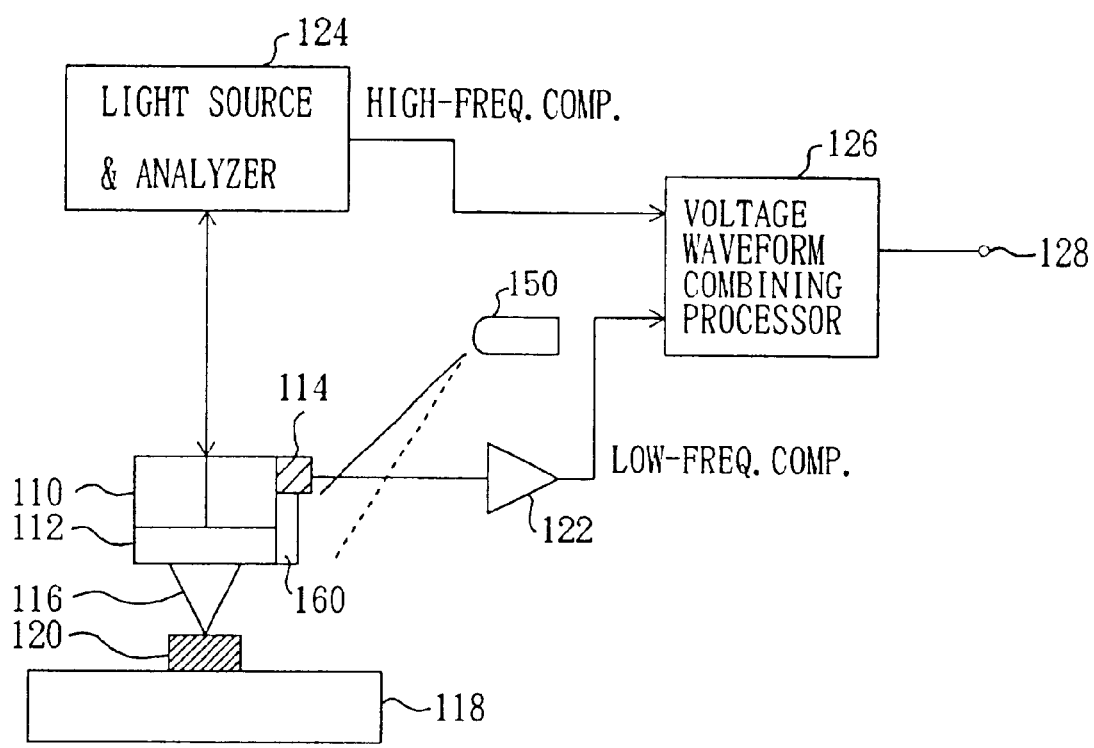
FIG. 32 is a system block diagram showing an thirteenth embodiment of the voltage waveform measuring apparatus according to the present invention.

FIG. 32 is a system block diagram showing a thirteenth embodiment of the voltage waveform measuring apparatus according to the present invention. This thirteenth embodiment of the voltage waveform measuring apparatus employs a thirteenth embodiment of the voltage waveform measuring method according to the present invention. In FIG. 32, those parts which are essentially the same as those corresponding parts in FIG. 23 are designated by the same reference numerals, and a description thereof will be omitted.

In FIG. 32, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 114 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110. The second electrode 114 is connected to the amplifier 122 which has a FET input using a FET as an input transistor, for example, and has a high input impedance.

A photoconductor element 160 is provided between and connects the first and second electrodes 112 and 114. A second light source 150 emits a light having a wavelength which induces photoconductivity of the photoconductor element 160, and this light from the second light source 150 is irradiated on the photoconductor element 160. As a result, it is possible to reduce the resistance between the first and second electrodes 112 and 114, and more effectively reduce the resistance compared to the case where the photoconductivity of the electrooptic element 110 itself is utilized.

Figure 33:
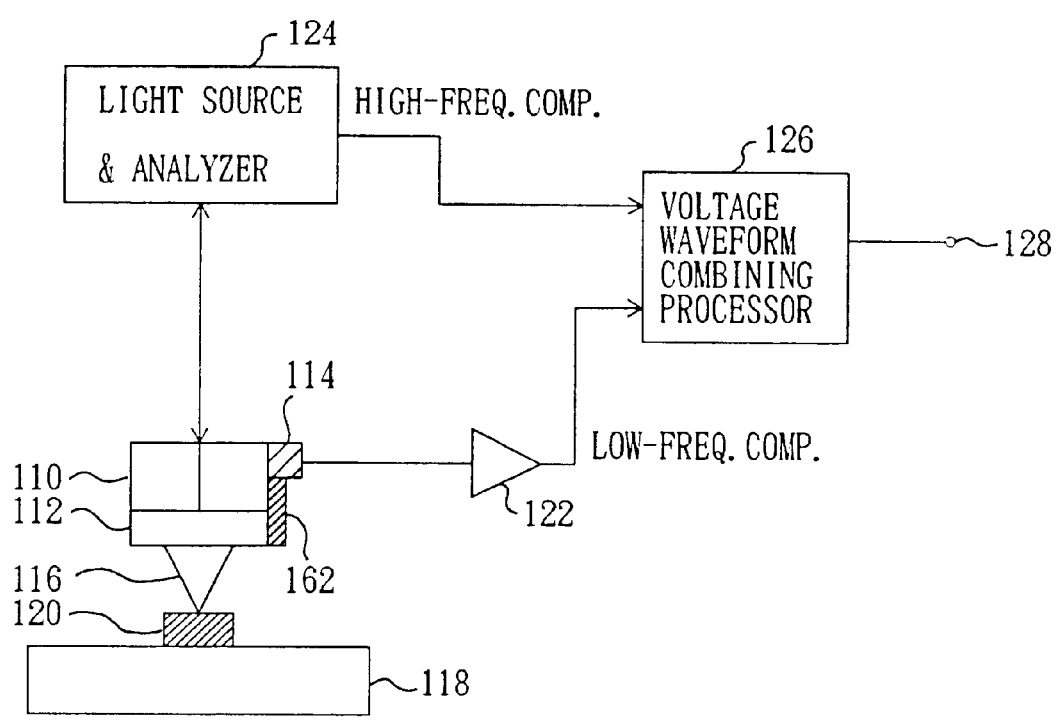
FIG. 33 is a system block diagram showing an fourteenth embodiment of the voltage waveform measuring apparatus according to the present invention.

FIG. 33 is a system block diagram showing a fourteenth embodiment of the voltage waveform measuring apparatus according to the present invention. This fourteenth embodiment of the voltage waveform measuring apparatus employs a fourteenth embodiment of the voltage waveform measuring method according to the present invention. In FIG. 33, those parts which are essentially the same as those corresponding parts in FIG. 23 are designated by the same reference numerals, and a description thereof will be omitted.

In FIG. 33, the electrooptic element 110 is made of a crystal such as GaAs, BSO and ZnTe having electrooptic effect and. slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 114 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110. The second electrode 114 is connected to the amplifier 122 which has a FET input using a FET as an input transistor, for example, and has a high input impedance.

A resistance element 162 is provided between and connects the first and second electrodes 112 and 114 of the electrooptic element 110. For this reason, if the resistance of the electrooptic element 110 is too high and the desired voltage measuring accuracy of the amplifier 122 cannot be obtained with respect to the low-frequency component or, the response speed of the measurement of the amplifier 122 is to be increased, it is effective to provide the resistance element 162. For example, a high-resistance element may be used as the resistor element 162.

Figure 34:
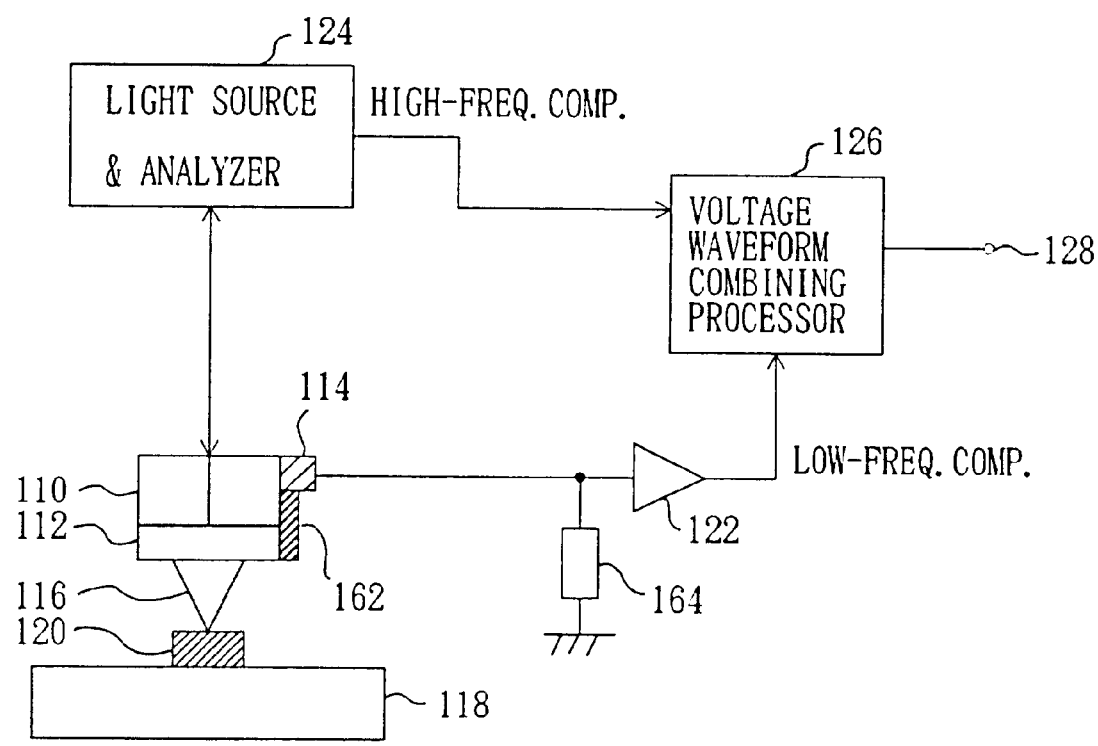
FIG. 34 is a system block diagram showing an fifteenth embodiment of the voltage waveform measuring apparatus according to the present invention.

FIG. 34 is a system block diagram showing a fifteenth embodiment of the voltage waveform measuring apparatus according to the present invention. This fifteenth embodiment of the voltage waveform measuring apparatus employs a fifteenth embodiment of the voltage waveform measuring method according to the present invention. In FIG. 34, those parts which are essentially the same as those corresponding parts in FIG. 33 are designated by the same reference numerals, and a description thereof will be omitted.

In FIG. 34, a resistance element 164 is further provided. One end of this resistance element 164 is connected to the input terminal of the amplifier 122, and the other end of this resistance element 164 is grounded. If the resistance of the resistance element 162 is denoted by R1, the resistance of the resistance element 164 is denoted by R2, and the output voltage of the amplifier 122 is denoted by $V_0$, a voltage $v_i$ of the first electrode 112 can be described by the following formula.

$$V_i = V_0 \cdot (R1+R2)/R2$$

Therefore, it is possible to accurately detect the voltage $V_0$ of the first electrode 112. For example, a high-resistance element may be used as the resistance element 164.

Figure 35:
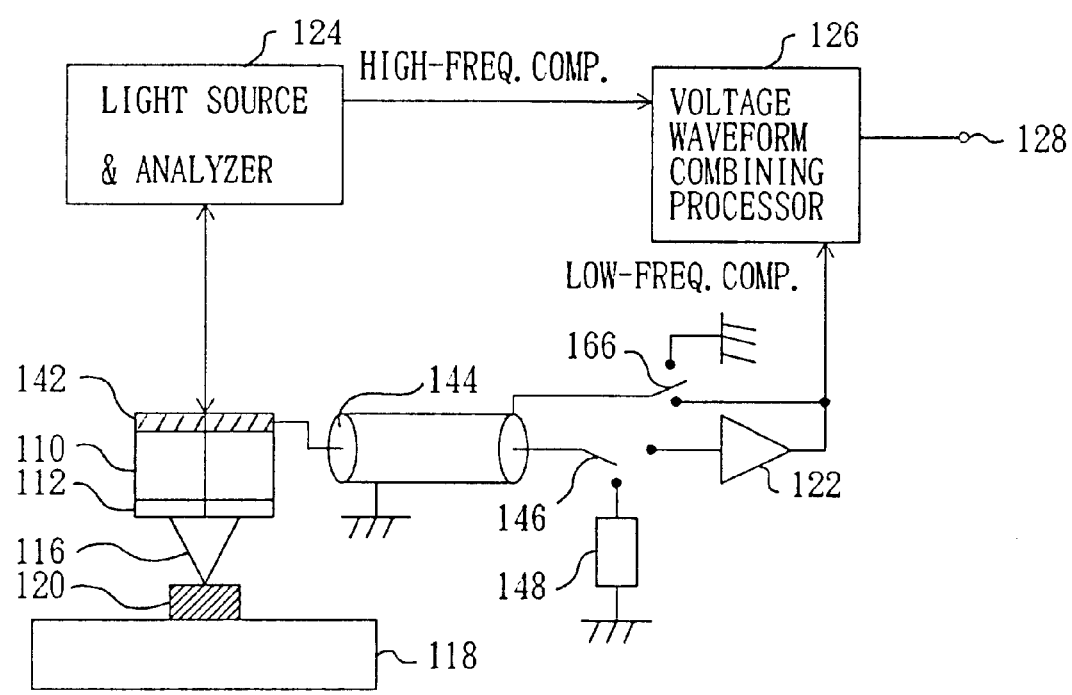
FIG. 35 is a system block diagram showing an sixteenth embodiment of the voltage waveform measuring apparatus according to the present invention.

FIG. 35 is a system block diagram showing a sixteenth embodiment of the voltage waveform measuring apparatus according to the present invention. This sixteenth embodiment of the voltage waveform measuring apparatus employs a sixteenth embodiment of the voltage waveform measuring method according to the present invention. In FIG. 35, those parts which are essentially the same as those corresponding parts in FIG. 27 are designated by the same reference numerals, and a description thereof will be omitted.

In FIG. 35, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 142 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110.

The second electrode 142 is made up of a transparent electrode. This second electrode 142 is provided on the face of the electrooptic element 110 irradiated by the light pulse from the laser pulse light source of the light source and analyzer unit 124, opposite to the face of the electrooptic element 110 provided with the first electrode 112.

The second electrode 142 is connected to one end of the inner conductor of the coaxial cable 144 having the outer conductor which is grounded. The other end of the inner conductor of the coaxial cable 144 is connected to the movable contact of the switch 146. The first fixed contact point of the switch 146 is grounded via the terminating element 148, and the second fixed contact point of the switch 146 is connected to the input terminal of the amplifier 122.

In addition, the outer conductor of the coaxial cable 144 is connected to a movable contact of a switch 166. A first fixed contact point of the switch 166 is grounded, and a second fixed contact point of the switch 166 is connected to the output terminal of the amplifier 122. Preferably, a ground surface surrounding the amplifier 122, portions where the switches 146 and 166 are mounted, and metal portions in the periphery of the part supporting the electrooptic element 110 are also connected to the movable contact of the switch 166.

The movable contacts of the switches 146 and 166 are connected to the respective first fixed contact points to ground the outer conductor of the coaxial cable 144 when measuring the high-frequency component. On the other hand, the movable contacts of the switches 146 and 166 are connected to the respective second fixed contact points to connect the outer conductor of the coaxial cable 144 to the output terminal of the amplifier 122 when measuring the low-frequency component.

In this case, by providing the switch 146 in a vicinity of the second electrode 142, it is possible to disconnect the wiring to the amplifier 122 when measuring the high-frequency component by the electrooptic effect, and to prevent noise from entering from this wiring so that the voltage of the second electrode 142 will not vary due to the noise and affect the measurement of the high-frequency component by the electrooptic effect.

In addition, by directly grounding the second electrode 142 which is disconnected from the amplifier 122 by the switch 146 without passing through the terminating element 148, the second electrode 142 is maintained to a zero potential. As a result, it is possible to increase the electric field intensity applied on the electrooptic element 110 and improve the sensitivity when measuring the high-frequency component by the electrooptic effect.

Furthermore, when measuring the high-frequency component by the electrooptic effect, a portion of the voltage signal on the first electrode 112 is induced at the second electrode 142 due to the capacitive coupling between the first and second electrodes 112 and 142, and this portion of the voltage signal propagates through the coaxial cable 144. However, by terminating the coaxial cable 144 by the terminating element 148 via the switch 146, it is possible to prevent a reflection of this portion of the voltage signal from returning to the second electrode 142 and affecting the measurement of the high-frequency component. If the coaxial cable 144 were not terminated by the terminating element 148, such a reflection would occur at the amplifier 122 having the high input impedance, a disconnected part of the coaxial cable 146 which is disconnected by a switch or, a grounded part of the coaxial cable 146 which is grounded.

When measuring the low-frequency component, the outer conductor of the coaxial cable 144 is connected to the output terminal of the amplifier 122 via the switch 166. As a result, it is possible to shield the inner conductor (wiring) of the coaxial cable 144 connected to the second electrode 114 and to prevent a leak current from the inner conductor. Furthermore, it is possible to increase a response speed of the voltage measurement of the amplifier 122 by cancelling the effects of a capacitance associated with the inner conductor of the coaxial cable 144 and eliminating a response delay described by a time constant which is a product of this capacitance associated with the inner conductor and the resistance between the first and second electrode 112 and 114.

Of course, it is not essential to connect to the second electrode 114 using the coaxial cable 144. Other transmission lines such as a microstrip line may be used to connect to the second electrode 114.

In addition, the switches 146 and 166 and the terminating element 148 may be omitted. In this case, the outer conductor of the coaxial cable 144 is connected to the output of the amplifier 122, and the inner conductor of the coaxial cable 144 is connected to the input of the amplifier 122.

Figure 36:
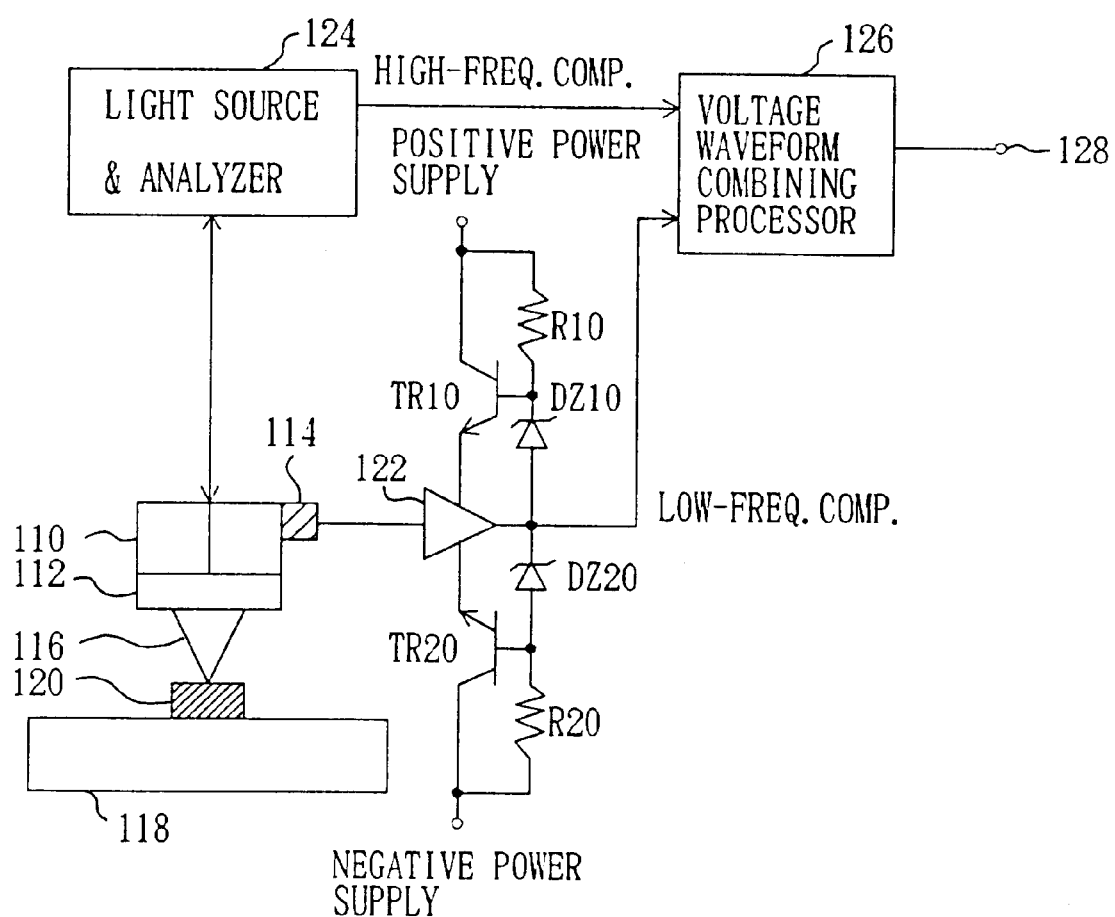
FIG. 36 is a system block diagram showing an seventeenth embodiment of the voltage waveform measuring apparatus according to the present invention.

FIG. 36 is a system block diagram showing a seventeenth embodiment of the voltage waveform measuring apparatus according to the present invention. This seventeenth embodiment of the voltage waveform measuring apparatus employs a seventeenth embodiment of the voltage waveform measuring method according to the present invention. In FIG. 36, those parts which are essentially the same as those corresponding parts in FIG. 23 are designated by the same reference numerals, and a description thereof will be omitted.

In FIG. 36, the electrooptic element 110 is made of a crystal such as GaAs, BSO and ZnTe having electrooptic effect and slight conductivity. Of course, the electrooptic element 110 may utilize the conductivity generated by impurities which are mixed when forming the crystal or, the electrooptic element 110 may positively inject impurities when forming the crystal so as to obtain the necessary conductivity.

The first electrode 112 and the second electrode 114 are mounted on the electrooptic element 110 at mutually separated positions. The probe 116 made of a conductor is connected to the first electrode 112. The tip end of this probe 116 is contacted to the internal wiring 120 of the LSI 118, so as to apply a voltage of the wiring 120 to the electrooptic element 110. The second-electrode 114 is connected to the amplifier 122 which has a FET input using a FET as an input transistor, for example, and has a high input impedance.

A positive power supply voltage of the amplifier 122 is set to a sum of the output voltage of the amplifier 122 and a predetermined voltage, by use of a Zenner diode DZ10, a transistor TR1 and a resistor R10 which are-connected as shown in FIG. 36. On the other hand, a negative power supply voltage of the amplifier 122 is set to a difference obtained by subtracting a predetermined voltage from the output voltage of the amplifier 122, by use of a Zenner diode DZ20, a transistor TR20 and a resistor R20 which are connected as shown in FIG. 36. When an operational amplifier is used for the amplifier 122, it is possible to effectively increase a differential input resistance of the amplifier 122 by supplying such positive and negative power supply voltages to the amplifier 122. In addition, it is possible to enlarge the input voltage range of the amplifier 122 to exceed the rated power supply voltage.

Figure 37:
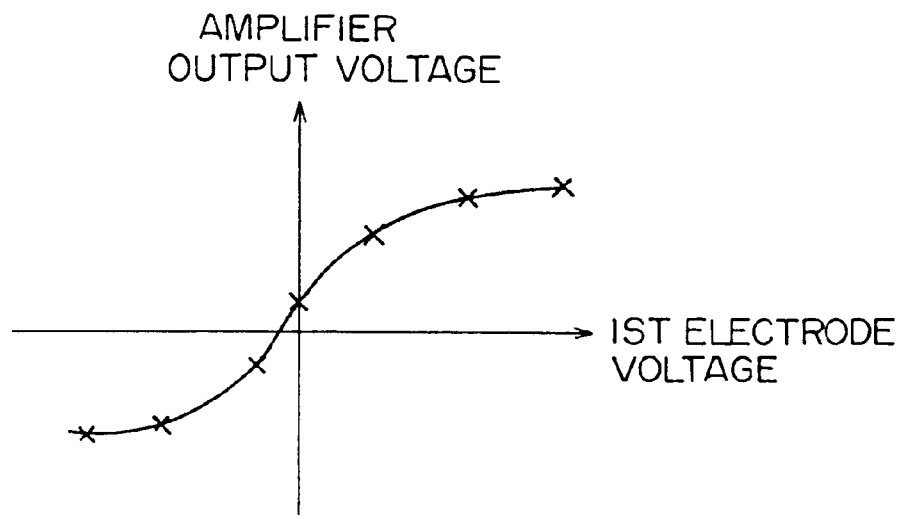
FIG. 37 is a diagram showing a map which is created by measuring an output of the amplifier by applying a plurality of known voltages to a first electrode in the seventeenth embodiment.

It is possible to apply a plurality of known voltages to the first electrode 112 and measure the output voltage of the amplifier 122 so as to create a map shown in FIG. 37. In FIG. 37, the ordinate indicates the output voltage of the amplifier 122, and the abscissa indicates the voltage of the first electrode 112. A correction means may be provided at a stage subsequent to the amplifier 122 so as to correct the measuring effect of the amplifier 122 based on the relationship shown in FIG. 37 when measuring the low-frequency component. In this case, even if the insulation of the second electrode 114 is insufficient or the resistance of the electrooptic element 110 is too high and an error is thereby introduced in the output of the amplifier 122, it is possible to correct the error by the correction means.

Next, a description will be given of a process carried out by the voltage waveform combining processor 126 of each of the embodiments described above.

Figure 38:
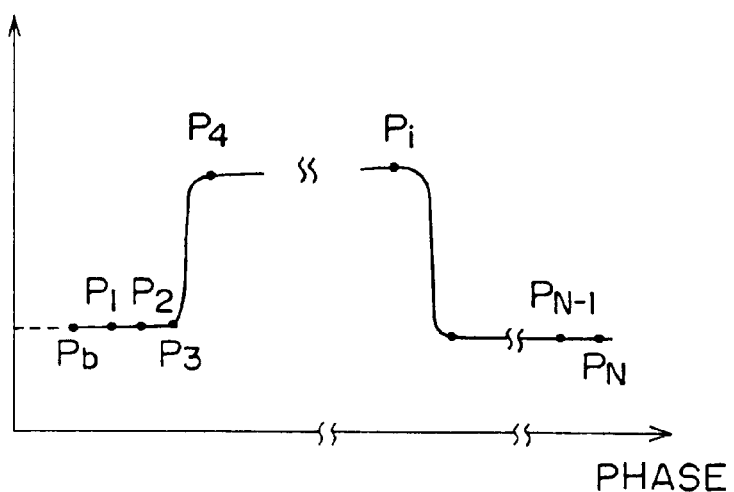
FIG. 38 is a diagram for explaining a process of a voltage waveform combining processor.

As shown in FIG. 38, 1 period of the periodic measuring waveform is divided into N phases $P_1$ through $P_N$, and a reference phase in 1 period is denoted by $P_b$. In FIG. 38, the ordinate indicates the measured voltage, and the abscissa indicates the phase. Measured voltages $E_1$ through $E_N$ and $E_b$ respectively correspond to the phases $P_1$ through $P_N$ and $P_b$. Although each measured voltage is converted from the optically measured value into the voltage applied to the electrooptic element 110 in the polarization analyzer of the light source and analyzer unit 124, the D.C. voltage level of each measured voltage is uncertain.

Figure 39:
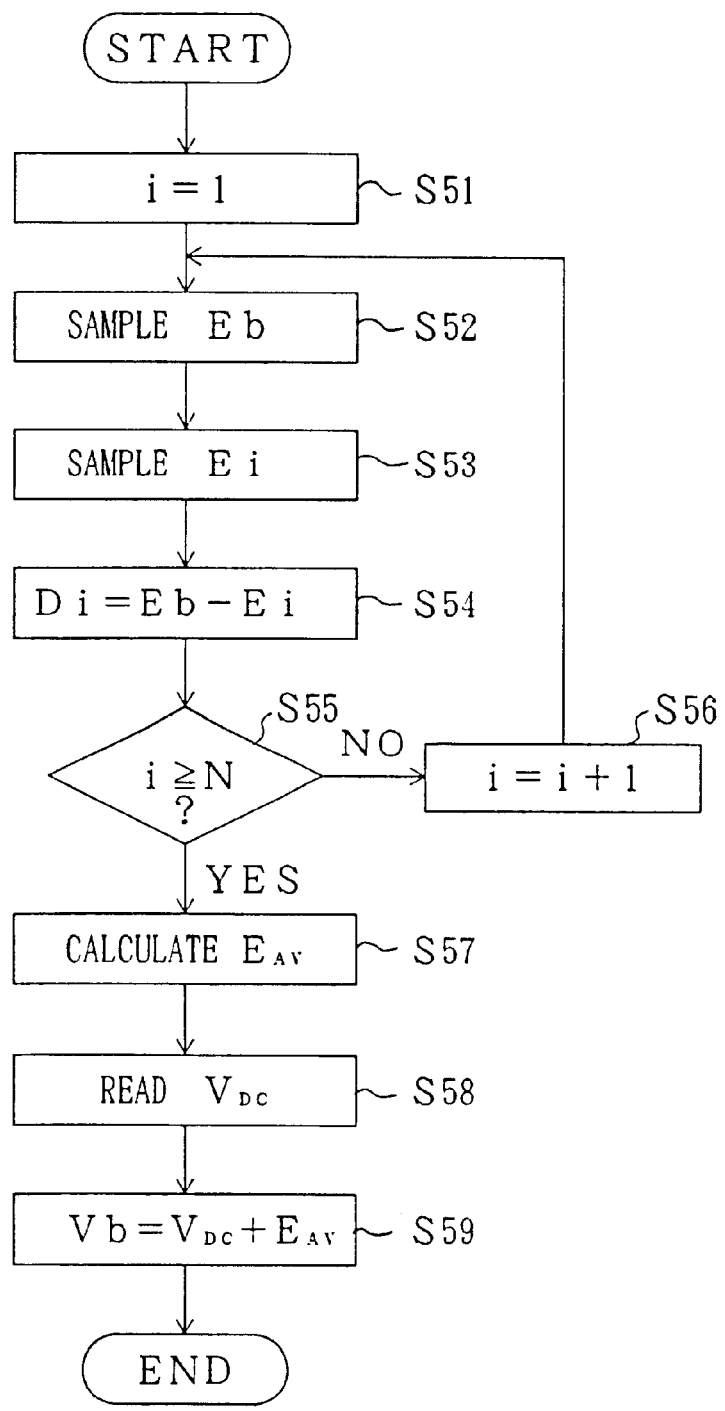
FIG. 39 is a flow chart for explaining an embodiment of a reference voltage determination process.

FIG. 39 is a flow chart for explaining an embodiment of a reference voltage determination process. In FIG. 39, a step S51 sets an initial value 1 to a variable i which indicates the phase. A step S52 samples the voltage of the reference phase $P_b$ and obtains the measured voltage $E_b$. A step S53 samples the voltage of a phase $P_i$ and obtains a measured voltage $E_i$. Since the signal-to-noise (S/N) ratio of the measured voltages $E_b$ and $E_i$ is low after only 1 sampling, an average of values obtained by a plurality of samplings is used for each of the measured voltages $E_b$ and $E_i$.

A step S54 obtains a relative value $D_i$ described by $D_i = E_b - E_i$. Then, a step S55 decides whether or not $i \geq N$, and if the decision result in the step S55 is NO, a step S56 increments i by 1 and the process returns to the step S52. Hence, in this case, the steps S52 through S56 are repeated, and the relative value $D_i$ is obtained with respect to i=1 to N. The steps S51 through S56 correspond to the base line sampling.

If the decision result in the step S55 is YES, a step S57 obtains an average value $E_{AV}$ from the following formula:

$$E_{AV} = \left(\sum_{i=1}^{N} D_i\right) / N$$

Figure 40:
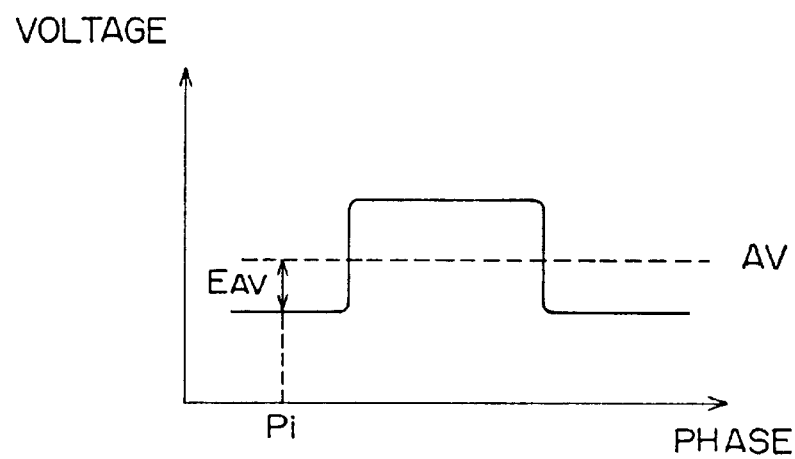
FIG. 40 is a diagram showing a voltage waveform for explaining the process shown in FIG. 38.

This average value $E_{AV}$ is the difference between the voltage of the reference phase $P_b$ and the average voltage AV of the phases $P_1$ through $P_N$, as shown in FIG. 40. In FIG. 40, the ordinate indicates the voltage, and the abscissa indicates the phase. The steps S51 through S57 correspond to an averaging means.

A step S58 reads an average voltage $V_{DC}$, that is, the measured value of the low-frequency component output from the amplifier 122. A step S59 adds the average value $E_{AV}$ to the average voltage $V_{DC}$ and obtains an actual voltage $V_b$ of the reference phase $P_b$ from the formula below, and the process ends.

$$V_b = V_{DC} + E_{AV}$$

The steps S58 and S59 correspond to a reference phase voltage determination means.

Figure 41:
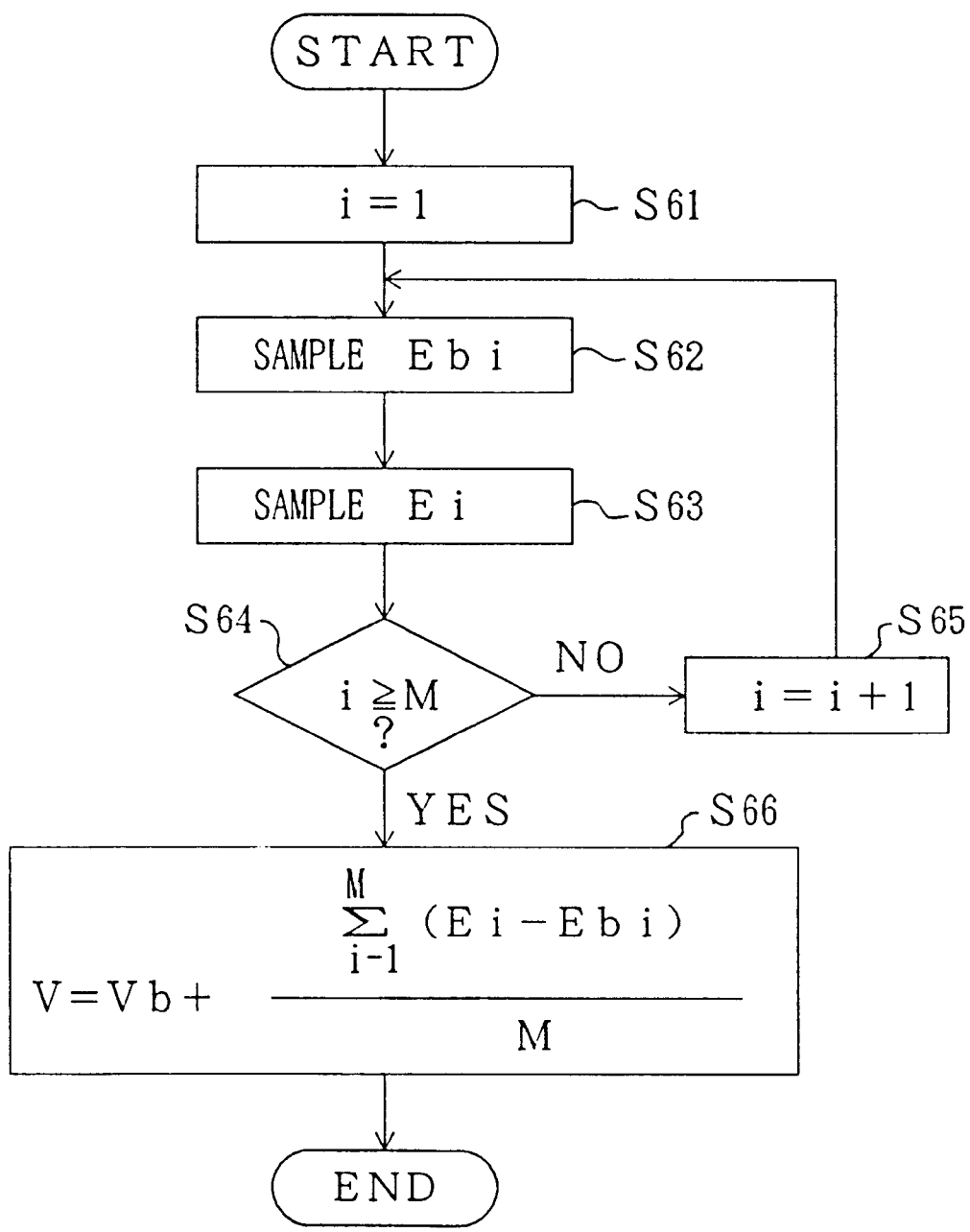
FIG. 41 is a flow chart for explaining a base line sampling.

After the actual voltage $V_b$ of the reference phase $P_b$ is obtained by the above described process, a base line sampling which will be described with reference to FIG. 41 is carried out to obtain an actual voltage V of an arbitrary phase P.

FIG. 41 is a flow chart for explaining the base line sampling corresponding to a voltage waveform determination means. In FIG. 41, a step S61 sets an initial value 1 to a variable i which counts a number of times the phase is switched. A step S62 obtains a measured voltage $E_{bi}$ by sampling the voltage of the reference phase $P_b$, and a step S63 obtains a measured voltage $E_i$ by sampling the voltage of the phase $P_i$. Since the S/N ratio of the measured voltages $E_{bi}$ and $E_i$ is low after only 1 sampling, an average of values obtained by a plurality of samplings is used for each of the measured voltages $E_{bi}$ and $E_i$. In addition, in order to prevent a drift component from becoming large while the voltages $E_{bi}$ and $E_i$ are measured, the measurement is repeated M times, where $M \geq 1$.

A step S64 decides whether or not $i \geq M$. If the decision result in the step S64 is NO, a step S65 increments i by 1, and the process returns to the step S62 to repeat the steps S62 through S65. On the other hand, if the decision result in the step S64 is YES, a step S66 obtains the actual voltage V with respect to the arbitrary phase P based on the formula below, and the process ends.

$$V = V_b + \left\{\sum_{i=1}^{M} (E_i - E_{bi})\right\} / M$$

Figure 42:
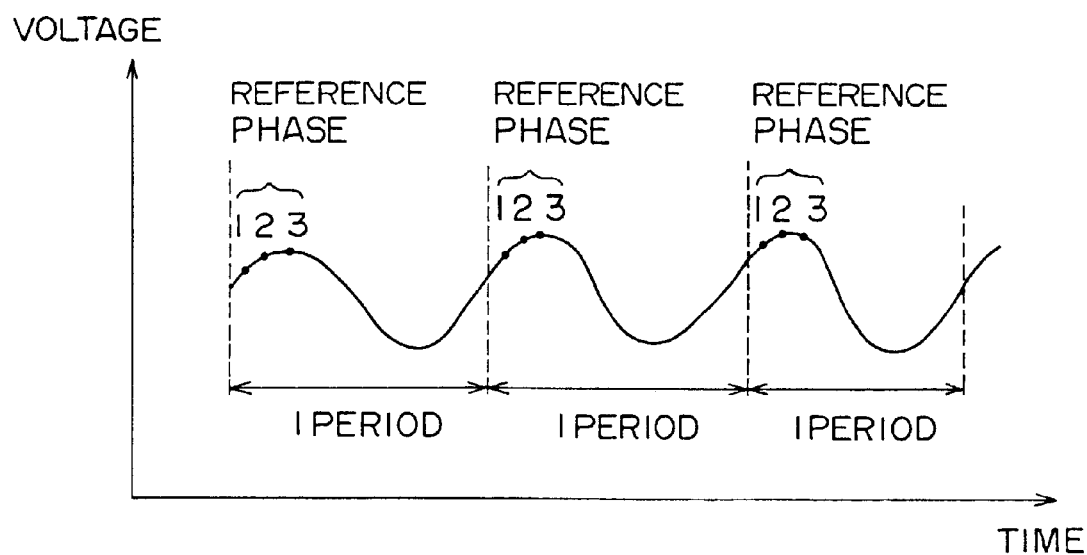
FIG. 42 is a diagram for explaining sampling of a plurality of phases within 1 period.

When making the electrooptic measurement, it is generally necessary to carry out an averaging process in order to reduce noise. Hence, when obtaining the difference between the voltage of the reference point and the average voltage, it is necessary to carry out the sampling a plurality of times in order to improve the accuracy. However, since the sampling of 1 phase can only be made once in 1 period, it takes that much longer to obtain the average as the period becomes longer. If the sampling of the electrooptic measurement is made in synchronism with the measuring signal and at intervals shorter than the period of the measuring signal, it is possible to sample a plurality of phases within 1 period of real time. For this reason, if the reference phase is set to a plurality of phases which are mutually separated by a sampling interval or an integral multiple of the sampling interval as shown in FIG. 42 and an average voltage of the plurality of reference phases is used as the reference voltage $V_b$, it becomes possible to sample a plurality of phases within 1 period, thereby improving the accuracy within a shorter time.

Of course, in place of a multi-sampling described above wherein a plurality of reference phases within 1 period are sampled, it is possible to employ a single sampling wherein a reference phase is sampled within 1 period and such a sampling repeated for a plurality of periods with respect to a plurality of reference phases.

When the reference voltage is determined, it is possible to measure the entire waveform by measuring the relative voltage with respect to the reference voltage while shifting the phase. However, because the measurement stability of the reference voltage affects the accuracy of the entire waveform measurement, it is desirable to select the reference phase to a position where a stable voltage measurement can be made. Since a phase jitter to a certain extent is unavoidable, it may be anticipated that the measurement accuracy improved if the reference phase is selected to a portion where a rate of change of the signal voltage with respect to the change in phase is small. When finding the portion where the rate of change of the signal voltage is small, it is possible to utilize the above described measurement of the difference between the voltage of the reference phase and the average voltage. The waveform of 1 period is measured as a result since the voltage of each phase $P_a$ is measured with respect to the reference voltage. When making the electrooptic measurement, it is generally necessary to carry out an averaging process in order to reduce noise, and in this process, it is sufficient as long as the desired accuracy is obtained for an average of all of the phases. It is possible that the accuracy of each phase $P_a$ is not sufficient and the detailed waveform cannot be detected, but the measured waveform in this case is still sufficient for the purposes of avoiding rising and falling edge portions of the pulse waveform.

The reference phase may be selected to a portion where a rate change of the voltage waveform is less than or equal to a predetermined value as described above or, a portion where the rate of change of the voltage waveform is a minimum within a referred phase range.

Next, a description will be given of control systems associated with the above described embodiments, by referring to FIGS. 43 through 46.

Figure 43:
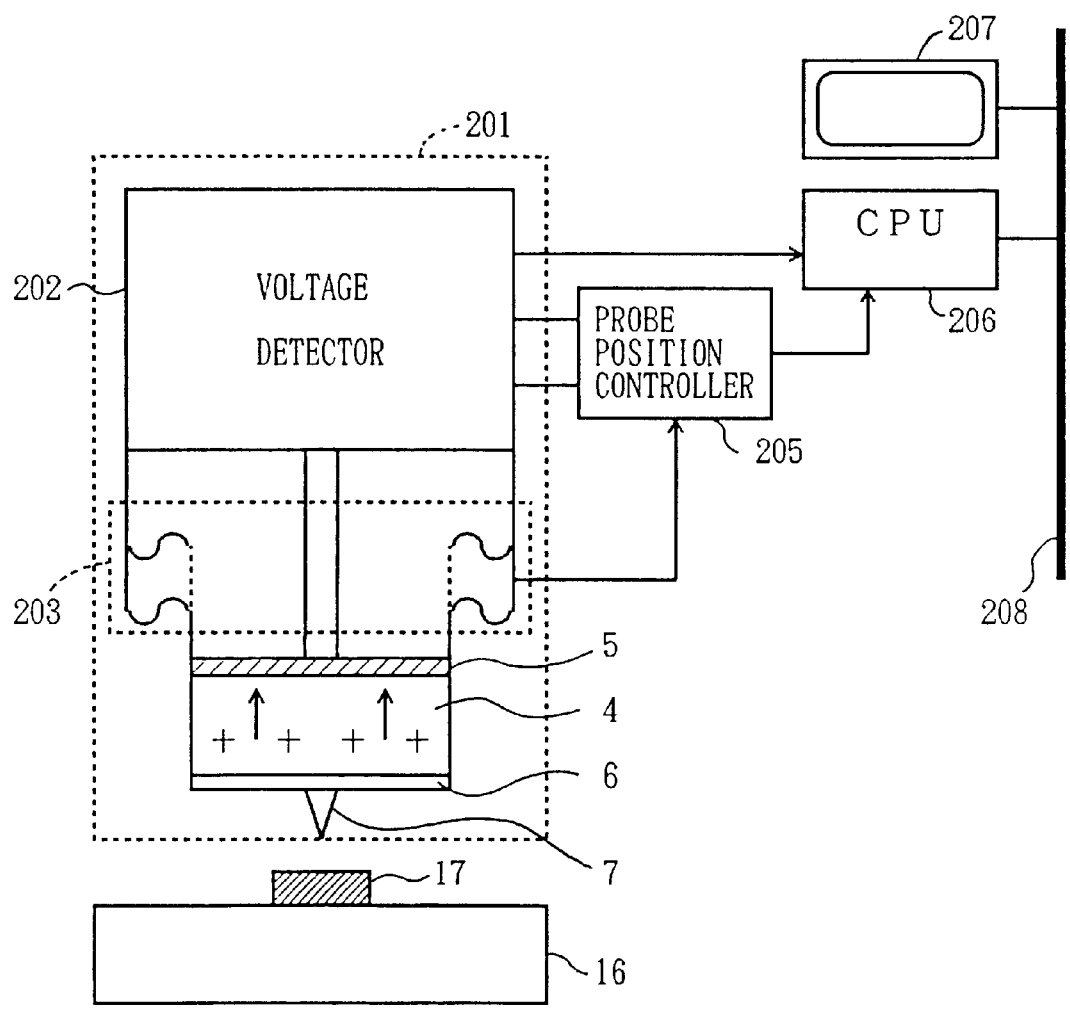
FIG. 43 is a diagram showing an embodiment of a control system which determines the voltage origin and is associated with the first embodiment of the voltage waveform measuring apparatus shown in FIG. 3.

FIG. 43 is a diagram showing an embodiment of a control system which determines the voltage origin and is associated with the first embodiment of the voltage waveform measuring apparatus shown in FIG. 3. In FIG. 43, those parts which are the same as those corresponding parts in FIG. 3 are designated by the same reference numerals, and a description thereof will be omitted.

In FIG. 43, a probe unit 201 generally includes a voltage detector 202, a force sensor 203, the electrooptic crystal 4, the transparent electrode 5, the reflecting electrode 6, and the probe 7. The voltage detector 202 includes the optical system including the elements 1, 2, 3, 11 and 12 shown in FIG. 3, and the elements 13 through 15 shown in FIG. 3. The differential output X is output from the voltage detector 202 and supplied to a CPU 206. An output of the force sensor 203 is supplied to a probe position controller 205 which controls the position of the probe 7. For the sake of convenience, it is assumed that the switch 8 and the ground line 9 are included in the probe position controller 205. An output of the probe position controller 205 is also supplied to the CPU 206. The CPU 206 and a display 207 are connected to a bus 208.

The force sensor 203 detects an extremely small force which is applied on the probe 7. The probe position controller 205 measures the force applied on the probe 7 in response to the output of the force sensor 203, and controls the position of the probe 7 so that the probe 7 scans the object to the measured, that is, the wiring layer 17 on the substrate 16 in this particular case. Hence, the probe position controller 205 can obtain surface undulation images of the object with a high resolution, and find the desired wiring layer 17 to be subjected to the voltage waveform measurement. The probe position controller 205 includes a known mechanism for lowering and raising the probe 7 in response to the output of the force sensor 203 so as to contact the wiring layer 17 and separate from the wiring layer 17.

The voltage detector 202 amplifies the differential output X which is extremely small, so as to detect the voltage applied to the electrooptic crystal 4.

When determining the voltage origin, the probe position controller 205 controls the probe 7 to a position such that the probe 7 electrically floats from the wiring layer 17. Since the switch 8 connects the transparent electrode 5 to the ground line 9 in this state and the charge accumulated in the electrooptic crystal 4 is discharged, the potential difference across the two faces of the electrooptic crystal 4 becomes zero. Hence, the voltage origin can be determined by measuring the voltage in this state. Further, the probe position controller 205 controls the probe 7 to make contact with the wiring layer 17 to make the voltage waveform measurement, and it is thus possible to accurately measure the voltage waveform with the correct voltage origin.

The CPU 206 processes the voltage data from the voltage detector 202 and the position data from the probe position controller 205, and generally controls the entire control system. In addition, if necessary, the CPU 206 displays the measured voltage waveform or the like on-the display 207.

Figure 44:
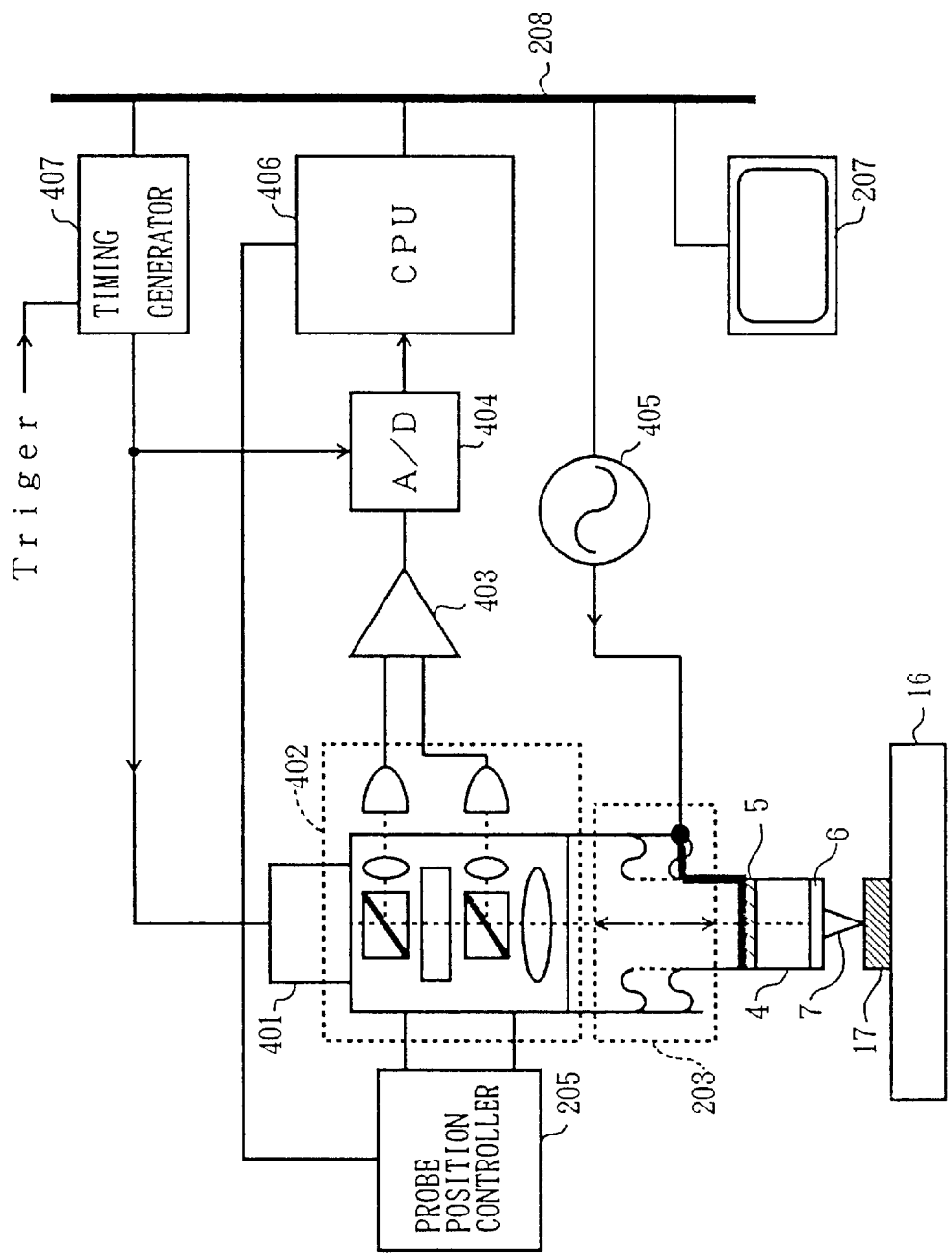
FIG. 44 is a diagram showing an embodiment of a control system which detects the electrical contact between the probe and the object and is associated with the fourth embodiment of the voltage waveform measuring apparatus.

FIG. 44 is a diagram showing an embodiment of a control system which detects the electrical contact between the probe and the object and is associated with the fourth embodiment of the voltage waveform measuring apparatus. In FIG. 44, those parts which are the same as those corresponding parts in FIGS. 3 and 43 are designated by the same reference numerals, and a description thereof will be omitted.

In FIG. 44, a light source 401 corresponds to the laser light source 1 shown in FIG. 3, and a polarization analyzer 402 corresponds a part including elements 11 through 14 shown in FIG. 3. An amplifier 403 corresponds to the amplifier 15 shown in FIG. 3, and the differential output X of the amplifier 403 is supplied to a CPU 406 through an analog-to-digital (A/D) converter 404. An A.C. voltage applying means 405 corresponds to the low-frequency oscillator 10 shown in FIG. 3. The A.C. voltage applying means 405, the CPU 406 and a timing generator 407 are connected to the bus 208. The timing generator 407 generates a pulse signal having a variable delay time, in synchronism with the A.C. voltage generated by the A.C. voltage applying means 405. The output pulse signal of the timing generator 407 controls the light pulse generation timing of the light source 401 and the A/D conversion timing of the A/D converter 404. The timing generator 407 is triggered by an external trigger signal or a trigger signal obtained from the CPU 406, for example.

The CPU 406 generally controls the entire control system, and carries out the process shown in FIG. 13 when detecting the electrical contact between the probe 7 and the wiring layer 17. In other words, the CPU 406 controls the probe position controller 205 to lower the probe 7. In addition, the CPU 406 analyzes the measured voltage waveform by reading the signal from the polarization analyzer 402 via the amplifier 403 and the A/D converter 404. The CPU 406 judges that the electrical contact between the probe 7 and the wiring layer 17 is achieved when the amplitude of the measured voltage waveform exceeds a predetermined threshold value. The CPU 306 controls the probe position controller 205 to stop lowering the probe 7 when the electrical contact is detected.

Figure 45:
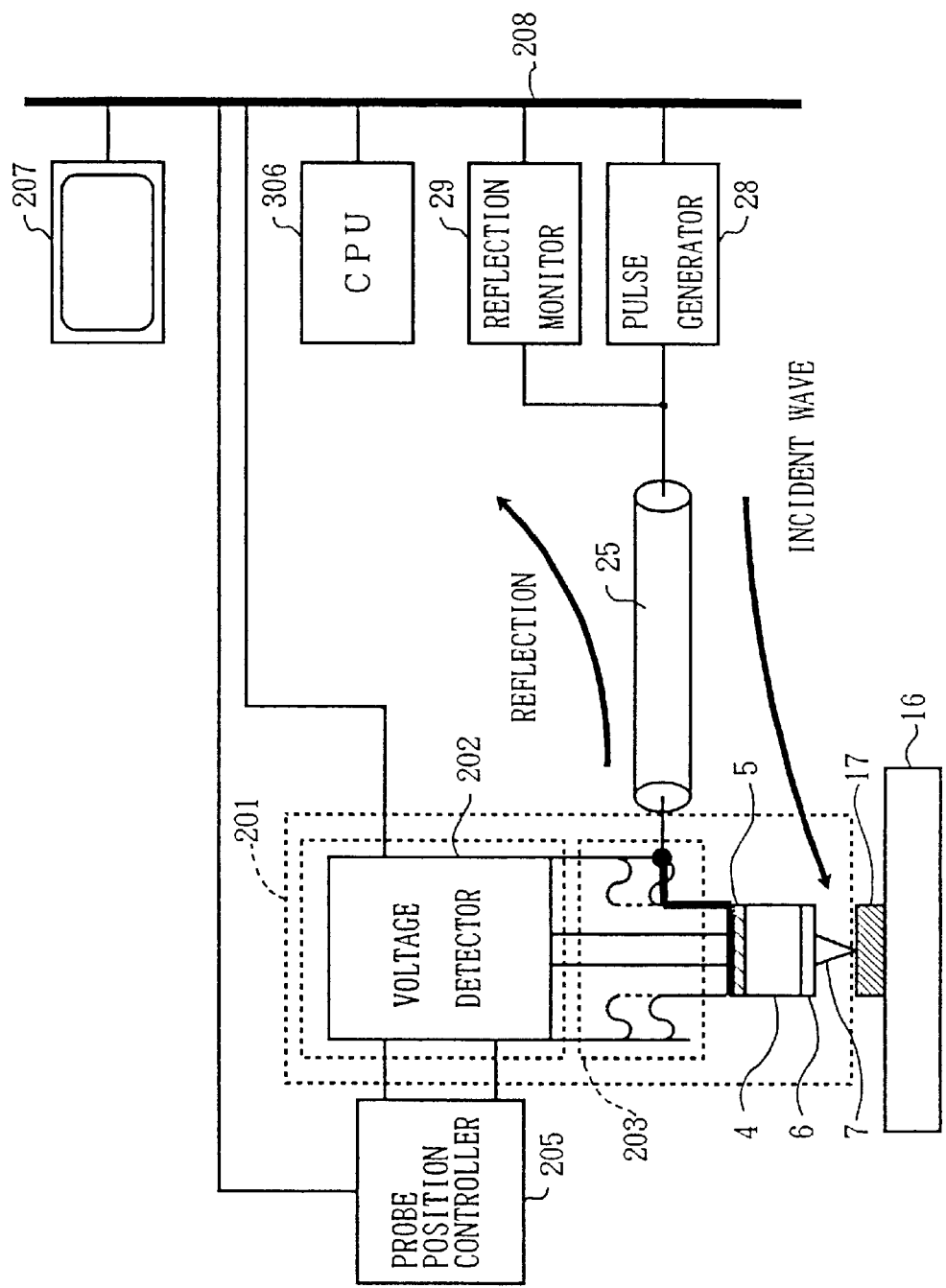
FIG. 45 is a diagram showing an embodiment of a control system which detects the electrical contact between the probe and the object and is associated with the fifth embodiment of the voltage waveform measuring apparatus shown in FIG. 15.

FIG. 45 is a diagram showing an embodiment of a control system which detects the electrical contact between the probe and the object and is associated with the fifth embodiment of the voltage waveform measuring apparatus shown in FIG. 15. In FIG. 45, those parts which are the same as those corresponding parts in FIGS. 15 and 43 are designated by the same reference numerals, and a description thereof will be omitted.

In FIG. 45, the pulse generator 28 and the reflection monitor (voltage measuring unit) 29 are connected to the transparent electrode 5 via the relay 25. The illustration of the directional coupler 27 is omitted in FIG. 45. A CPU 306, the pulse generator 28 and the reflection monitor 29 are connected to the bus 208. The pulse generator 28 applies pulses to the transparent electrode 5 via the relay 25, and the reflection monitor 29 monitors and measures the reflected waveform, that is, the waveform reflected within the electrooptic crystal 4, received via the relay 25.

The CPU 306 generally controls the entire control system, and carries out the process shown in FIG. 16 when detecting the electrical contact between the probe 7 and the wiring layer 17. In other words, the CPU 306 controls the probe position controller 205 to lower the probe 7. In addition, the CPU 306 analyzes the reflected waveform monitored by the reflection monitor 29, and judges that the electrical contact between the probe 7 and the wiring layer 17 is achieved when a predetermined change is detected in the reflected waveform. The CPU 306 controls the probe position controller 205 to stop lowering the probe 7 when the electrical contact is detected.

Figure 46:
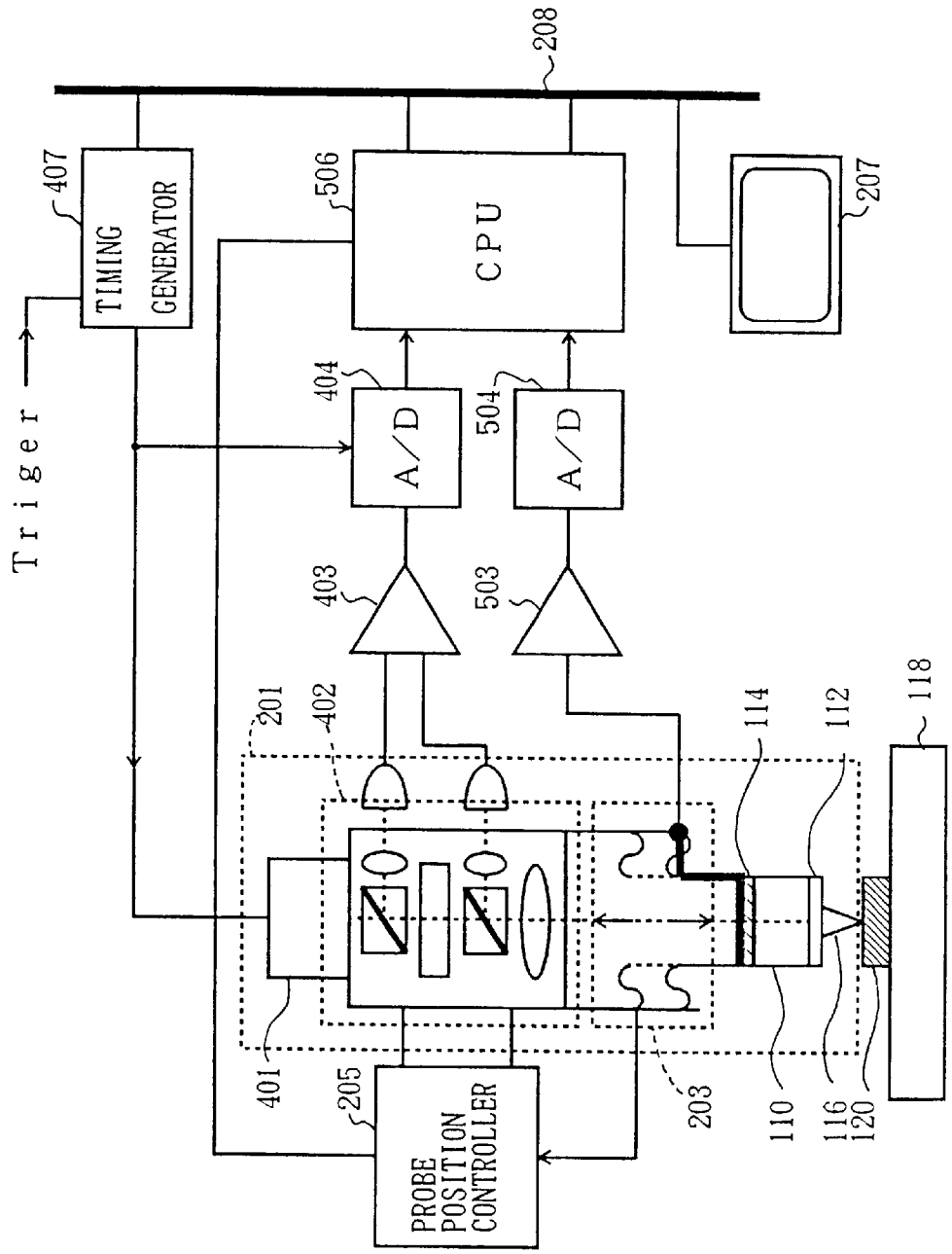
FIG. 46 is a diagram showing an embodiment of a control system which measures the D.C. level up to A a high-frequency component of the voltage waveform applied to the object and is associated with the sixth embodiment of the voltage waveform measuring apparatus shown in FIG. 23.

FIG. 46 is a diagram showing an embodiment of a control system which measures the D.C. level up to a high-frequency component of the voltage waveform applied to the object and is associated with the sixth embodiment of the voltage waveform measuring apparatus shown in FIG. 23. In FIG. 46, those parts which are the same as those corresponding parts in FIGS. 23, 43 and 44 are designated by the-same reference numerals, and a description thereof will be omitted.

In FIG. 46, an amplifier 503 is connected to the second electrode 114 and corresponds to the amplifier 122 shown in FIG. 23. An output of this amplifier 503 is supplied to a CPU 506 via an A/D converter 504. The A/D converter 504 and the CPU 506 form the voltage waveform combining processor 126 shown in FIG. 23. Hence, the CPU 506 controls the probe position controller 205 to maintain the electrical contact between the probe 116 and the internal wiring 120 during the voltage waveform measurement, and also combines the high-frequency component obtained via the A/D converter 404 and the low-frequency component obtained via the A/D converter 504.

Of course, the CPU 506 may carry out the reference voltage determination process shown in FIG. 39 and the base line sampling shown in FIG. 41.

Next, a description will be given of measured results actually obtained by the eighth embodiment of the voltage waveform measuring apparatus described above in conjunction with FIG. 26, so as to facilitate understanding of the effects of the present invention.

Figure 47:
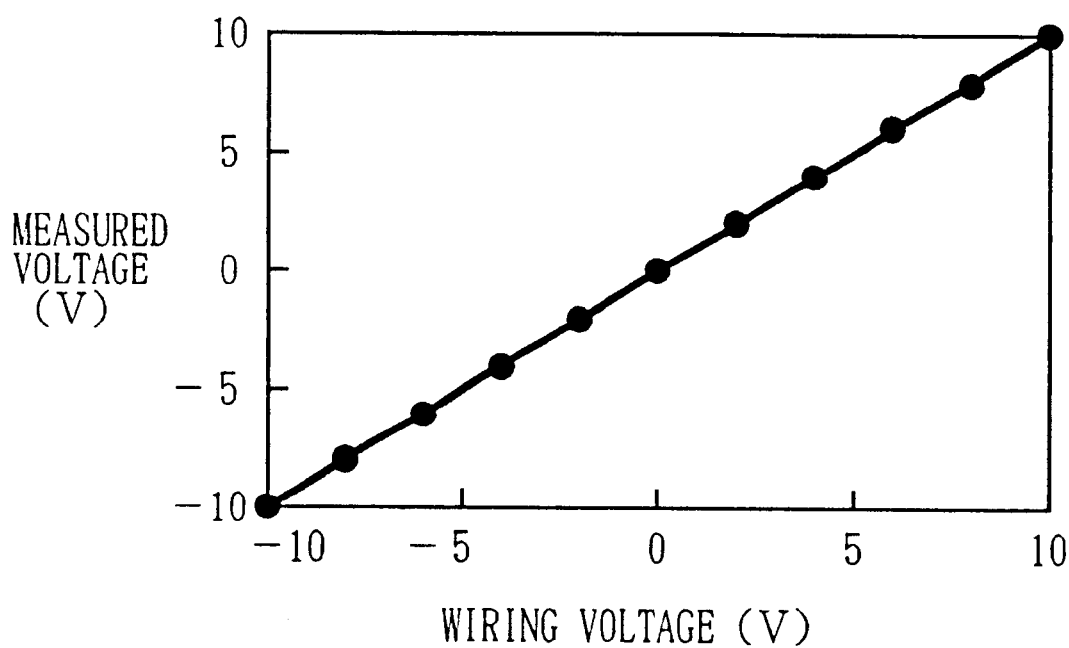
FIG. 47 is a diagram showing a low-frequency component measured by the eighth embodiment of the voltage waveform measuring apparatus shown in FIG. 26.

FIG. 47 is a diagram showing a low-frequency component measured by the eighth embodiment of the voltage waveform measuring apparatus shown in FIG. 26. In FIG. 47, the ordinate indicates the measured D.C. voltage measured by the amplifier 122, and the abscissa indicates the known D.C. voltage applied to the wiring 120. In this case, the measurements were made with respect to a case where the resistance across the two confronting faces of the electrooptic element 110, that is, between the first and second electrodes 112 and 142, is approximately 1 GΩ and extremely high, but it was possible to make the measurement in a range of ±10 V with a measurement error of less than ±15 mV.

Figure 48:
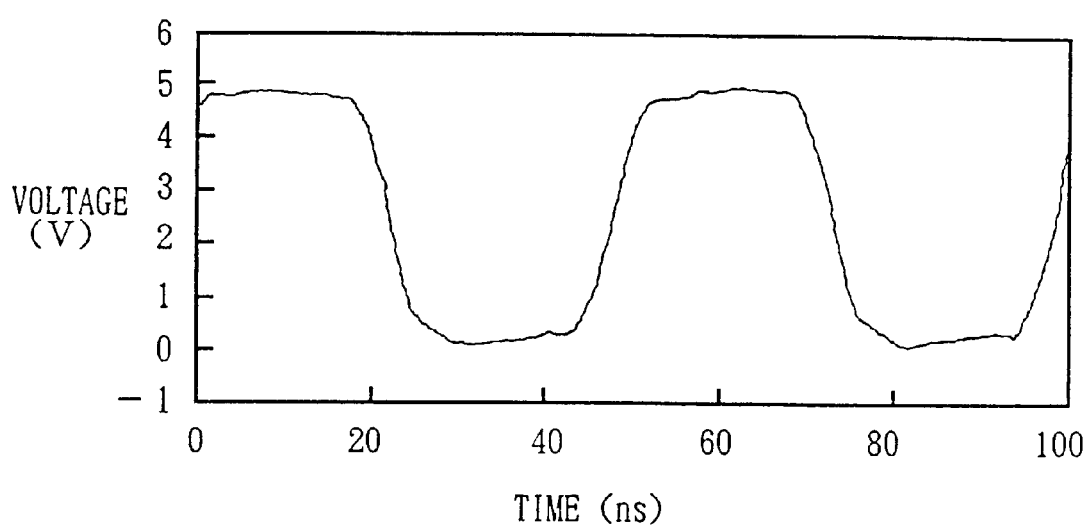
FIG. 48 is a diagram showing a combined result of the low and high-frequency components measured by the eighth embodiment of the volttage waveform measuring apparatus shown in FIG. 26.

FIG. 48 is a diagram showing a combined result of the low-frequency component and a high-frequency component measured by the eighth embodiment of the voltage waveform measuring apparatus shown in FIG. 26. In FIG. 48, the ordinate indicates the measured voltage, and the abscissa indicates the time. In this case, the measurements were made with respect to a case where a rectangular wave having a low level of 0 V, a high level of 5 V and a period of 50 nsec is applied to the wiring 120, and the waveform shown in FIG. 48 was obtained by combining in the voltage waveform combining processor 126 the high-frequency component measured by the light source and analyzer 124 and the low-frequency component measured by the amplifier 122. As may be seen from FIG. 48, the voltage waveform measurement is accurately made from the D.C. component, that is, the low-frequency component, up to the high-frequency component.

Of course, it is also possible to appropriately combine the embodiments described above to suit the application and to obtain the desired effects.

Further, the present invention is not limited to these embodiments, but various variations and modifications may be made without departing from the scope of the present invention.

What is claimed is:

1. An electrooptic voltage waveform measuring method for measuring a voltage applied to an object by employing a light sampling technique using the Pockels effect of an electrooptic crystal, said electrooptic crystal having a first face mounted with a probe and a second face, opposite to the first face, mounted with a reference electrode, said electrooptic voltage waveform measuring method comprising the steps of:

applying an A.C. voltage on the reference electrode, as a contact monitor signal;

in a state where the A.C. voltage is applied to the reference electrode, moving the probe towards the object, while a voltage measurement employing the light sampling technique is made to measure a voltage amplitude of the A.C. voltage, in synchronism with a timing of the A.C. voltage; and monitoring a change in a waveform amplitude detected by the probe, and determining a point where an amplitude change of the monitored waveform amplitude stabilizes, as an electrical contact point where the probe contacts the object.

2. The electrooptic voltage waveform measuring method as claimed in claim 1, further comprising the step of:

pushing the probe against the object by a predetermined amount after determination of the electrical contact point, so as to stabilize the electrical contact.

3. The electrooptic waveform measuring method as claimed in claim 1, further comprising the step of:

detecting a match between a frequency of the voltage applied to the object and a frequency of the A.C. voltage applied to the reference electrode from a noise level of the measured voltage which does not decrease due to an averaging process, and varying the frequency of the A.C. voltage applied to the reference electrode.

4. The electrooptic voltage waveform measuring method as claimed in claim 1, further comprising the step of:

measuring the A.C. voltage waveform applied to the reference electrode at a predetermined period when measuring the voltage waveform of the object, and interrupting the measurement of the voltage waveform of the object if an amplitude value of the measured A.C. voltage waveform when confirming the electrical contact point is smaller than a predetermined error range.

5. The electrooptic voltage waveform measuring method as claimed in claim 4, further comprising the step of:

applying again an A.C. voltage to the reference electrode to confirm the electrical contact point after the measurement of the voltage waveform of the object is interrupted.

6. The electrooptic voltage waveform measuring method as claimed in claim 4, further comprising the step of:

increasing a load applied on the probe after interrupting the measurement of the voltage waveform of the object.

7. The electrooptic voltage waveform measuring method as claimed in claim 1, further comprising the steps of:

carrying out a light sampling in synchronism with the voltage waveform applied to the object, immediately after confirming the electrical contact point, so as to store an amplitude value of the detected voltage waveform; and interrupting the measurement of the voltage waveform of the object if the amplitude value of the measured voltage waveform is smaller than the stored amplitude value by more than a predetermined error range.

* * * * *